(12) United States Patent
Hayano et al.

(10) Patent No.: US 6,750,496 B2
(45) Date of Patent: Jun. 15, 2004

(54) MANUFACTURING METHOD OF SEMICONDUCTOR INTEGRATED CIRCUIT DEVICE, AND SEMICONDUCTOR INTEGRATED CIRCUIT DEVICE

(75) Inventors: Katsuya Hayano, Akishima (JP); Akira Imai, Hachioji (JP); Norio Hasegawa, Nishitama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/142,063

(22) Filed: May 10, 2002

(65) Prior Publication Data

US 2002/0155656 A1 Oct. 24, 2002

Related U.S. Application Data

(62) Division of application No. 09/904,591, filed on Jul. 16, 2001, now Pat. No. 6,403,413.

(30) Foreign Application Priority Data

Jul. 14, 2000 (JP) ........................................ 2000-215092

(51) Int. Cl.[7] ............................................. H01L 27/108
(52) U.S. Cl. ........................ 257/296; 257/365; 257/401; 257/508; 257/758

(58) Field of Search ................................. 257/296, 365, 257/372, 390, 401, 508, 758, 382, 385, 755, 756, 759, 760, 774, 775, 776

(56) References Cited

U.S. PATENT DOCUMENTS

| 6,027,969 A | | 2/2000 | Huang et al. ................ 257/303 |
| 6,028,360 A | * | 2/2000 | Nakamura et al. .......... 257/758 |
| 6,184,081 B1 | | 2/2001 | Jeng et al. ................... 438/239 |
| 6,243,311 B1 | * | 6/2001 | Keeth .......................... 365/206 |

FOREIGN PATENT DOCUMENTS

| JP | 5-19446 | 1/1993 |
| JP | 10-284700 | 10/1998 |

* cited by examiner

Primary Examiner—Long Pham
Assistant Examiner—Ginette Peralta
(74) Attorney, Agent, or Firm—Antonelli, Terry, Stout & Kraus, LLP

(57) ABSTRACT

When a through hole 17 is transferred on a pair of contact holes 10 putting a data line DL therebetween, even if a pair of through holes 17 putting the data line DL therebetween are deviated, the pair of through holes are connected to the contact hole 10b and not connected to the data line DL. By this manner, a mask pattern formed by a photomask is use so as to be deviated and disposed in a direction separately from the data line DL at a design stage. This results in improvement of an alignment tolerance of the pattern.

2 Claims, 68 Drawing Sheets

(a)

MANUFACTURING METHOD OF SEMICONDUCTOR INTEGRATED CIRCUIT DEVICE, AND SEMICONDUCTOR INTEGRATED CIRCUIT DEVICE

This is a divisional of parent application Ser. No. 09/904,591, filed Jul. 16, 2001 now U.S. Pat. No. 6,403,413, the entire disclosure of which is hereby incorporated by reference.

TECHNICAL FIELD OF THE INVENTION

The present invention relates to a manufacturing method of a semiconductor integrated circuit device and a technique of the semiconductor integrated circuit device, and more particularly, to a technique effectively applied to an exposure technique in a manufacturing process of a semiconductor integrated circuit device.

BACKGROUND OF THE INVENTION

As a pattern of a wiring or element constituting a semiconductor integrated circuit device becomes finer and higher integrated, high precision for superposition between patterns is required for exposure treatment for transferring the pattern on a semiconductor substrate. This superposing precision largely depends on a superposition precision (performance) of pattern that an exposure apparatus deals with. Therefore, it is common to lay out the pattern in a state in which an alignment tolerance determined by the superposition performance of the exposure apparatus is secured.

Further, as another technique for securing the alignment tolerance of the above-mentioned pattern, Japanese Patent Laid-open No. 10-284700 discloses a technique for deforming a shape of a pattern such that a dimension thereof in a side which requires higher superposing precision becomes smaller. Further, for example, Japanese Patent Laid-open No. 5-19446 discloses a technique of a phase shift mask, in which, in order to expose various and fine patterns, a predetermined correcting pattern is provided on either an end of a mask pattern region having a constant mode or a boundary portion of a mask pattern region having a plurality of modes.

SUMMARY OF THE INVENTION

However, the present inventors have found that the superposing technique of the above-mentioned pattern has the following problems.

That is, in the technique for deforming the shape of the above-mentioned pattern and reducing the dimension thereof, it is possible to form a pattern in such a state that an alignment tolerance is secured in the case where there is a margin of resolution, but as the pattern dimension approaches resolution limit value of the exposure apparatus, the formation control performance of this pattern and the margin for forming the pattern are remarkably reduced. Therefore, even if the alignment tolerance of the pattern can be secured, the pattern itself can not be formed satisfactorily in some cases.

An object of the present invention is to provide a technique capable of enhancing the alignment tolerance of a pattern.

The above and other object and new features of the present invention will be apparent from the description of the specification and the accompanying drawings.

Of the inventions disclosed in the present application, outlines of typical inventions are briefly described as follows:

That is, the present invention uses a mask pattern formed on a photomask which is designed to be disposed such that the mask pattern is separated from a wiring so that the mask pattern is connected to the first hole patterns and is not connected to the wiring even if the second hole patterns sandwiching the wiring is deviated in position when second hole patterns are transferred on first hole patterns sandwiching a wiring.

Further, according to the present invention, the light transfer pattern forming said mask pattern is disposed on an straight line extending in a direction intersecting with said wiring and is not disposed on a straight line extending along said wiring and is deviated alternatively.

Further, according to the present invention, an adjacent distance between the light transfer patterns disposed along said wiring is shorter than an adjacent distance between the light transfer patterns disposed along a direction intersecting with said wiring.

Further, according to the present invention, a phase shifter is disposed in one of the light transfer patterns adjacent to each other.

The present invention comprises the steps of: forming a plurality of first regions on a semiconductor substrate; depositing a first insulative film on said semiconductor substrate; forming, on said first insulative film, a first hole pattern electrically connected to each of said plurality of first regions; forming, on said first insulative film, a wiring which intersects relative to said plurality, of first regions so as to pass through an adjacent gap between said first hole patterns; depositing a second insulative film for covering said wiring; depositing a positive type photoresist film on said second insulative film; performing exposure treatment of said positive type photoresist film by using a photomask and thereby forming a photoresist pattern for forming a second hole pattern on said second insulative film; and performing etching treatment by using said photoresist pattern as an etching mask and thereby forming, on said second insulative film, said second hole pattern that is connected to said first hole pattern but is not connected to said wiring, wherein said hole pattern is disposed such that even if a position thereof is deviated, a connection between said first and second hole patterns is kept and an insulative state between said second hole pattern and said wiring is kept, and a pair of second patterns disposed to put said wiring therebetween and be close to the wiring are disposed separately from said wiring put between the pair of second hole patterns; wherein said photomask includes a plurality of light transfer patterns for transferring said second hole pattern; wherein said plurality of light transfer patterns disposed along a first direction in which said wiring extends are not disposed on a straight line but are disposed so as to be deviated alternately in a second direction intersecting with said first direction, and said plurality of light transfer patterns disposed along said second direction are disposed on a straight line; wherein an adjacent pitch between the light transfer patterns disposed along said first direction is shorter than an adjacent pitch between the light transfer patterns disposed along said second direction; and wherein a phase shifter is disposed on any one of the light transfer patterns adjacent to each other among said plurality of light transfer patterns.

Further, the present invention comprises the steps of: forming a plurality of first regions on a semiconductor substrate; depositing a first insulative film on said semiconductor substrate; forming, on said first insulative film, a first hole pattern electrically connected to each of said first regions; forming, on said first insulative film, a wiring which intersects relative to said first regions so as to pass through an adjacent gap between said first hole patterns; depositing a second insulative film for covering said wiring; depositing a positive type photoresist film on said second insulative film; performing exposure treatment of said positive type photoresist film by using a photomask and thereby forming, on said second insulative film, a photoresist pattern for forming a second hole pattern; and performing etching treatment by using said photoresist pattern as an etching mask and thereby forming, on said second insulative film, said second hole pattern that is connected to said first hole pattern but is not connected to said wiring, wherein a pair of second hole patterns disposed to put said wiring therebetween and be close to the wiring are disposed such that a center of at least one of said pair of second hole-patterns is deviated from a center of said first hole pattern, and are disposed separately from said wiring put between the pair of second hole patterns; wherein said photomask includes a plurality of light transfer patterns for transferring said second hole pattern; wherein said plurality of light transfer patterns disposed along a first direction in which said wiring extends are not disposed on a straight line but are disposed so as to be deviated alternately in a second direction intersecting said first direction, and said plurality of light transfer patterns disposed along said second direction are disposed on a straight line; wherein an adjacent pitch between the light transfer patterns disposed along said first direction is shorter than an adjacent pitch between the light transfer patterns disposed along said second direction; and wherein a phase shifter is disposed on any one of the light transfer patterns adjacent to each other among the plurality of light transfer patterns.

Further, the present invention comprises the steps of: forming a plurality of first regions on a semiconductor substrate; depositing a first insulative film on said semiconductor substrate; forming, on said first insulative film, a first hole pattern electrically connected to each of said plurality of first regions; forming, on said first insulative film, a wiring which intersects relative to said plurality of first regions so as to pass through an adjacent gap between said first hole patterns; depositing a second insulative film for covering said wiring; depositing a positive type photoresist film on said second insulative film; performing exposure treatment of said positive type photoresist film by using a photomask and thereby forming a photoresist pattern for forming a second hole pattern on said second insulative film; and performing etching treatment by using said photoresist pattern as an etching mask and thereby forming, on said second insulative film, said second hole pattern that is connected to said first hole pattern but is not connected to said wiring, wherein said hole pattern is disposed such that even if a position thereof is deviated, a connection between said first and second hole patterns is kept and an insulative state between said second hole pattern and said wiring is kept, and a pair of second patterns disposed to put said wiring therebetween and be close to the wiring are disposed separately from said wiring put between the pair of second hole patterns; wherein said photomask includes a plurality of light transfer patterns for transferring said second hole pattern; and wherein said plurality of light transfer patterns disposed along a first direction in which said wiring extends are not disposed on a straight line but are disposed so as to be deviated alternately in a second direction intersecting with said first direction, and said plurality of light transfer patterns disposed along said second direction are disposed on a straight line.

BRIEF DESCRIPTION OF THE DRAWING

FIG. 40A is a plane view of an essential portion of a photoresist pattern for forming active regions shown in FIG. 1 and the like.

FIG. 52A is a plane view of an essential portion of the photoresist pattern for forming contact holes shown in FIG. 11 and the like.

FIG. 53A is a plane view of an essential portion of a photoresist pattern having a first mask pattern for forming the contact holes shown in FIG. 11 and the like.

FIG. 57A is a plan view of an essential portion of a photomask used for forming word lines (gate electrodes) shown in FIG. 5 and the like.

FIG. 58A is plan view of an essential portion of a mask 26 used for forming through holes for data lines shown in FIG. 17 and the like.

FIG. 59A is plan view of an essential portion of a mask 26 used for forming data lines DL shown in FIG. 21 and the like.

FIG. 60A is plan view of an essential portion of a mask used for forming through holes for information storage capacity elements shown in FIG. 25 and the like.

FIG. 72 is a plan view of an essential portion of a semiconductor integrated circuit device showing a case in which hole patterns are deviated and transferred in the semiconductor integrated circuit device having a structure shown in FIG. 25 and the like.

FIG. 76A is a plan view of an essential portion of the mask used for forming the holes shown in FIG. 34 and the like.

DESCRIPTION OF THE PREFERRED EMBODIMENTS

Figure 1:
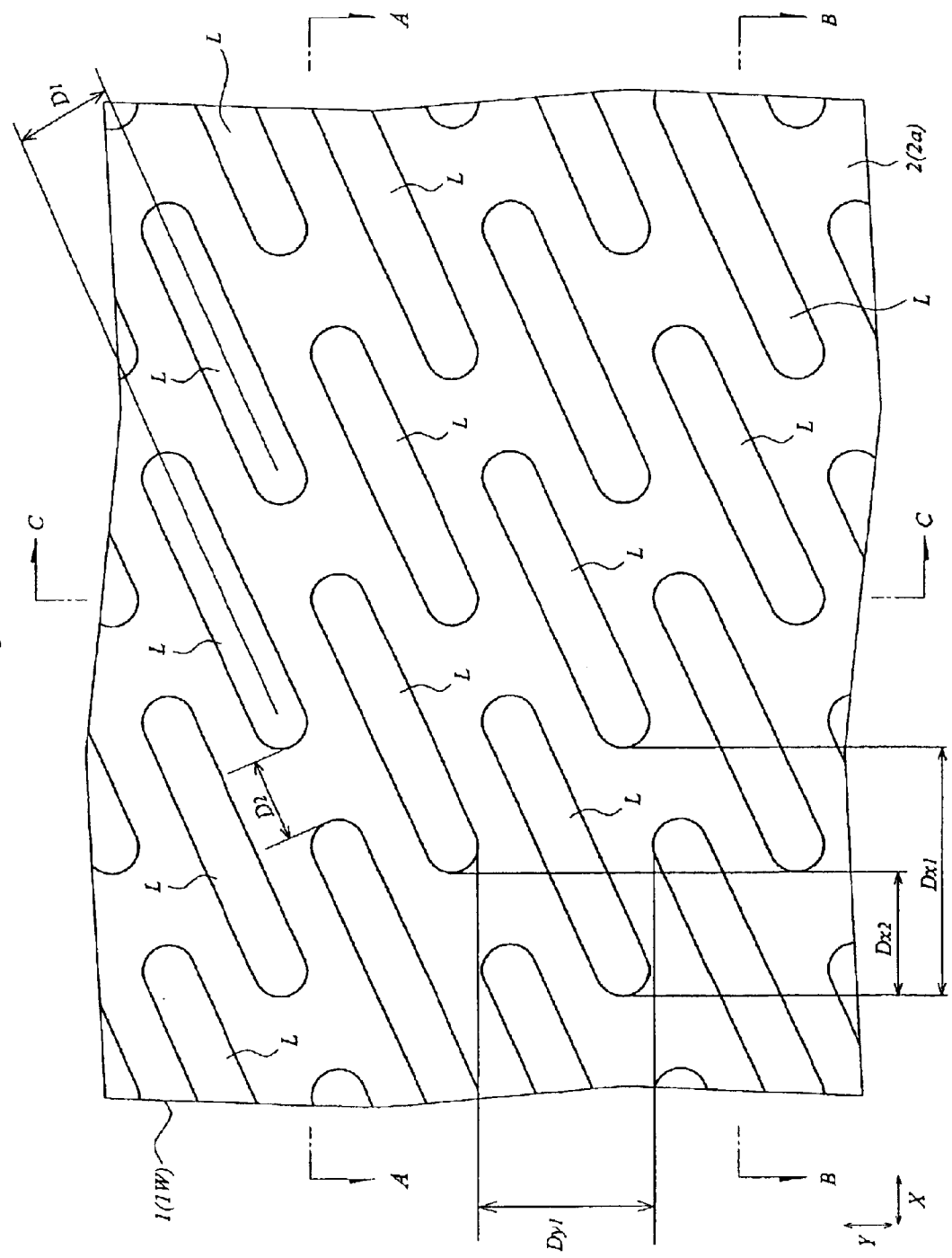
FIG. 1 is a plan view of an essential portion in a manufacturing process of a semiconductor integrated circuit device that is one embodiment of the present invention.

1. Ultraviolet light: In a semiconductor field, ultraviolet light means electromagnetic wave having wavelength of about 400 nm to short wavelength of about 50 nm. A region having long wavelength longer than 300 nm is called near-ultraviolet region, and a region having a short wavelength of 300 nm or less is called far-ultraviolet region, and a region having wavelength of 200 nm or less is particularly called vacuum-ultraviolet region. Examples of light source are i line (wavelength: 365 nm) such as mercury arc lamp or the like, KrF excimer laser (wavelength: 248 nm), ArF (wavelength: 193 nm) excimer laser, and $F_2$ (wavelength: 157 nm) excimer laser.

2. Scanning exposure: Scanning exposure is an exposure method of transferring a circuit pattern on a photomask, to a desired portion on a semiconductor wafer, by moving (scanning) relatively and continuously a thin slit-like exposure band in a vertical direction relative to a longitudinal direction of slits (or may move diagonally), against a semiconductor wafer and a photomask (or reticle, and description of the photomask used in the present application means a broad notion including the reticle.).

3. Step and scan exposure: This is a method of exposing the entire portion to be exposed on a wafer, by combining the scanning exposure as mentioned above and stepping exposure, and corresponds to an inferior notion of the scanning exposure.

4. Photomask (optical mask): This is a mask having light shielding patterns or light phase changing patterns formed on a substrate. The term "on substrate" includes an upper surface of the substrate and an inner or above region close to the upper surface of the substrate (or may be disposed on another substrate close to the upper surface). The term "normal photomask" (binary mask) means a general photomask having a mask pattern formed by light shielding patterns and light transfer pattern s on the substrate. The photomask is simply called a mask hereinafter.

5. Substrate trench shifter: This is a phase shifter forming recesses in a surface of a transparent mask substrate itself such as quartz. The term "surface of the substrate itself" includes something forming a film similar to material of a substrate, on a surface of the substrate.

6. On-substrate thin film trench shifter: This is a thin shifter forming a shifter film having a thickness suitable for the purpose of functioning as a shifter, under a light shielding film of the substrate, and then being formed by utilizing or the like difference in etching speed of a backing substrate or the like.

7. Trench shifter: This is a superior notion containing the above-mentioned substrate trench shifter and on-substrate thin film trench shifter and the like, and is a general shifter forming recesses in a transparent film, a transparent substrate or the like that is at a layer lower than a light shield film. On the other hand, a system of arrangement of a shifter film on a light shielding film is called on-arrangement system of a shifter film or on-arrangement shifter.

8. A fine visor type trench shifter: This corresponds to a case of 40% or less (P/λ=40% is called "visor length") of a length P of a overhang-shaped (or visor-shaped) projecting portion that a light shielding film has from an upper end of a side wall of a recess which a quartz substrate or the like has, to an inner side of the recess around the trench shifter (in a cross-sectional direction of a narrow wideness) if a wavelength λ of a monochromatic exposure light is set to a reference.

9. Shifter depth: Depth of digging in a substrate of a shifter portion depends on exposure wavelength. A depth Z for inverting a phase by 180 degrees thereof is expressed as $Z=\lambda/(2(n-1))$, where n represents index of refraction of a substrate, relative to exposure light having a predetermined exposure wavelength, and λ represents the exposure wavelength.

10. Phase shifter (phase shift mask pattern): This is a circuit pattern on a mask, which includes a mask aperture pattern having at least one phase shifter. The phase shifter is, for example, a group of circuit patterns provided on the mask, which correspond to a single shot region (an area to be exposed by one step) of a stepping exposure or a region exposed by a single scanning of the scanning exposure, and means, for example, an unit chip provided on the semiconductor wafer or a mask pattern (a circuit pattern) corresponding to integer times thereof on the mask substrate.

11. Auxiliary light transfer pattern (auxiliary mask pattern): This means, when generally projected onto a semiconductor wafer, an aperture pattern provided on a mask which does not form an independent image corresponding to the aperture pattern thereof.

12. Levenson type phase shift mask: This is also called a space frequency modulating type phase shift mask. This is a phase shift mask, which is generally isolated in a light shield region by a light shield film and is provided with a plurality of apertures close to each other and comprises an aperture group whose phases are alternately reversed. If roughly classified, this mask can be classified into a line-and-space pattern, and an alternately reversed hole pattern (also called a Levenson pattern for contact hole).

13. Halftone type phase shift mask: This is a kind of phase shift mask having a halftone film which is used as both a shifter and which has a transmittance between 1% and 40%, and a halftone shifter whose phase shift amounts invert a phase of light in comparison with portions having no halftone film.

14. Auxiliary pattern arrangement type phase shift mask: If roughly classified, this can be classified into an independent line pattern and an aperture pattern. Typical examples of the former are a real aperture pattern and auxiliary shift patterns (this phase-reversed pattern is also an equivalence) provided on both sides thereof. A typical example of the latter is an outrigger type hole pattern (comprising a real aperture provided at center thereof and a plurality of auxiliary apertures provided around the real aperture). However, since an end or a periphery of the mask pattern of the Levenson type phase shift mask is provided with the auxiliary apertures and the auxiliary shifter, both patterns are mixed to be actually a mixed pattern in many cases.

15. Phase shift mask: A phase shift mask simply described in the present application means these masks.

16. Semiconductor wafer (described simply as wafer hereinafter) or a semiconductor substrate includes a silicon single crystal-substrate, a sapphire substrate, a glass substrate, other insulation or non-insulation or semiconductor substrate and the like, and a compound substrate thereof. Also, the term "semiconductor integrated circuit device" described in the present application includes a semiconductor such as silicon wafer or the sapphire substrate or the like, or something formed on an insulative substrate, or, in particular, something formed on other insulative substrate formed of glass or the like such TFT (Thin-Film-Transistor) and an STN (Super-Twisted-Nematic) liquid crystal except for a case of being specified otherwise.

17. The term "light shielding region, light shielding pattern, light shielding film or light shield" means to have optical characteristics of permeation less than 40% of exposure light radiated on regions thereof. Generally, one having the optical characteristics of permeation less than 30% of exposure light from some % is used. On the other hand, the term "light permeating region", "light transfer pattern", "transparent region", "transparent film" or "transparent" means to have optical characteristics of permeation more than 60% of exposure light radiating on regions thereof. Generally, one having the optical characteristics of permeation more than 90% of exposure light.

18. A photoresist pattern is a film pattern obtained by subjecting a light-sensitive organic film to patterning by a technique of photolithography. This pattern includes a simple resist film having no aperture on the corresponding portion.

19. Normal illumination means non-modified illumination, and illumination having relatively uniform light intensity distribution.

20. Modified illumination means illumination that reduces intensity thereof at center thereof, and includes oblique illumination, band illumination, multiple illumination such as quadplex illumination or quintuple illumination or the like, and super resolution technique using pupil filter that is equivalence thereto.

21. Resolution: A pattern size can be expressed by standardizing numerical aperture NA of a projection lens and exposure wavelength λ. The present embodiments mainly use KrF excimer laser of exposure wavelength of 248 nm, and the projection lens NA of 0.68. Therefore, in the case of use of different wavelength and different lens NA, the resolution R is expressed as $R=K1\lambda/NA$ (K1 is a certain constant determined as depending upon process), so that the resolution may be converted and used. However, a focus depth D is also expressed as $D=K2\cdot\lambda/(NA)^2$ (K2 is a certain constant determined as depending upon process), so that the depth is also different therefrom.

Embodiments will be described by dividing a plurality of sections or sub groups if necessary for the sake of expediency, but, except for a case of being particularly specified, relationship between the plurality of sections or sub groups has nothing to do with one another but one of them has something to do with modified, detailed or supplemented explanations, or the like of a part-or-all parts of the other.

22. Transfer pattern: this is a pattern transferred onto a wafer by a mask, and more specifically means the above-mentioned photoresist pattern and a pattern provided on a wafer really forming a photoresist pattern as a mask.

23. Hole pattern: this means a fine pattern such as a contact hole and a through hole having two dimensional size equal to or smaller than exposure wavelength on a wafer. In generally, shape thereof is square, or rectangle close to the square, or octagon on a mask, or the like, but is circular on the wafer in many cases.

24. Line pattern: this means a band-like pattern extending in a predetermined direction.

And, in the case where the number (including numbers, numerical values, amounts, ranges or the like) of elements is referred to in the following embodiments, except for cases of being specified particularly and of restricting in principle and evidently the specified number and the like, the embodiments are not limited to the specified number, and may have more or less than the specified number.

Moreover, needless to say, constituent elements (also including elemental steps or the like) in the following embodiments are not necessary essential, except for cases of be specified particularly, and thought as essential in principle and evidently, and the like.

Similarly, in the following embodiment, when shapes, positional relations and the like of the constituent elements are referred to, other shapes and the like close or similar to the above-mentioned shapes and the like are substantially included therein too, except for cases of being specified particularly and of not being in principle and evidently thought so, and the like. These are similarly true of the above-mentioned numerical values and ranges.

And, in all of the drawings used for explaining the embodiments, members having the same functions are designated with the same symbols, and repetitive explanation thereof will be omitted.

And, in the drawings used for explaining the embodiments, even plan views schematically showing a mask or its data have light shielding patterns and phase shifters that are hatched, in order to see easily the drawing thereof.

Embodiment 1

In the embodiment 1, one example, in which the present invention is applied to a manufacturing process of large-scale semiconductor integrated circuit elements in 1 G (giga) bit DRAM (Dynamic Random Access Memory) class having minimum design size of about 130 nm, will be explained.

First, one example of a manufacturing method of the DRAM will be explained. Here, a structure thereof in the manufacturing process of the DRAM will be mainly explained, and an exposure technique (including a structure of the above-mentioned mask) for forming the structure will be explained hereinafter. The explanation will be made such that a right and left horizontal direction is defined as an X direction and an up and down direction is defined as a Y direction in plan views used here. An imaginary axis extending in the X direction is defined as an X axis, and an imaginary axis extending in the Y direction is defined as a Y axis. As a memory cell pattern, a pattern layout of one intersecting point memory cell type (or open bit line type) is illustrated.

Figure 2:
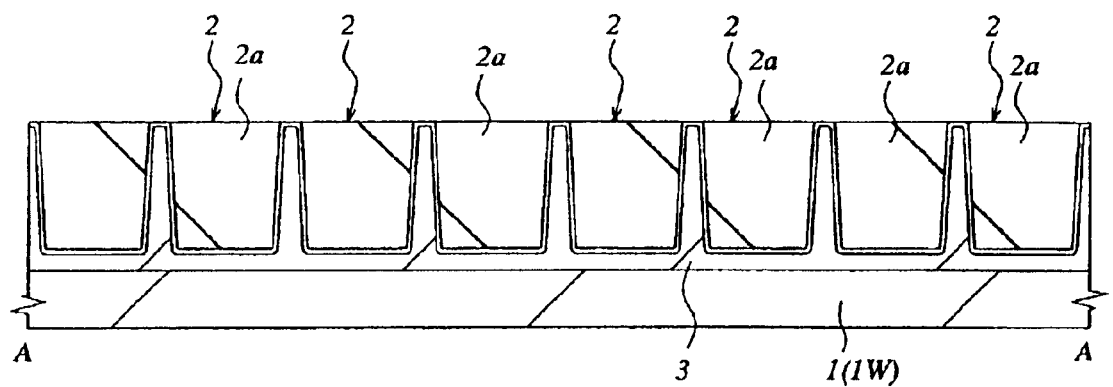
FIG. 2 is a cross-sectional view taken along line A—A of FIG. 1.
Figure 3:
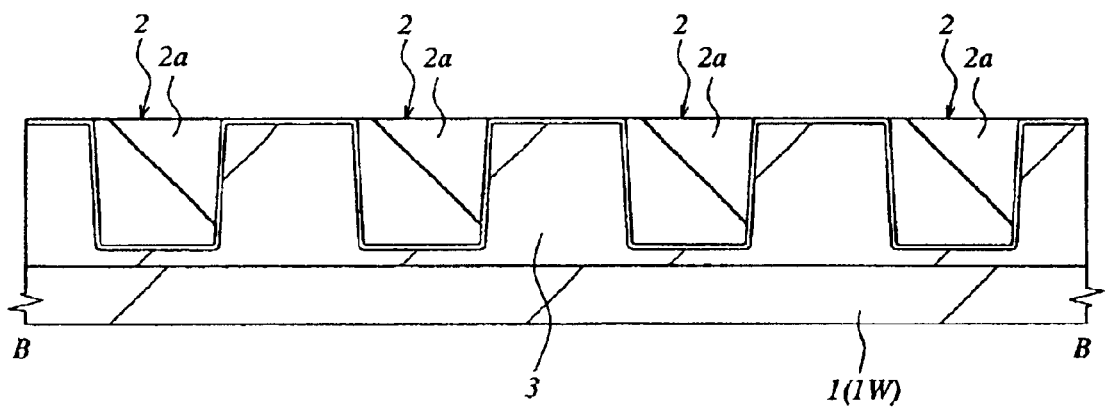
FIG. 3 is a cross-sectional view taken along line B—B of FIG. 1.
Figure 4:
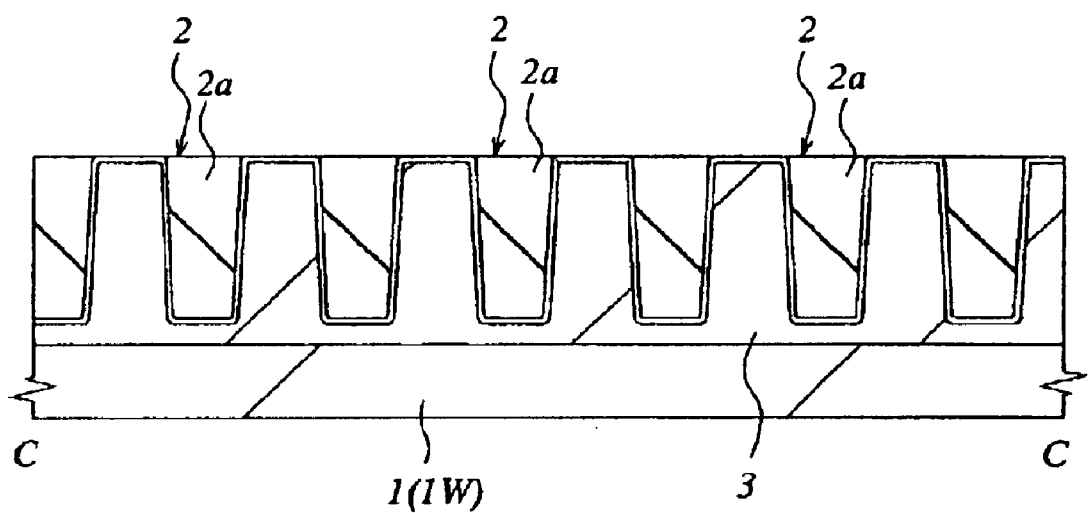
FIG. 4 is a cross-sectional view taken along line C—C of FIG. 1.

FIG. 1 is a plan view of an essential portion of a memory array in the manufacturing process of the DRAM. FIGS. 2 to 4 are cross-sectional views taken along lines A—A, B—B and C—C of FIG. 1, respectively. A semiconductor substrate (simply called substrate hereinafter) 1 constituting a wafer 1W comprises a p-type single crystal silicon. In a separating region of a main surface of the substrate 1, for example, a separating portion (a trench isolation) 2 of a groove type is formed. The separating portion 2 is formed by embedding an insulative film into a trench dug in the substrate 1. In the substrate 1, a plurality of active regions L are formed by the separating portion 2. As shown in FIG. 1, a periphery of each active region L is formed like a flat-surface-island-shaped pattern extending thin and long in a diagonal direction relative to left-right and upper-lower (horizontal and vertical: XY) directions of FIG. 1. In each active region L, for example, two memory sell selecting MIS●FETs are formed such that one of respective sources and drains thereof is used commonly with the other.

An arrangement pitch (a pitch: a distance between centers of objective patterns) Dy1 extending in the Y direction of each active region L is about 420 nm (converted to wafer size), for example. An arrangement pitch Dx1 between the active regions L extending in the X direction is about 520 nm (converted to wafer size), for example. A dimension Dx2 in which each active region L is shifted in the X direction per row of the Y direction is about 260 nm (converted to wafer size), for example. An arrangement pitch D1 between the active regions L extending in a short direction (a wide direction: a direction perpendicular to a longitudinal direction) is about 250 nm (converted to wafer size), for example. An arrangement interval (an interval: a distance between one end of objective pattern and the other end of pattern adjacent to the objective pattern) D2 of the active regions L extending in the longitudinal direction is about 160 to 180 nm (converted to wafer size), for example. A pitch between the adjacent patterns of the respective active regions L extending in the longitudinal direction has, for example, a value of about 252 nm (converted to wafer size). A dimension of each active region L extending in the longitudinal direction has, for example, a value of about 126 nm (converted to wafer size).

A forming method of the above-mentioned separating portion 2 of a trench type is as follows, for example. First, a photoresist pattern for forming the active region is formed on a main surface of the substrate 1. This photoresist pattern is formed such that forming regions of the active regions L are covered and other region except for the forming regions is exposed. This photoresist pattern will be explained in detail hereinafter. Next, by using the photoresist pattern as an etching mask to perform etching treatment of the substrate 1, a portion of the substrate 1 exposed from the photoresist pattern is removed by etching. This results in formation of trenches (transfer patterns), for example, having a depth of about 300 to 400 nm in the substrate 1. Then, on the substrate 1 including each inside of the trenches, for example, insulative films 2a formed of a silicon oxide film are deposited to a thickness of about 600 nm by using a CVD (Chemical Vapor Deposition) method. Each insulative film 2a is formed in such a manner that, for example, oxygen (or ozon) and tetraethoxysilane (TEOS) are deposited by a plasma CVD method using source gas, and then dry oxidization of about 1000° C. is performed to densify each film. Thereafter, each insulative film 2a is polished by a chemical mechanical polishing (CMP) method. At this time, a surface of each insulative film 2a deposited in each trench is flattened such that height thereof becomes substantially the same as that of each surface of the active regions L. The trench-shaped separating portion 2 is formed in this manner.

Then, boric acid (B) is ion-implanted into the substrate 1 to form a p-type well 3, and then a surface of the p-type well 3 is cleaned with cleaning liquid of hydrogen fluoride (HF) system. Thereafter, the substrate 1 is thermally oxidized to form a clean gate insulative film 4 of a silicon oxide system on each surface of the active regions L of the p-type well 3. A thickness of the gate insulative film 4 is, for example, about 6 nm according to conversion to silicon dioxide film thickness. The gate insulative film 4 may be a silicon-nitride-system insulative film or a metal-oxide-system insulative film (tantalum oxide film, titanium oxide film or the like) having higher permittivity than a silicon-oxide-system insulative film. These insulative films are formed by making a film grow on the substrate 1 by the CVD method or a sputtering method.

Figure 5:
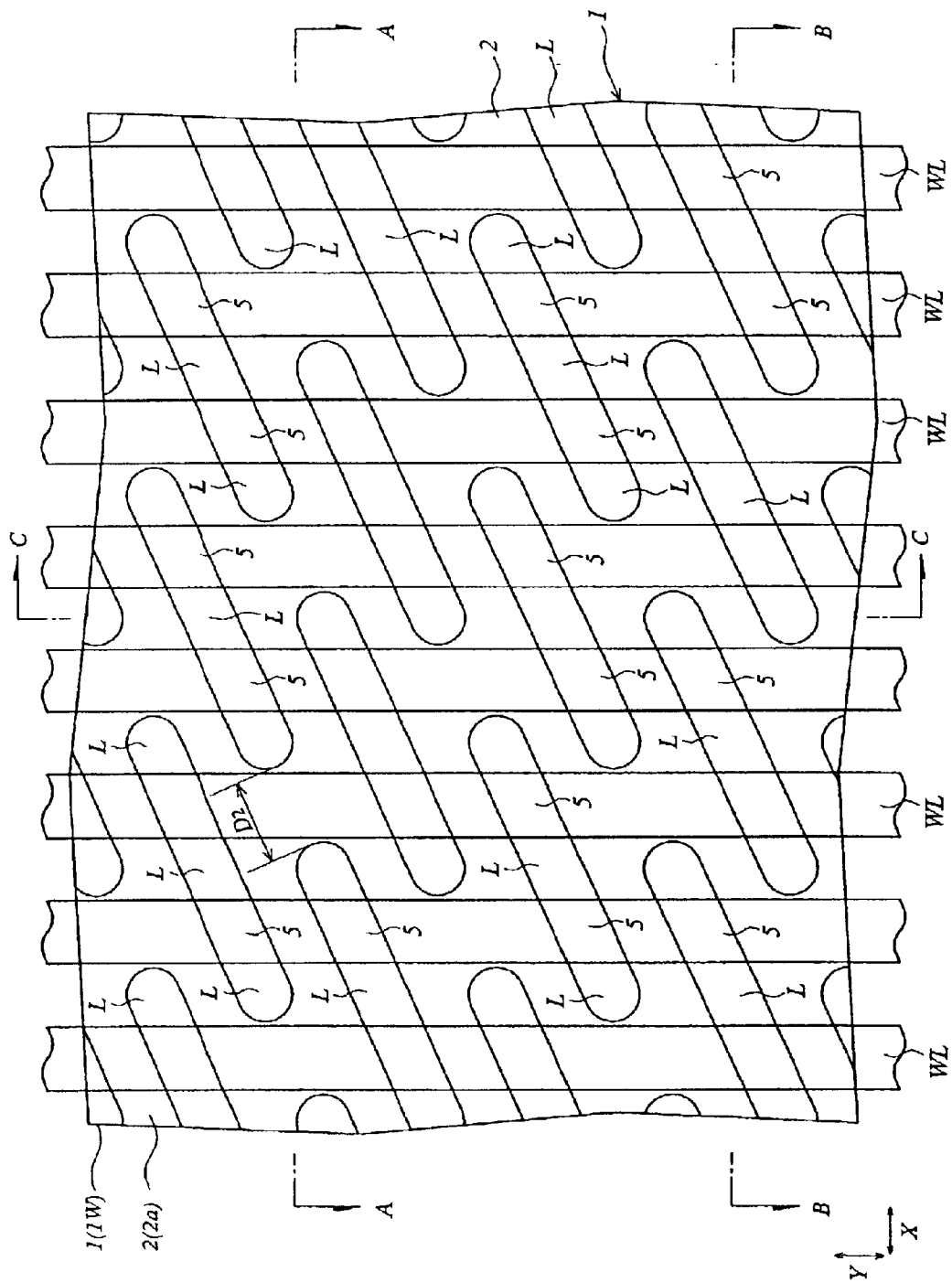
FIG. 5 is a plan view of an essential portion subsequent to the essential portion of FIG. 1 in the manufacturing process of the semiconductor integrated circuit device.
Figure 6:
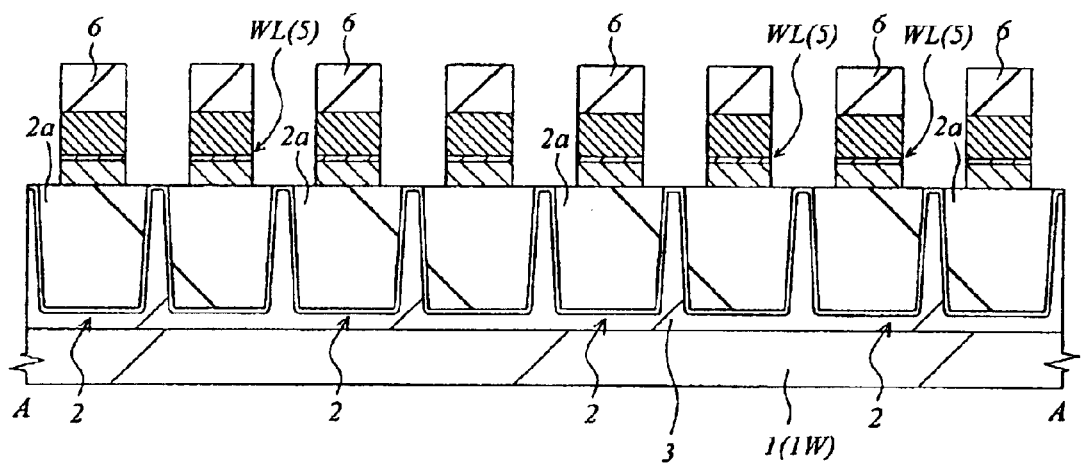
FIG. 6 is a cross-sectional view taken along line A—A of FIG. 5.
Figure 7:
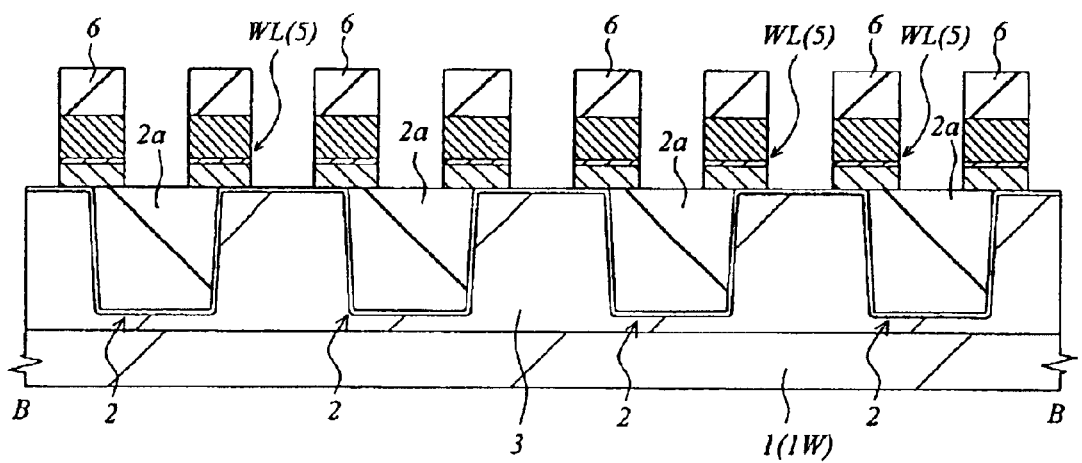
FIG. 7 is a cross-sectional view taken along line B—B of FIG. 5.

Subsequent steps are shown in FIGS. 5 to 7. FIG. 5 is a plan view of the same essential portion as FIG. 1 in the manufacturing process of the DRAM. FIGS. 6 and 7 are cross-sectional views taken along lines A—A and B—B of FIG. 5, respectively. In this step, a plurality of word lines WL (gate electrodes 5) are formed on the main surface of the substrate 1. That is, on the main surface of the substrate 1, for example, an n-type polycrystalline silicon film (having film thickness of about 70 nm) doped with phosphorus (P) or the like, a barrier metal film (having film thickness of about 5 to 10 nm) formed of tungsten nitride (WN) or titanium nitride (TiN), a tungsten (W) film (having film thickness of about 100 nm), and a gap insulative film 6 (having film thickness of about 150 nm) are deposited in this order. Then, by using as a mask photoresist patterns for forming word lines to perform dry etching of these films, the word lines WL (gate electrodes 5) are formed. The polycrystalline silicon film and the cap insulative film 6 are deposited by the CVD method, and the barrier metal film and the W film are deposited by the sputtering method. The cap insulative film 6, for example, comprises a silicon nitride film.

As shown in FIG. 5, the word lines WL are formed like flat-surface band-shaped patterns extending along the Y direction of FIG. 5, and are arranged to extend along the X direction of FIG. 5 and have a predetermined interval between the adjacent to word lines parallel to one each. These word lines WL and the above-mentioned active regions L are arranged to intersect diagonally at each other. Flat-surface superposing portions between the word lines WL and the active regions L become the gate electrodes 5 of the memory cell selecting MIS●FETs. And, a region on which each word line WL is superposed in each active region L becomes a memory sell selecting MIS●FET channel region. As described above, since two memory cell selecting MIS●FETs are disposed in each active region L, two word lines WL are superposed on each active region L in two dimensions. And, in the DRAM of this structure, the arrangement interval D2 extending in the longitudinal direction of each active region L only has only a dimension enough to dispose only one word line WL. A line width of each word line WL has a line width necessary for obtaining a threshold voltage of the memory sell selecting MIS●FET, and has, for example, a value of about 100 nm (converted to wafer size) in the present embodiment. Further, a pitch between the adjacent word lines WL has, for example, a value of about 60 nm (converted to wafer size).

Figure 8:
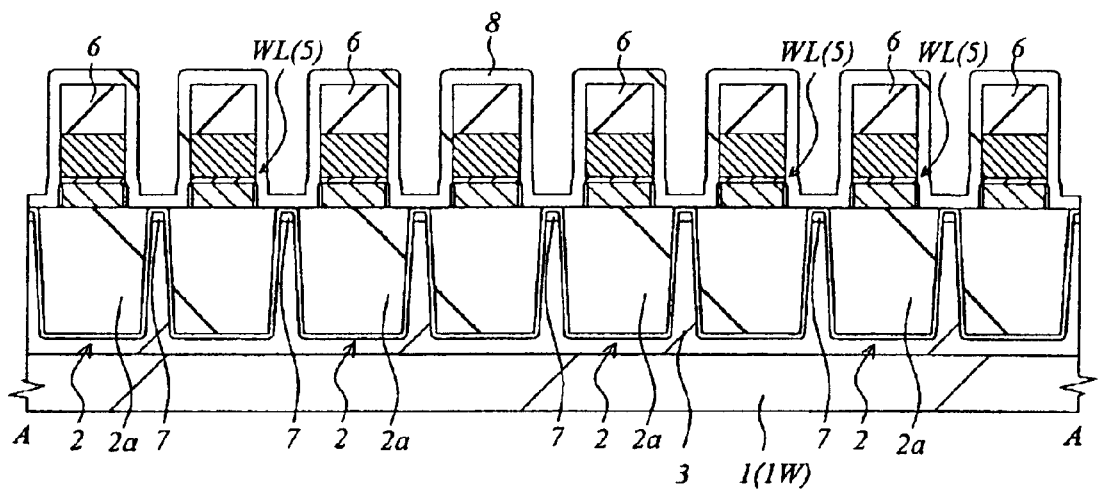
FIG. 8 is a cross-sectional view of an essential portion corresponding to the essential portion taken along line A—A of FIG. 1 and being subsequent to the essential portion of FIG. 5 in the manufacturing process of the semiconductor integrated circuit device.
Figure 9:
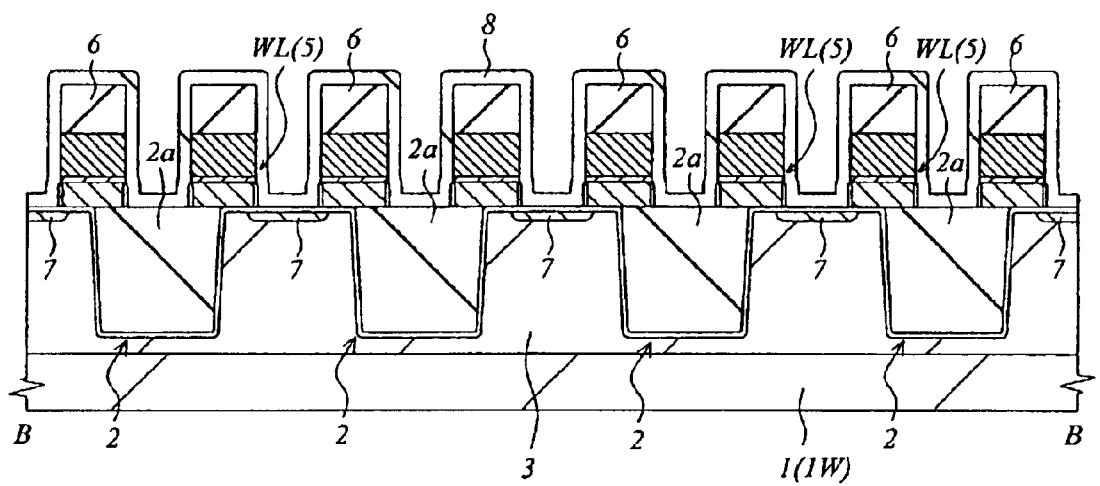
FIG. 9 is a cross-sectional view of an essential portion corresponding to the essential portion taken along line B—B of FIG. 1 and being subsequent to the essential portion of FIG. 5 in the manufacturing process of the semiconductor integrated circuit device.
Figure 10:
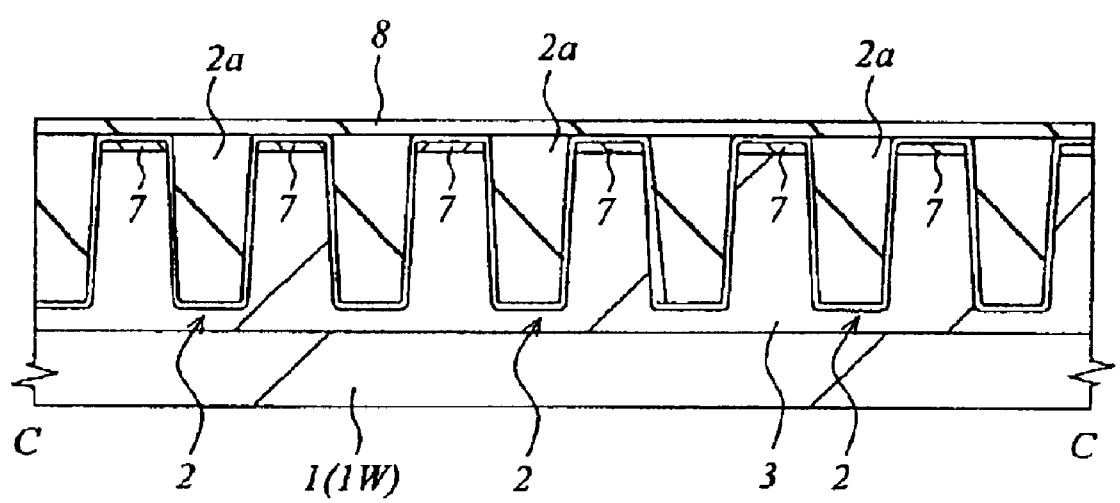
FIG. 10 is a cross-sectional view of an essential portion corresponding to the essential portion taken along line C—C of FIG. 1 and being subsequent to the essential portion of FIG. 5 in the manufacturing process of the semiconductor integrated circuit device.

Subsequent steps are shown in FIGS. 8 to 10. FIGS. 8 to 10 are cross-sectional views taken along lines A—A, B—B and C—C of FIG. 1, respectively. In this step, arsenic (As) or phosphorus (P) is ion-implanted into p-type wells 3 to form n-type semiconductor regions 7 (source and drain) in each of the p-type wells 3 on both sides of the gate electrodes 5. By these steps, the memory cell selecting MIS●FETQs are substantially completed. Then, an insulative film 8 formed of silicon nitride or the like is deposited on the substrate 1 to a thickness of about 50 nm by using the CVD method. The insulative film 8 is thinly coated on the surface of each word line WL without being buried between the adjacent word lines WL.

Subsequent steps are shown in FIGS. 11 to 14. FIGS. 11 to 14 are cross-sectional views taken along lines A—A, B—B and C—C of FIG. 1, respectively. In this step, after insulative film 9 is deposited in the substrate 1, substantially flat-surface-circle-shaped contact holes (first hole patterns) 10a and contact holes (second hole patterns) 10b are formed in the insulative films 9 such that each n-type semiconductor region 7 is exposed from a bottom surface. That is, firstly, the insulative films 9 formed of silicon nitride or the like are deposited on the substrate 1 to a thickness of about 600 nm by using the CVD method, and then a surface of each insulative film 9 is flattened by the chemical mechanical polishing method or the like. Then, a photoresist pattern for forming each contact hole is formed on each insulative film 9. This photoresist pattern is a pattern such that contact hole forming regions are exposed and a region other than the contact hole forming regions is covered. This photoresist pattern will be explained in detail later. Thereafter, by using the photoresist pattern as an etching mask and performing dry etching, portions of the insulative films 9 and 8 exposed from the photoresist pattern are removed by etching. This results in formation of the contact holes 10a and 10b such that each n-type semiconductor region 7 (source and drain) of the memory cell selecting MIS●FETQs is exposed from the bottom surface. This etching treatment is performed under the condition that the etching of each insulative film 9 formed of silicon oxide or the like is great in etching selection ratio to the silicon nitride film and the etching of each insulative film 8 formed of the silicon nitride is great in etching selection ratio to the silicon or silicon oxide film. By this, the contact holes 10a and 10b can be formed as self-aligns relative to the gate electrodes 5 (word lines WL).

Among the contact holes 10a and 10b, each contact hole 10a disposed at a center of each active region L is a hole pattern (a transfer pattern) for electrically connecting each n-type semiconductor region 7 and each data line. And, each contact hole 10b disposed on both sides of each active region L is a hole pattern (a transfer pattern) for electrically connecting each n-type semiconductor region 7 and each lower electrode (a storage electrode) of an information storage capacity element.

The contact holes 10a and 10b are, for example, densely disposed like a honeycomb. Each diameter of the contact holes 10a and 10b has, for example, a value of about 240 nm (converted to wafer size). And, an arrangement pitch Dy2 between the contact holes 10a and 10b in the Y direction is about 280 nm (converted to wafer size), for example. A dimension Dy3 in which the respective contact holes 10a and 10b are shifted in the Y direction per row of the X direction is about 140 nm (converted to wafer size), for example. An arrangement pitch Dx3 between the contact holes 10a and 10b extending in the X direction is about 260 nm (converted to wafer size), for example.

And, an arrangement pitch Dy4 between the contact holes 10a and 10b extending in the Y direction is about 420 nm (converted to wafer size), for example. An arrangement pitch Dx4 between the contact holes 10a and 10b extending in the X direction is about 520 nm (converted to wafer size), for example.

And, an arrangement pitch Dy5 between the contact holes 10a and 10b extending in the Y direction is about 280 nm (converted to wafer size), for example. An arrangement pitch Dy6 between the contact holes 10a and 10b extending in the Y direction is about 420 nm (converted to wafer size), for example. Further, an arrangement pitch Dx5 between the contact holes 10a and 10b extending in the X direction is about 520 nm (converted to wafer size), for example.

Figure 15:
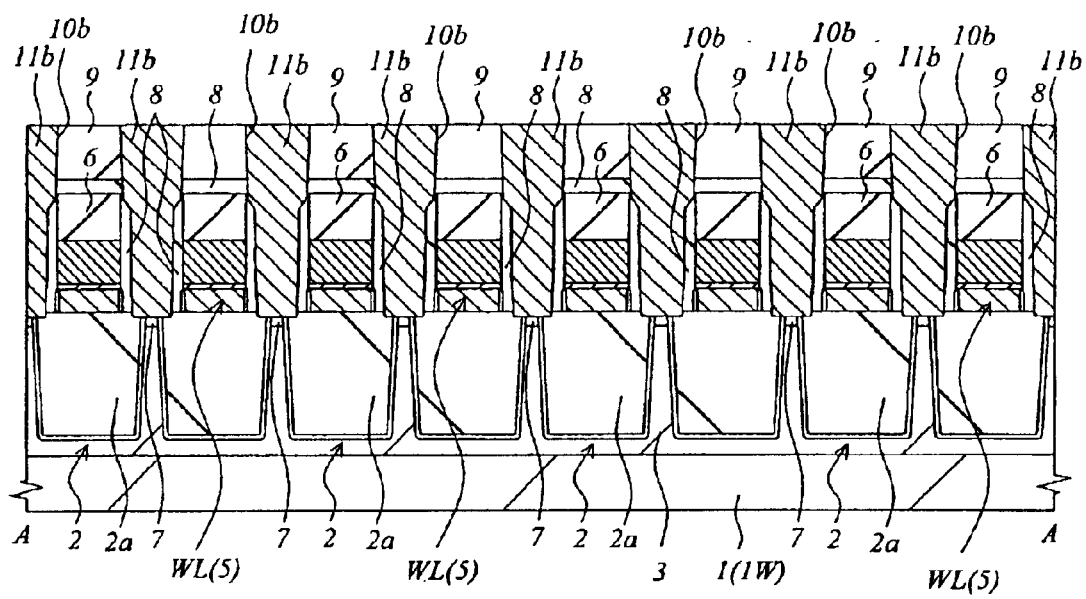
FIG. 15 is a cross-sectional view of an essential portion corresponding to the essential portion taken along line A—A of FIG. 1 and being subsequent to the essential portion of FIG. 11 in the manufacturing process of the semiconductor integrated circuit device.
Figure 16:
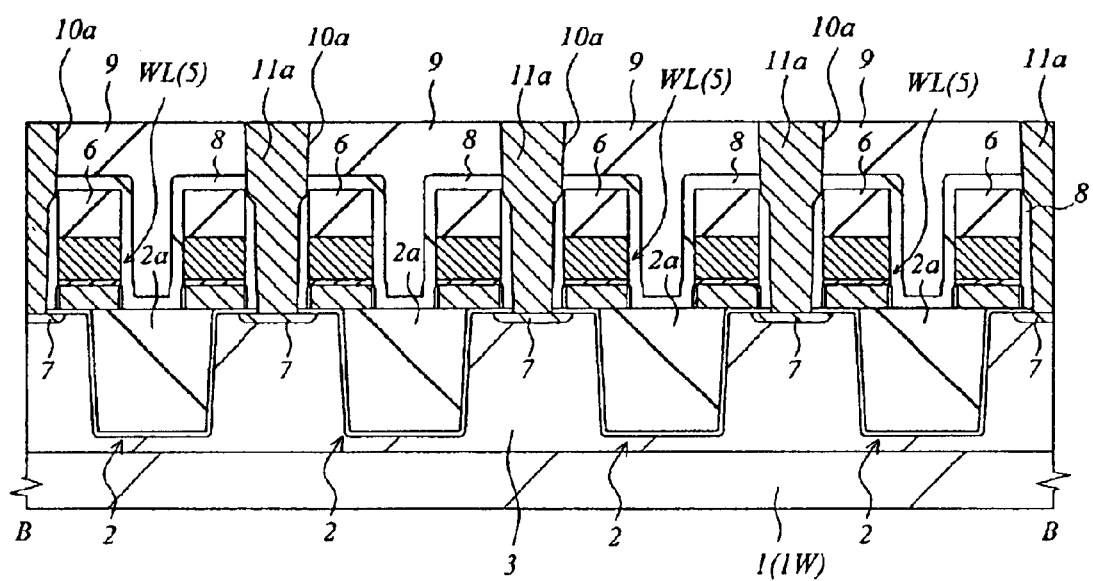
FIG. 16 is a sectional view of an essential portion corresponding to the essential portion taken along line B—B of FIG. 1 and being subsequent to the essential portion of FIG. 11 in the manufacturing process of the semiconductor integrated circuit device.

A subsequent step is shown in FIGS. 15 and 16. FIGS. 15 and 16 are cross-sectional views corresponding to sectional portions taken along lines A—A and B—B of FIG. 1, respectively. In this step, as shown in FIGS. 15 and 16, plugs 11a and 11b are formed inside the respective contact holes 10a and 10b. To form the plugs 11a and 11b, an n-type polycrystal-line silicon film doped with phosphorus (P) is deposited on each insulative film 9, and thereby this n-type polycrystalline silicon film is embedded inside the contact holes 10a and 10b, and thereafter the n-type polycrystalline silicon film deposited on outer sides of the contact holes 10a and 10b is removed by a chemical mechanical polishing method or an etching back method.

Figure 17:
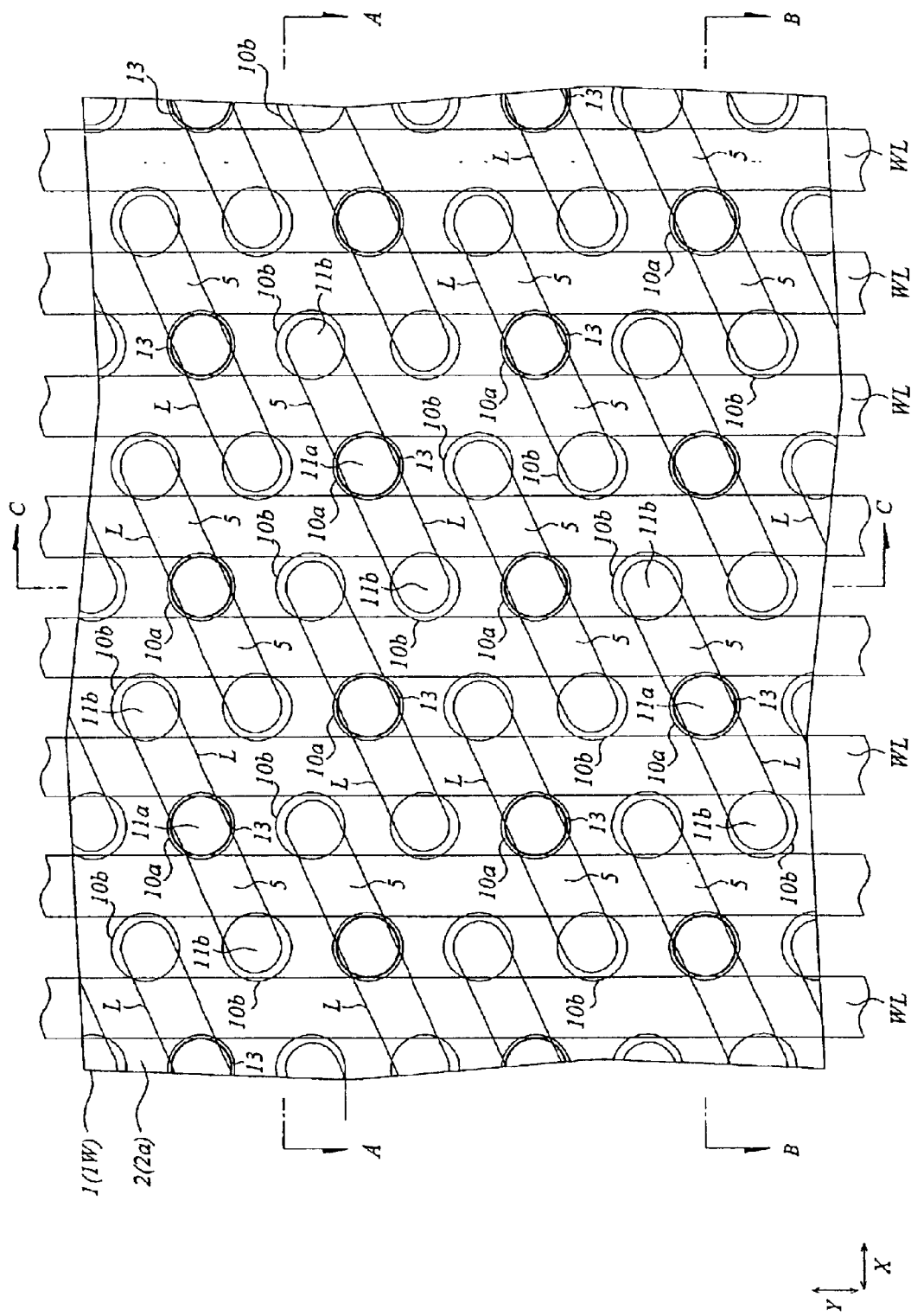
FIG. 17 is a plan view of an essential portion subsequent to the respective essential portions of FIGS. 15 and 16 in the manufacturing process of the semiconductor integrated circuit device.
Figure 18:
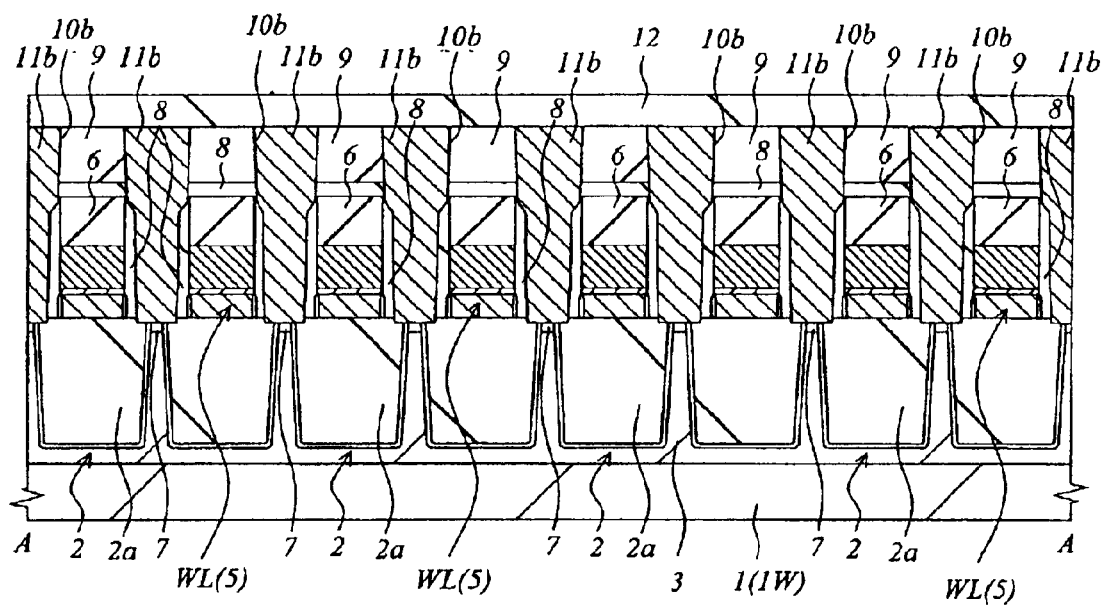
FIG. 18 is a cross-sectional view taken along line A—A of FIG. 17.
Figure 19:
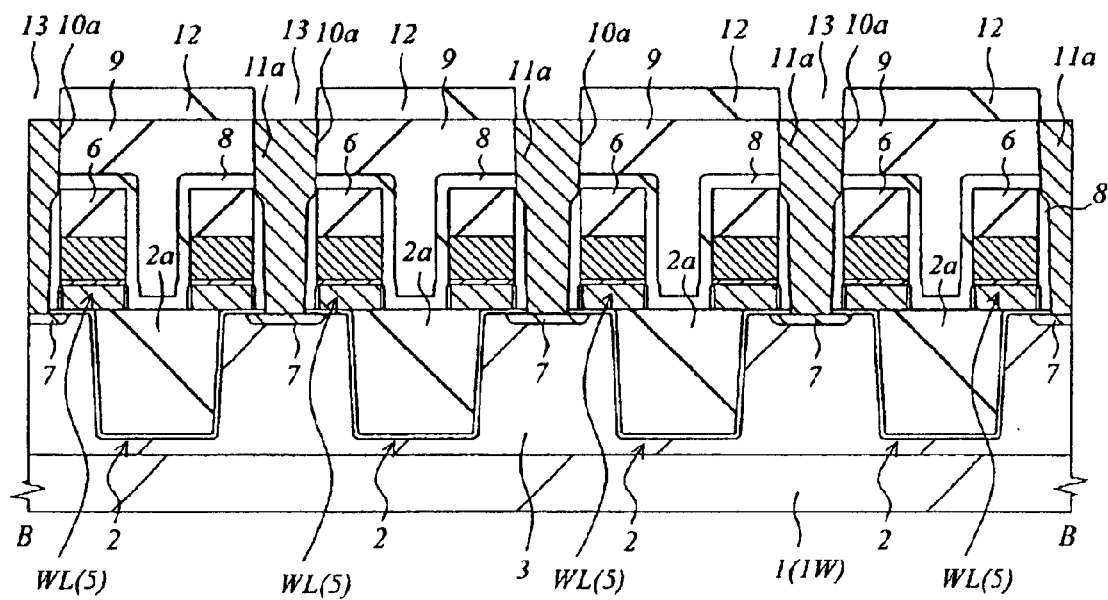
FIG. 19 is a cross-sectional view taken along line B—B of FIG. 17.
Figure 20:
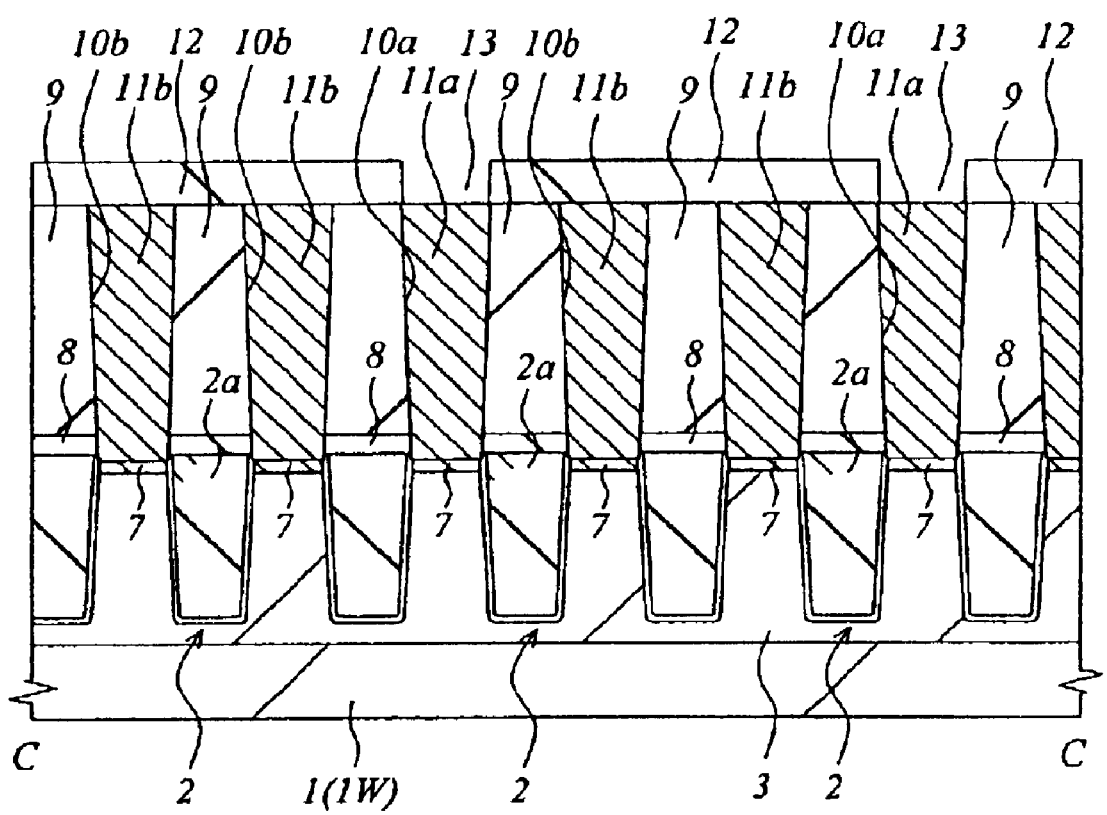
FIG. 20 is a cross-sectional view taken along line C—C of FIG. 17.

A subsequent step is shown in FIGS. 17 to 20. FIG. 17 is a plane view of the same essential portion as that of FIG. 1, and FIGS. 18 to 20 are cross-sectional views taken along lines A—A, B—B and C—C of FIG. 17, respectively. In this step, after an insulative film 12 is deposited on the substrate 1, through holes 13 like a substantially flat-surface circle are formed in the insulative film 12 such that a portion of the plug 11a is exposed from the bottom thereof. That is, firstly, the insulative film 12, for example, formed of silicon oxide or the like is deposited on the substrate 1 (upper surfaces of the insulative film 9 and the plugs 11a and 11b) by the CVD method or the like to a thickness of about 50 nm. Then, a photoresist pattern for forming through holes for the data line is formed on the insulative film 12. This photoresist pattern is a pattern such that a through hole forming region for connecting the data line and each plug 11a is exposed, and a region other than the through hole forming region is covered. Then, as shown in FIGS. 17, 19 and 20, by using the photoresist pattern as the etching mask and removing a portion of the insulative film 12 exposed therefrom by etching, the through holes 13 are formed. A plane arrangement pitch between the through holes 13 is relatively wider than a plane arrangement pitch between each contact holes 10 and each contact hole 10b. Therefore, the photoresist pattern for forming each through hole 13 can be formed by a halftone type phase shift mask under the exposure condition of coherence ($\delta$)=0.3 (or a normal exposure condition in a phase shift method) in which interference of the illumination is high. Each diameter of the through holes 13 has, for example, a value of about 200 nm (converted to wafer size).

Figure 21:
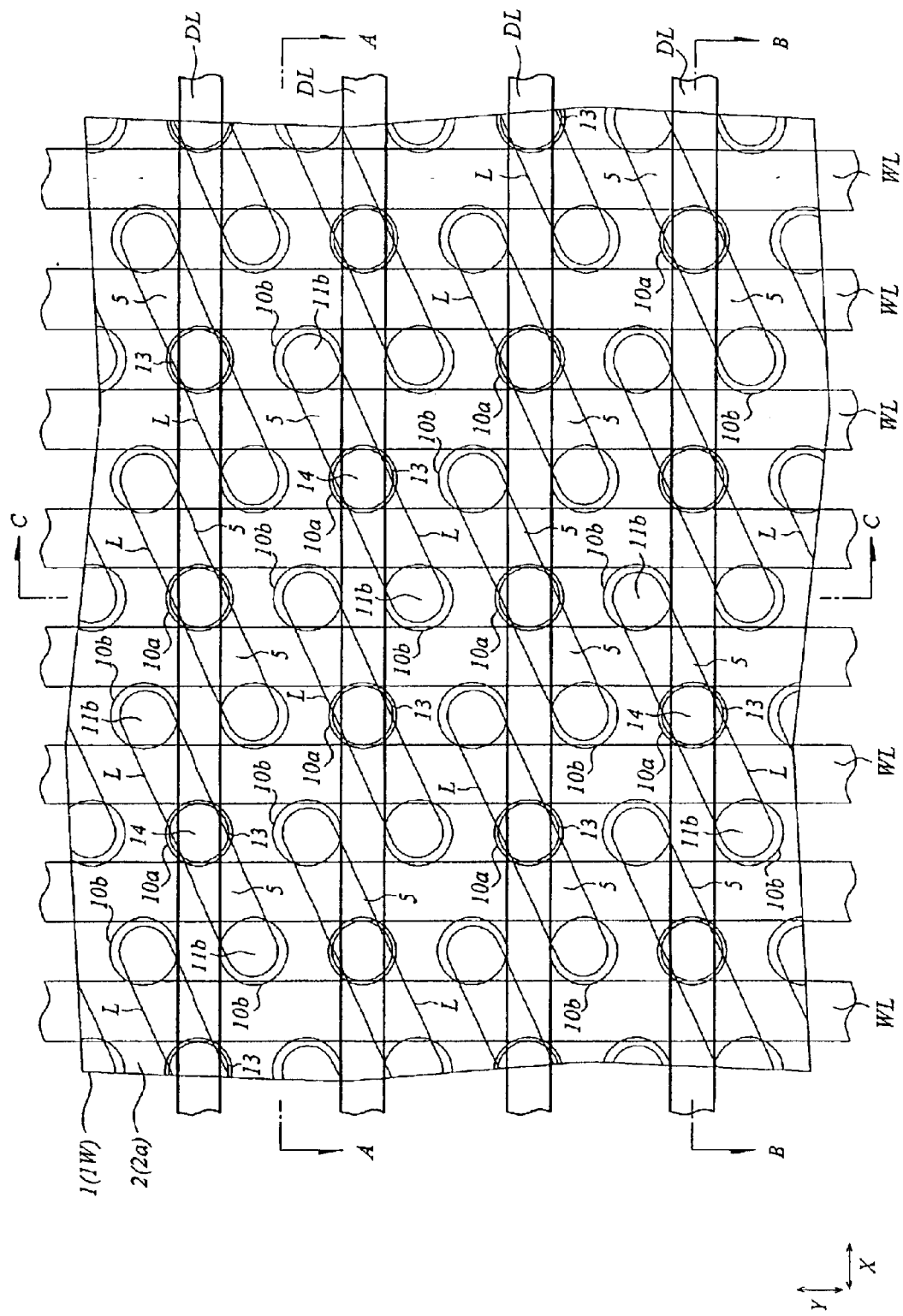
FIG. 21 is a plan view of an essential portion subsequent to the essential portion of FIG. 17 in the manufacturing process of the semiconductor integrated circuit device.
Figure 22:
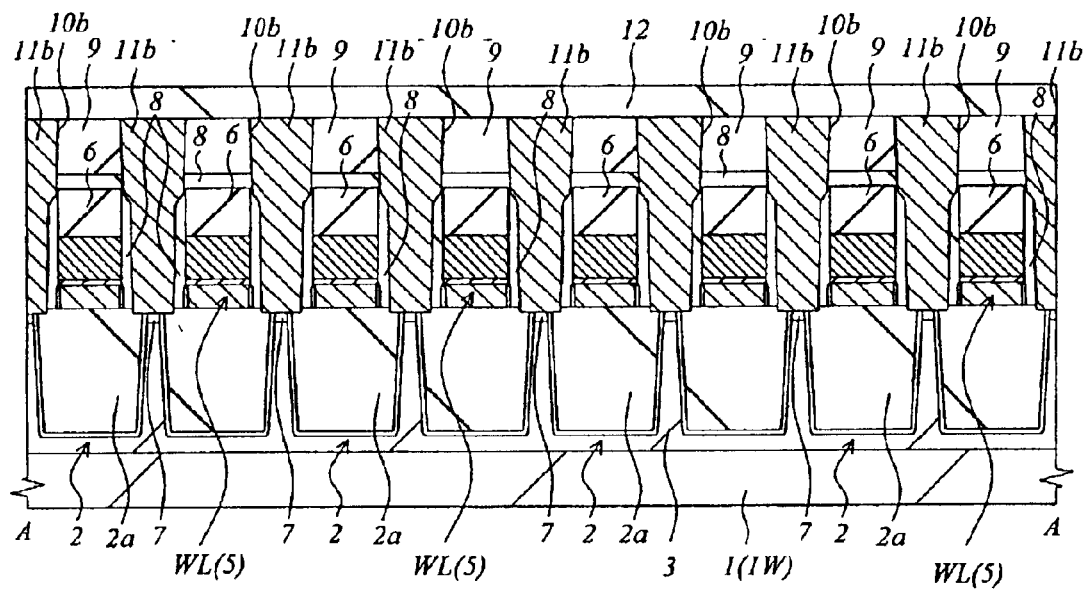
FIG. 22 is a cross-sectional view taken along line A—A of FIG. 21.
Figure 23:
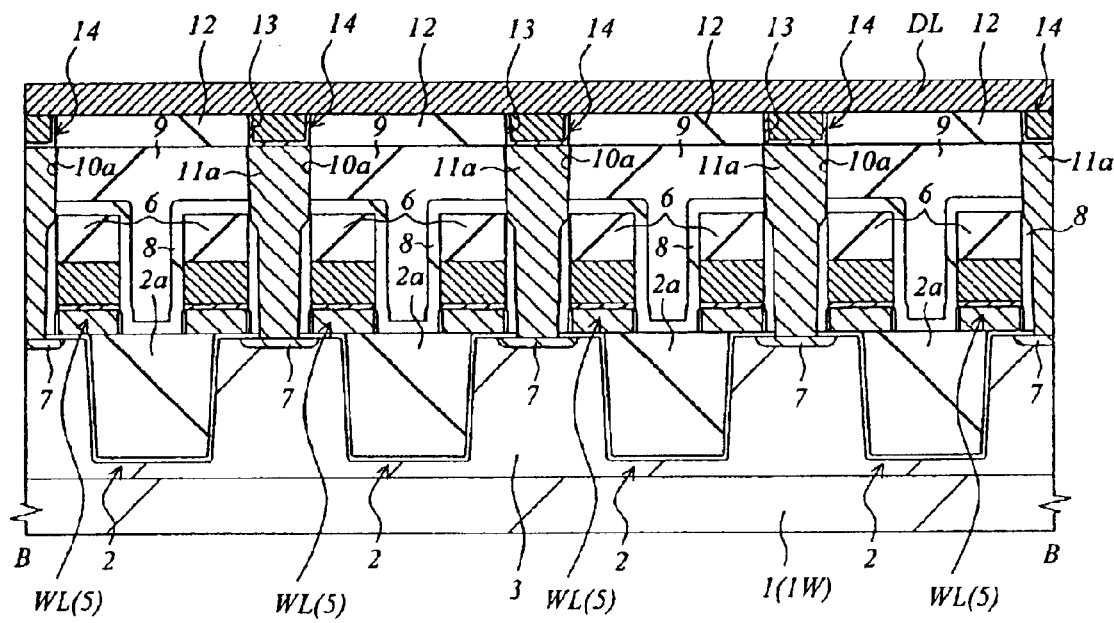
FIG. 23 is a cross-sectional view taken along line B—B of FIG. 21.
Figure 24:
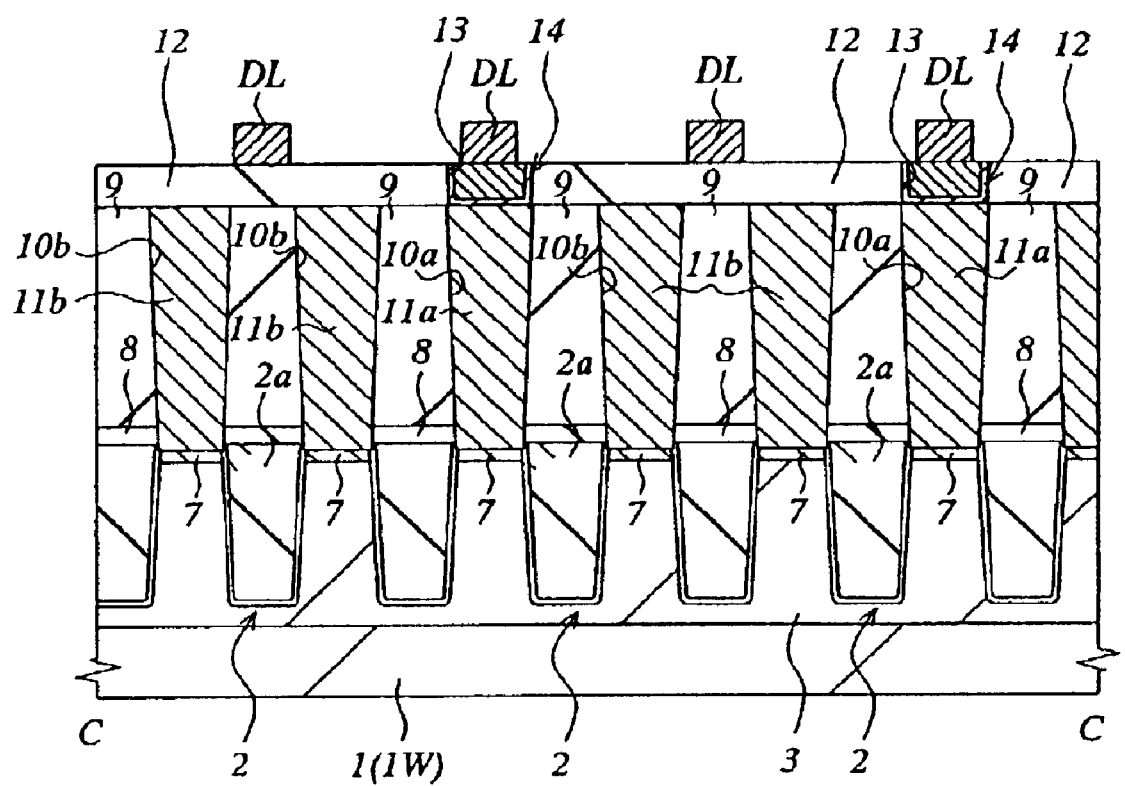
FIG. 24 is a cross-sectional view taken along line C—C of FIG. 21.

A subsequent step is shown in FIGS. 21 to 24. FIG. 21 is a plane view of the same essential portion as that of FIG. 1, and FIGS. 22 to 24 are cross-sectional views taken along lines A—A, B—B and C—C of FIG. 21, respectively. In this step, after a plug 14 is formed in each through hole 13, a data line DL to be connected to each plug 14 is formed. First, to form each plug 14, a barrier metal film formed of a laminated film of titanium (Ti) film and titanium nitride (TiN) film is deposited on the insulative film 12 by the sputtering method. Then, tungsten (W) film is deposited on the barrier metal film by the CVD method, and thereby these films inside each through hole 13 are embedded. Thereafter, these films deposited on the outer side of each through hole 13 are removed by the chemical mechanical polishing method. Then, to form the data lines DL, a titanium (TiN) film (having a film thickness of about 10 nm) is deposited on the insulative film 12 by the sputtering method. Then, tungsten (W) film (film thickness is about 50 nm) is deposited on the titanium nitride (TiN) film by the CVD method. Thereafter, these films are dry-etched by using the photoresist pattern as a mask.

Each data line DL is electrically connected to one of a n-type semiconductor region 7, the one of which is for source/drain of the memory cell selecting MISQs through a plug 14 and a layer plug 11a disposed thereunder. Each line width of the data lines DL has, for example, a value of about 80 nm (converted on wafer). Each distance between the adjacent data lines DL has, for example, a value of about 430 nm (converted to wafer size).

Figure 25:
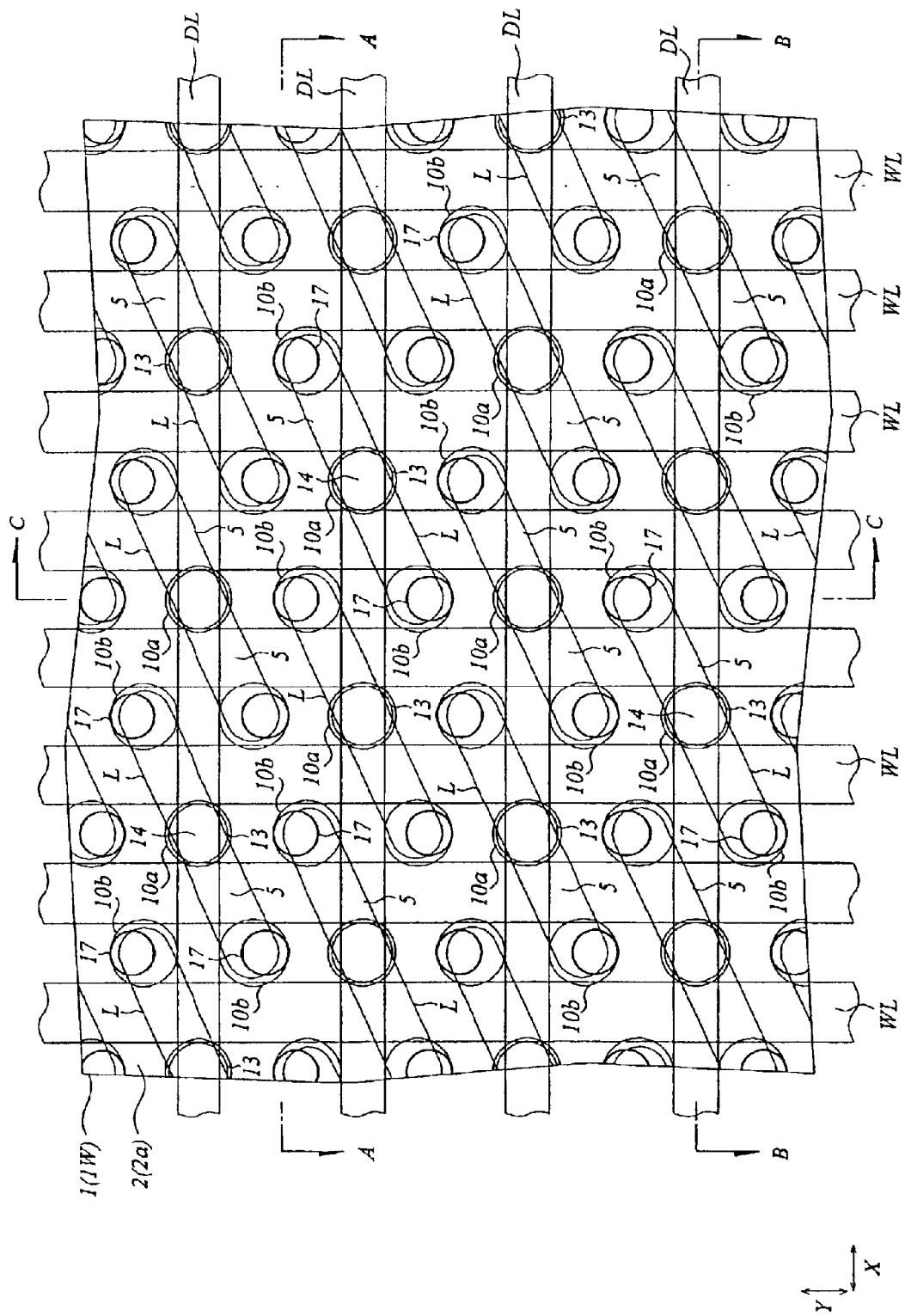
FIG. 25 is a plan view of an essential portion subsequent to the essential portion of FIG. 21 in the manufacturing process of the semiconductor integrated circuit device.

A subsequent step is shown in FIGS. 25 to 28. FIG. 25 is a plane view of the same essential portion as that of FIG. 1, and FIGS. 26 to 28 are cross-sectional views taken along lines A—A, B—B and C—C of FIG. 25, respectively. In this step, after an insulative film 15 and an insulative film 16 are deposited on the substrate 1, each through hole (a second hole pattern) 17 like a substantially flat-surface circle is formed on the insulative films 15 and 16 and the insulative film 12 such that a portion of each plug 11b is exposed from the bottom thereof.

Figure 26:
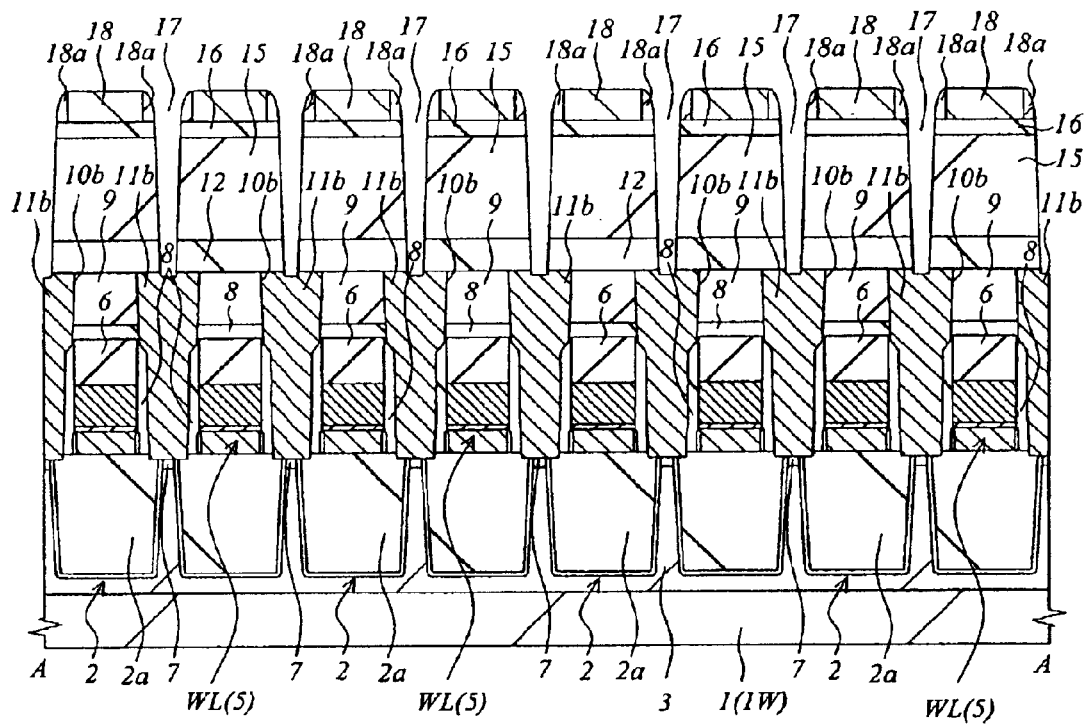
FIG. 26 is a cross-sectional view taken along line A—A of FIG. 25.
Figure 27:
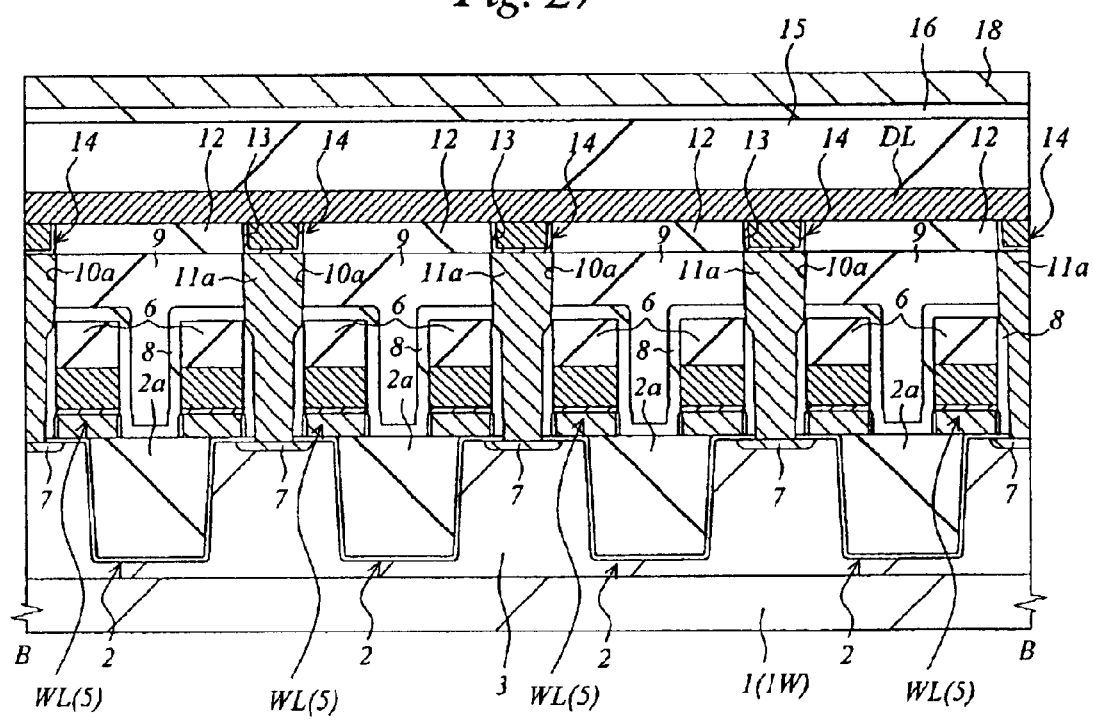
FIG. 27 is a cross-sectional view taken along line B—B of FIG. 25.
Figure 28:
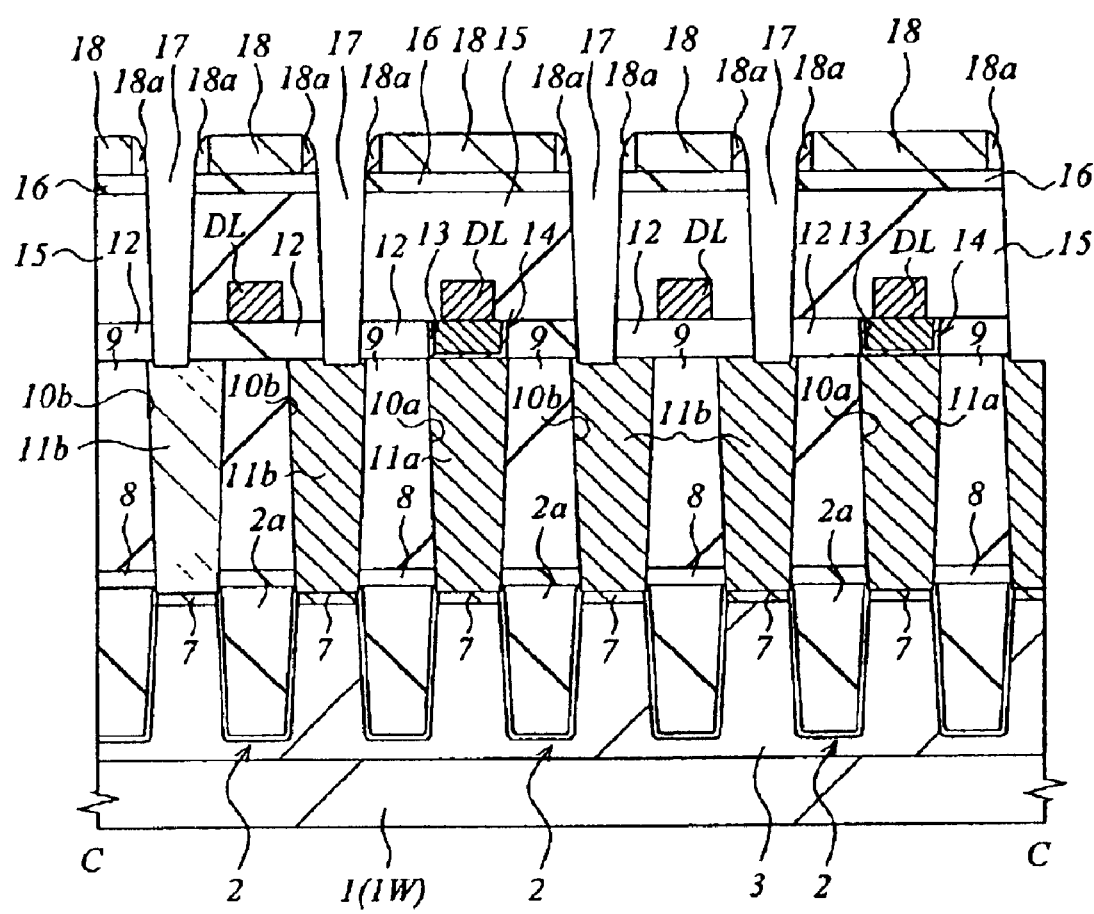
FIG. 28 is a cross-sectional view taken along line C—C of FIG. 25.

That is, first, each insulative film 15 formed of silicon oxide or the like, for example, is deposited on the substrate 1 (an upper surface of each insulative film 12 and a surface of each data line DL) by the CVD method or the like to a thickness of about 300 nm. Then, after the insulative film 16 formed of silicon nitride is, for example, deposited on the insulative film 15 to a film thickness of about 50 nm by the CVD method or the like. Then, for example, polycrystalline film is deposited on the insulative film 16 by the CVD method. Thereafter, after each photoresist pattern is formed on the polycrystalline silicon film in order to form though holes for the information storage capacity element, each hard mask 18 is formed by using each photoresist pattern as an etching mask and forming holes in the though hole formation region of the polycrystalline silicon film. Each photoresist pattern is a pattern such that the through hole formation region for connecting each plug 11b and a lower electrode of the information storage capacity element is exposed and a region other than the through hole formation region is covered. A plane arrangement pitch between the through holes in this case is relatively wider than a plane arrangement pitch between each contact hole 10a and each contact hole 10b. Therefore, the photoresist pattern can be formed under the normal exposure condition by the phase shift method using the Levenson type phase shift mask. After each hard mask 18 is formed, a polycrystalline silicon film is further deposited on the substrate 1 by the CVD method or the like. By etching back this by an anisotropic dry etching method or the like, side walls 18a are formed on an inner surface of a hole of each hard mask 18. Then, as shown in FIGS. 25, 26 and 28, by using each hard mask 18 and each side wall 18a as a etching mask and removing portions of the insulative films 16, 15 and 12 exposed therefrom by the etching, the through holes 17 are formed.

Each through hole 17 is formed such that its diameter is smaller than that of each lower contact hole 10b. Further, each through hole 17 is offset in such a direction that a center thereof is separated from each data line DL further than a center of each contact hole 10b. By making the diameter of each through hole 17 smaller than that of each lower contact hole 10b and by offsetting each through hole 17 in such a direction that the center of each through hole 17 is separated from each data line DL, even if the memory cell size is reduced, it is possible to prevent shortcircuit between each through hole 17 (plug embedded therein) and each data line DL without using a self-align contact (SAC) technique. Even if each diameter of through holes 17 is made smaller than that of the contact holes 10b disposed thereunder or one of centers of both the holes is deviated from the other, it is possible to sufficiently secure a contact area between both of the holes. Each through holes 17 is not necessarily formed on each lower plug 11b as a whole, and may preferably be formed such that at least one portion thereof is connected to each lower plug 11b. That is, this permits having a structure of a so-called gap. Each diameter of the through holes 17 is, for example, a value of about 170 nm (converted to wafer size).

A distance between each end of the through holes 17 and each end of the bit lines DL, which is close to and face each end of the through holes 17 is, for example, about 40 nm (converted to wafer size).

Figure 29:
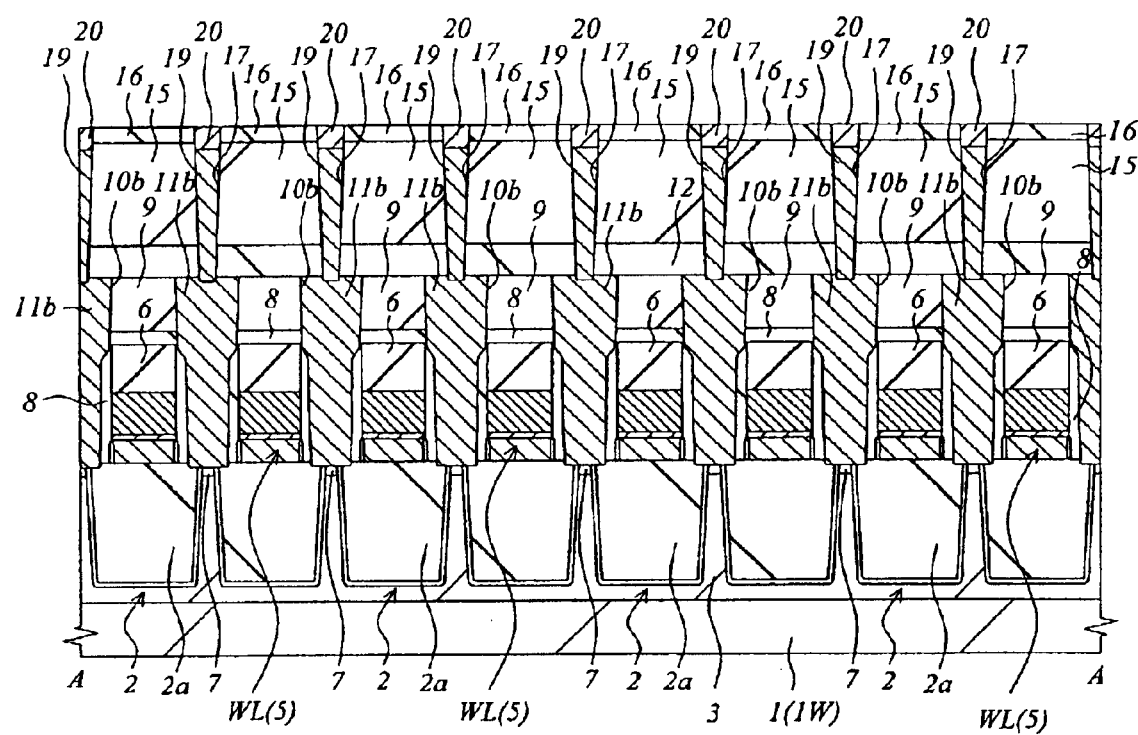
FIG. 29 is a cross-sectional view of an essential portion corresponding to the essential portion taken along line A—A of FIG. 1 and being subsequent to the essential portion of FIG. 25 in the manufacturing process of the semiconductor integrated circuit device.
Figure 30:
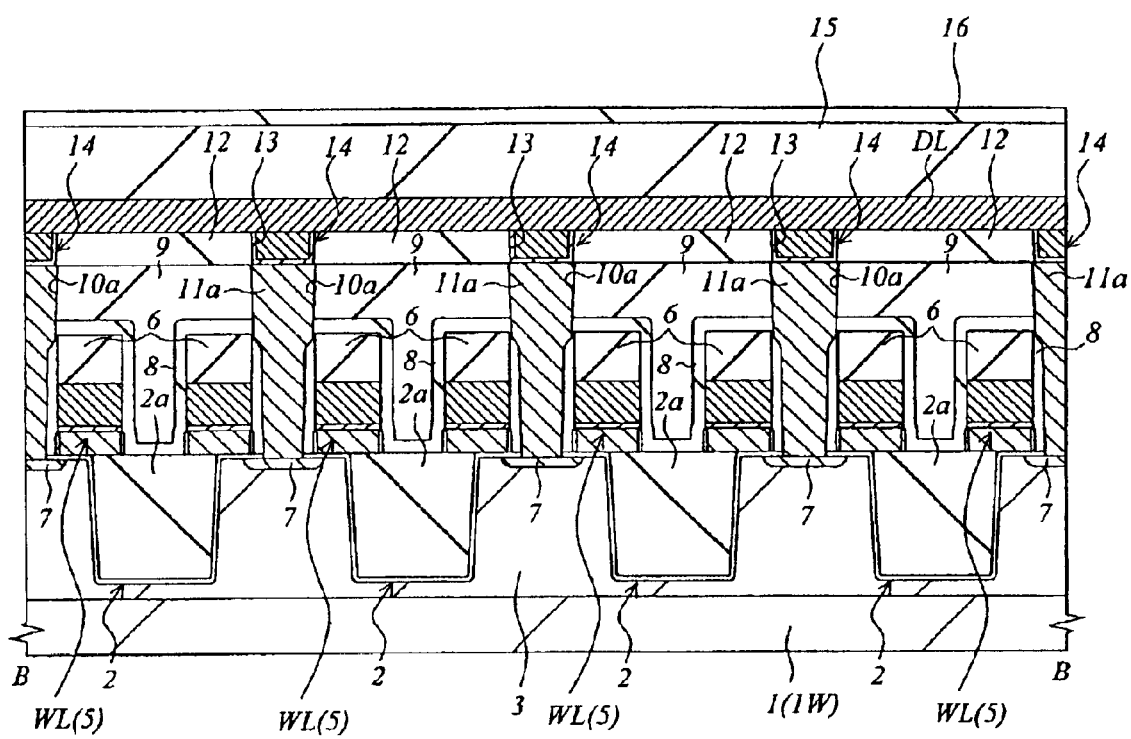
FIG. 30 is a cross-sectional view of an essential portion corresponding to the essential portion taken along line B—B of FIG. 1 and being subsequent to the essential portion of FIG. 25 in the manufacturing process of the semiconductor integrated circuit device.
Figure 31:
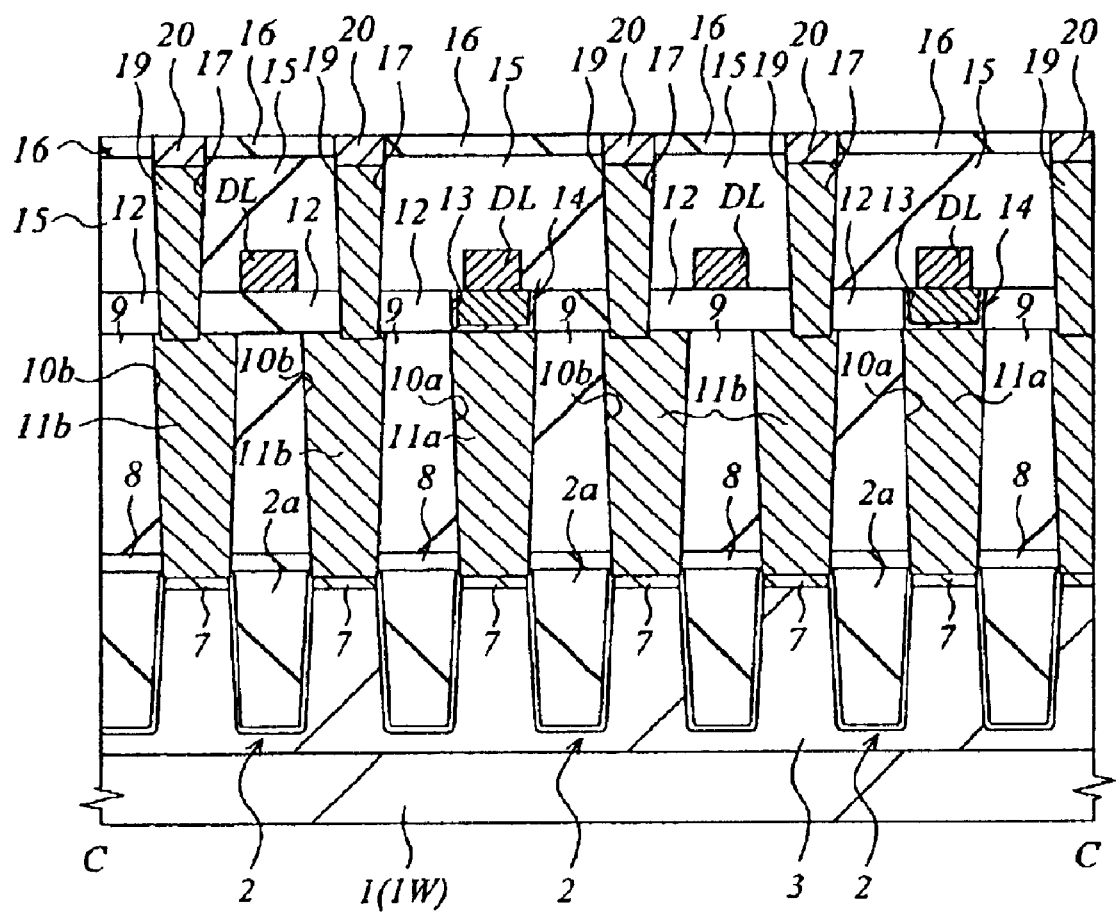
FIG. 31 is a cross-sectional view of an essential portion corresponding to the essential portion taken along line C—C of FIG. 1 and being subsequent to the essential portion of FIG. 25 in the manufacturing process of the semiconductor integrated circuit device.

A subsequent step is shown in FIGS. 29 to 31. FIGS. 29 to 31 are cross-sectional views showing portions corresponding to sectional portions taken along lines-A—A; B—B and C—C of FIG. 1, respectively. In this step, after each hard mask 18 and each side wall 18a are removed by the dry etching, a plug 19 is formed in each through hole 17, and further a barrier metal film 20 is formed on a surface of each plug 19. To form each plug 19 and each barrier metal film 20, first, a n-type polycrystalline silicon film doped with phosphorus (P) is deposited on the insulative film 16 by the CVD method, and thereby the n-type polycrystalline silicon film is embedded inside each through hole 17. Thereafter, the n-type polycrystalline silicon film deposited outside of each through hole 17 is removed by the chemical mechanical polishing method (or etch back). And, at this time, the n-type polycrystalline silicon film deposited in each through hole 17 is over-polished (over-etched) to retreat the surface of each plug 19 downward from a surface of the insulative film 16. Thereby, each space for embedding the barrier metal film 20 is secured in an upper portion of each plug 19. Next, by depositing a TiN film on an upper portion of the insulative film 16 by the sputtering method, the TiN film embedded into each through hole 17 on the upper portion of each plug 19. Thereafter, the TiN film deposited outside each through hole 17 is removed by the chemical mechanical polishing method (or etch back). As this kind of barrier metal material, ruthenium (Ru) polycide, titanium (Ti)—aluminum (Al)—silicon (Si) alloy or the like can be used in addition to TiN.

Figure 32:
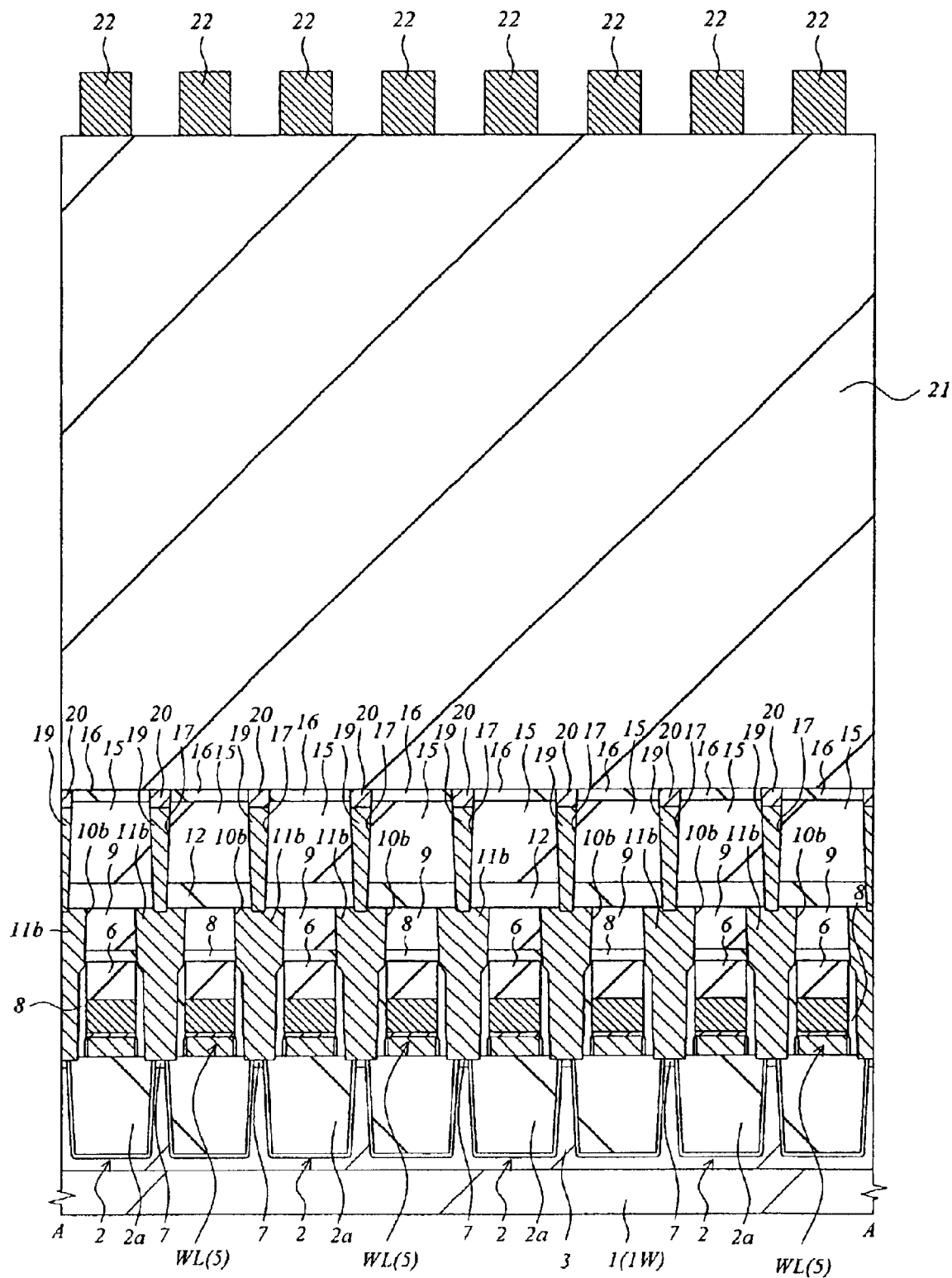
FIG. 32 is a cross-sectional view of an essential portion corresponding to the essential portion taken along line A—A of FIG. 1 and being subsequent to the respective essential portions of FIGS. 29 to 31 in the manufacturing process of the semiconductor integrated circuit device.
Figure 33:
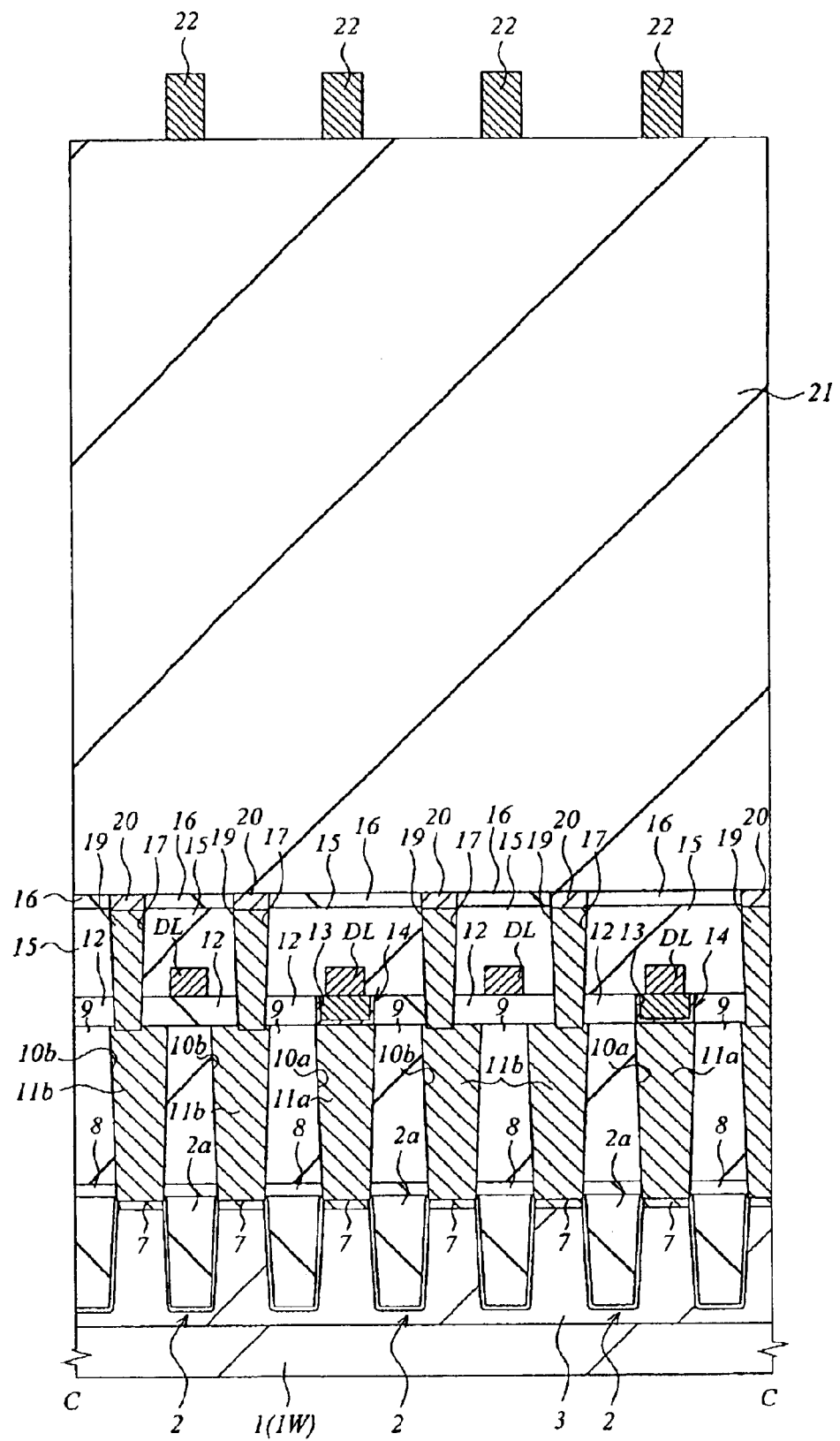
FIG. 33 is a sectional view of an essential portion corresponding to the essential portion taken along line C—C of FIG. 1 at the same step as FIG. 32 in the manufacturing process of the semiconductor integrated circuit device.

A subsequent step is shown in FIGS. 32 and 33. FIGS. 32 and 33 are cross-sectional views showing portions corresponding to the sectional portions taken-along lines A—A and C—C of FIG. 1, respectively. In this step, after an insulative film 21 formed of silicon oxide or the like, for example, is deposited on the insulative film 16 and the barrier metal film 20 by the CVD method, a reflection preventing film and a photoresist film are applied thereon in a spinning manner, and this results in formation of photoresist patterns 22 for forming each capacitor hole.

A lower electrode of the information storage capacity element constituting the DRAM memory cell is formed inside each hole (recess) to be formed in the insulative film 21 by the following steps. Therefore, the film thickness of the insulative film 21 becomes equal to a height of this lower electrode, so that, in order to enlarge a surface area of the lower electrode and thereby increase amount of electric charge stored therein, it is necessary to deposit the insulative film 21 by a thick film (having about 0.8 $\mu$m in thickness). The insulative film 21 is deposited by the plasma CVD method using oxygen and tetraethoxysilane (TEOS) as source gas. Then, a surface of the insulative film 21 is flattened by the chemical mechanical polishing method if necessary.

Further, each photoresist pattern 22 is constituted by a reflection preventing film and the photoresist film provided thereon. Because etching the thick insulative film 21; this photoresist film is set to about 480 nm in thickness by taking into consideration of a film thickness reduced in etching process. By performing pattering of the photoresist film by exposure development, and then using photoresist pattern thereof as an etching mask to perform dry etching treatment, the reflection preventing film disposed under the photoresist film has already patterned. When film thickness of the insulative film 21 has a value of about 0.8 $\mu$m, the resist mask allows etching to be performed. But, when a value of film thickness of the insulative film 21 is greater than this value, it is necessary to transfer a hard mask such as tungsten or the like, as an etching mask.

Figure 34:
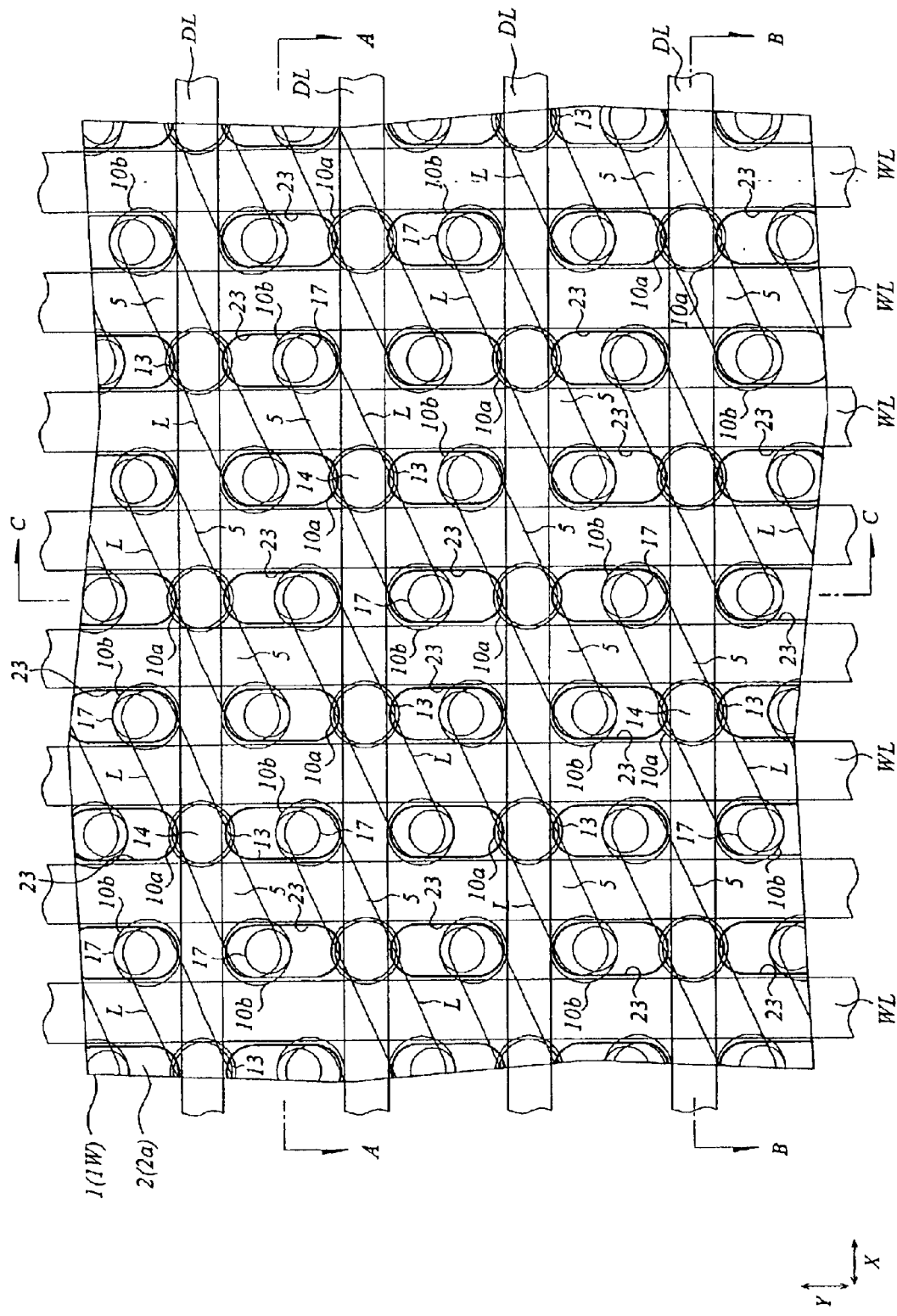
FIG. 34 is a plane view of an essential portion subsequent to the respective essential portions of FIGS. 32 and 33 in the manufacturing process of the semiconductor integrated circuit device.
Figure 35:
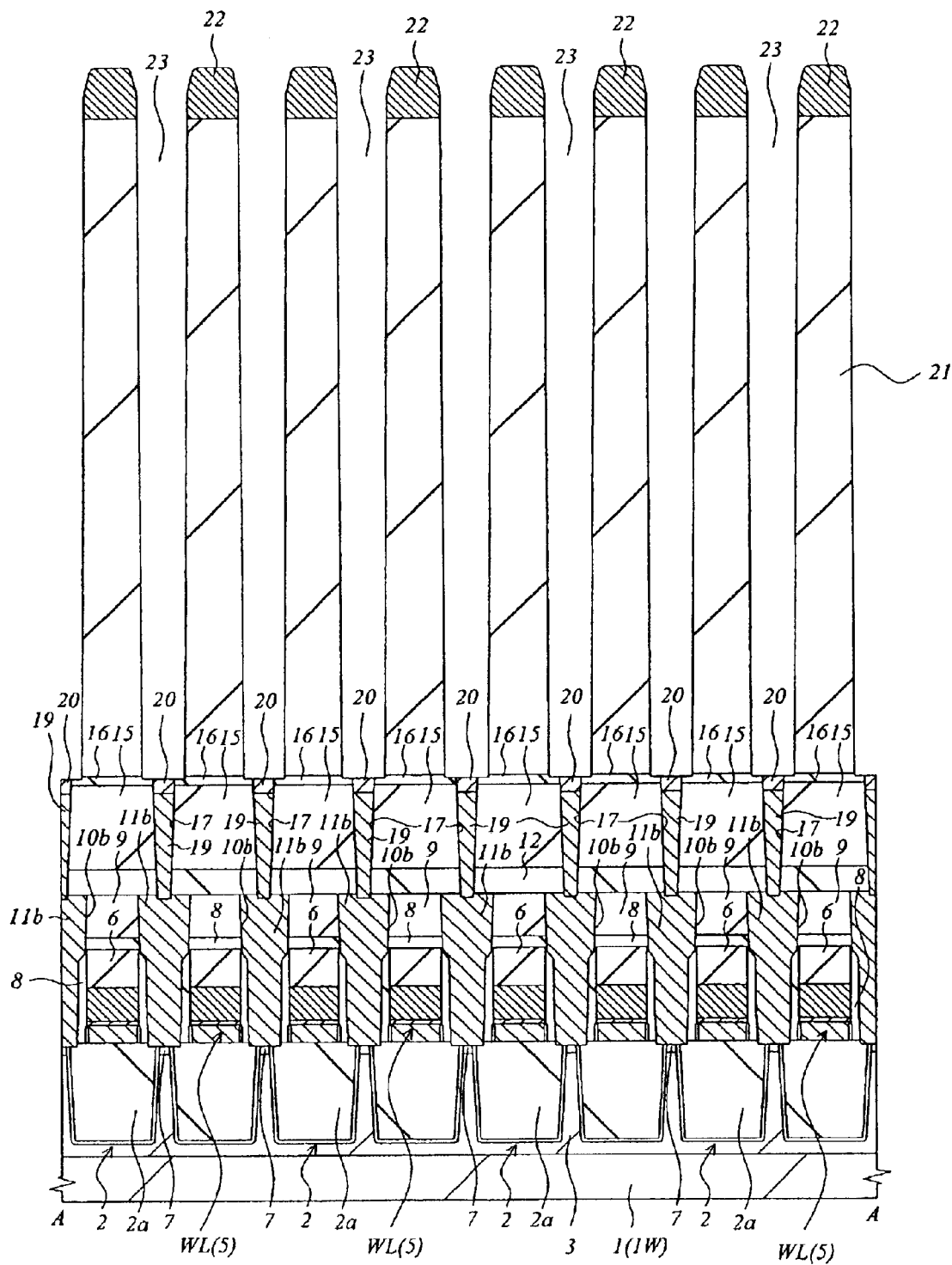
FIG. 35 is a cross-sectional view taken along line A—A of FIG. 34.
Figure 36:
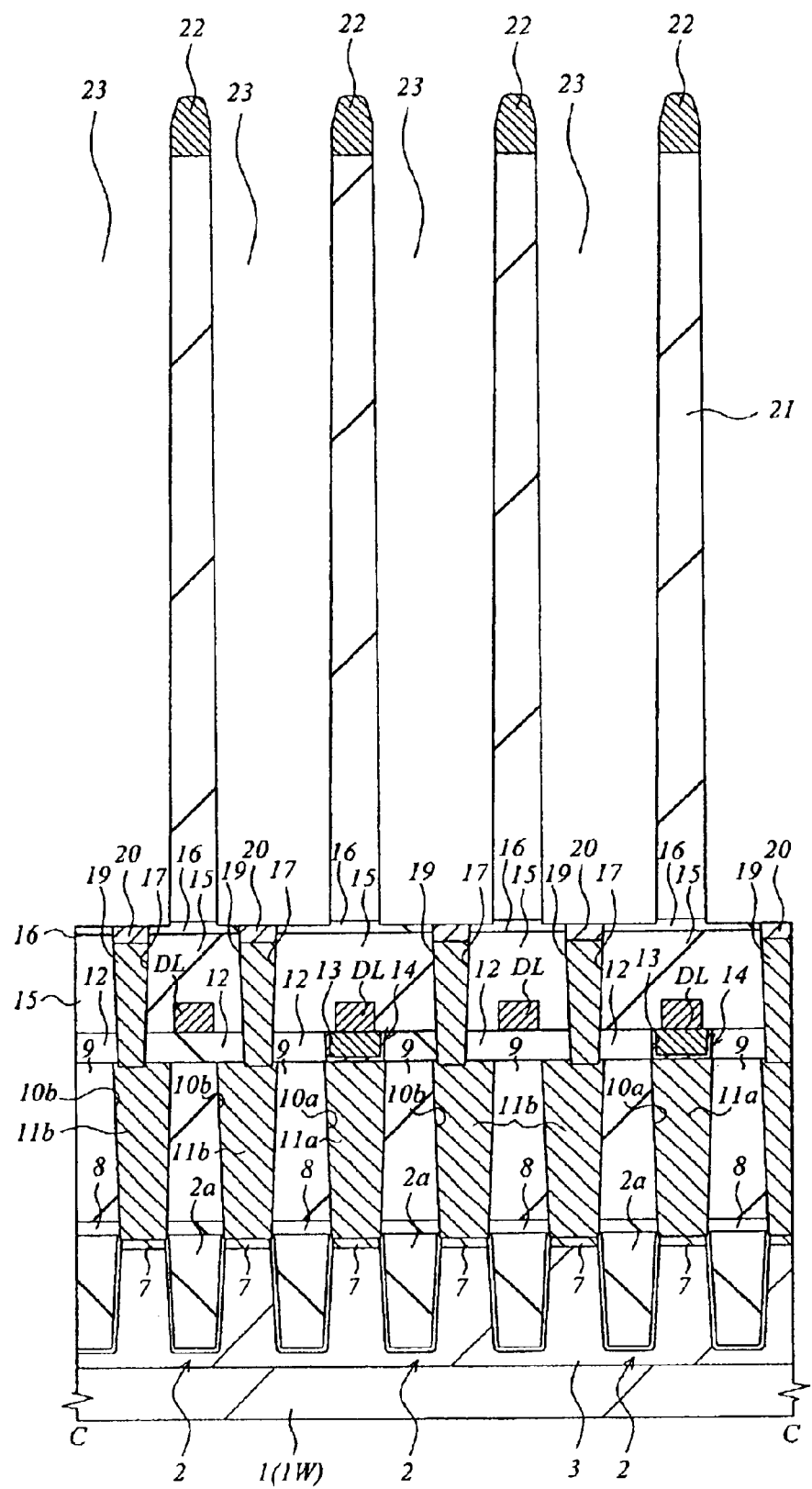
FIG. 36 is a cross-sectional view taken along line C—C of FIG. 34.

A subsequent step is shown in FIGS. 34 to 36. FIG. 34 is a plane view of the same essential portion as that of FIG. 1, and FIGS. 35 and 36 are cross-sectional views taken along lines A—A and C—C of FIG. 34, respectively. In this step, by using the photoresist pattern 22 as a mask to perform dry etching of the insulative film 21 disposed at a lower layer thereof, each deep hole (recess) 23 is formed in a bottom surface of the insulative film 21 such that a surface of the barrier metal film 20 in each through hole 17 is exposed. Each hole 23 comprises a rectangle-shaped plane pattern having long sides in an extending direction of each word line WL and short sides in an extending direction of each data line DL. A diameter of the long side direction is, for example, about 220 nm, and a diameter of the short side direction is, for example, about 130 nm. An interval between the adjacent holes 23 of the long side direction and an interval between the adjacent holes 23 of the short side direction are respectively 130 nm, for example.

Figure 37:
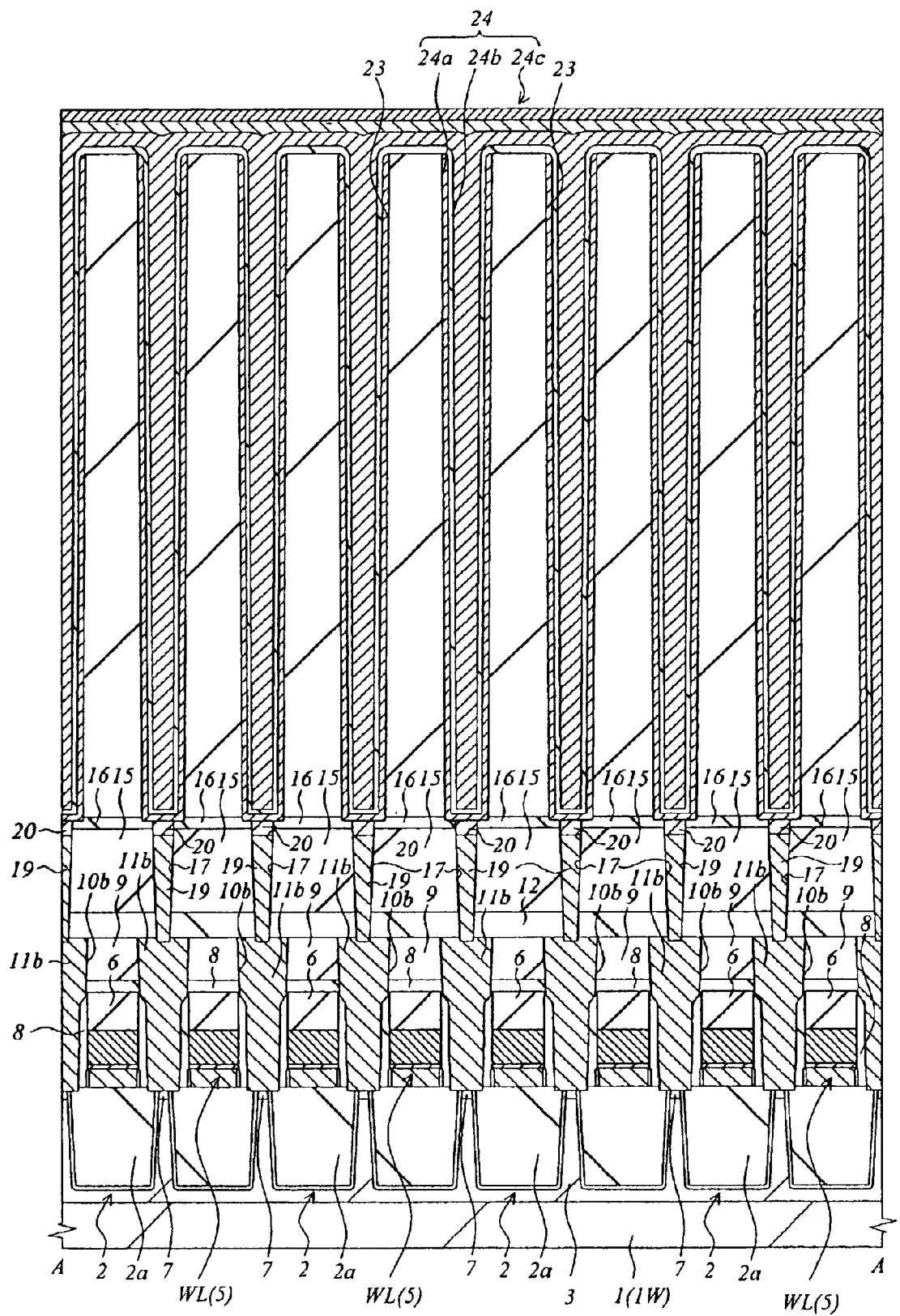
FIG. 37 is a cross-sectional view of an essential portion corresponding to the essential portion taken along line A—A of FIG. 1 and being subsequent to the essential portion of FIG. 34 in the manufacturing process of the semiconductor integrated circuit device.

FIG. 37 shows a cross-sectional view of the information storage capacity-element 24 that is formed in the holes 23. The information storage capacity element 24 includes a lower electrode 24a, a capacity insulative film 24b, and a plate electrode 24c. The lower electrode 24a is formed, for example, of a doped polysilicon film, and is electrically connected to one end of each n-type semiconductor region 7 of one of a source/drain of the memory cell selecting MISQs through the plugs 19 and plugs 11b formed in a lower layer thereof. The capacity insulative film 24b is formed, for example, of a silicon nitride film, a laminated film of a silicon nitride film and a silicon oxide film, tantalum oxide (TaO$_5$), or the like. The plate electrode 24c has a doped polysilicon film to be filled in the capacitor holes 23, and a metal film such as tungsten deposited thereon. Since the plate electrode 24c is formed by filling the inside of the capacitor holes 23 with the doped silicon film having good embedded characteristics thereinto, it is possible to embed securely the capacitor holes 23 having a high aspect ratio.

The capacity insulative film 24b may be constituted, for example, by high (strong) dielectric comprising perovskite type metal oxide such as BST film, BaTiO$_3$ (barium titanate), PbTiO$_3$ (lead titanate), PZT (PbZrXTi1–XO$_3$), PLT (PbLaXTi1–XO$_3$), PLZT or the like in addition to the above-mentioned materials. In this case, it is preferable to use ruthenium or the like for the lower electrode 24a. It is preferable that each plate electrode 24c is formed by depositing a ruthenium, titanium nitride, and tungsten films on each capacity insulative film 24b. The tungsten film constituting each plate electrode 24c has a function to lower contact resistance between each plate electrode 24c and each upper layer wiring. And, the titanium nitride film has a function to prevent resistance from being increased by dispersion of gas (oxygen or hydrogen) from the capacity insulative film 24b to the tungsten film. And, in this case, an explanation has been made of the case where the information storage capacity element 24 is of a crown type. But, the information storage capacity element 24 is not limited to this only, and may be variously be changed, for example, be of a fin type.

By the steps described heretofore, the information storage capacity element 24 is completed, and the DRAM memory cell constituted by the memory cell selecting MIS●FETQs and the information storage capacity element 24 serially connected thereto is substantially completed. Thereafter, about two layer wirings between which an interlayer insulative film is put are formed at an upper portion of the information storage capacity element 24, and a passivasion film is formed on an upper portion of the uppermost layer wiring. But, the about two layer wiring and the interlayer insulative film are not illustrated.

Next, an exposure technique used in the manufacturing process of the above-mentioned DRAM described in the present embodiment will be explained.

Figure 38:
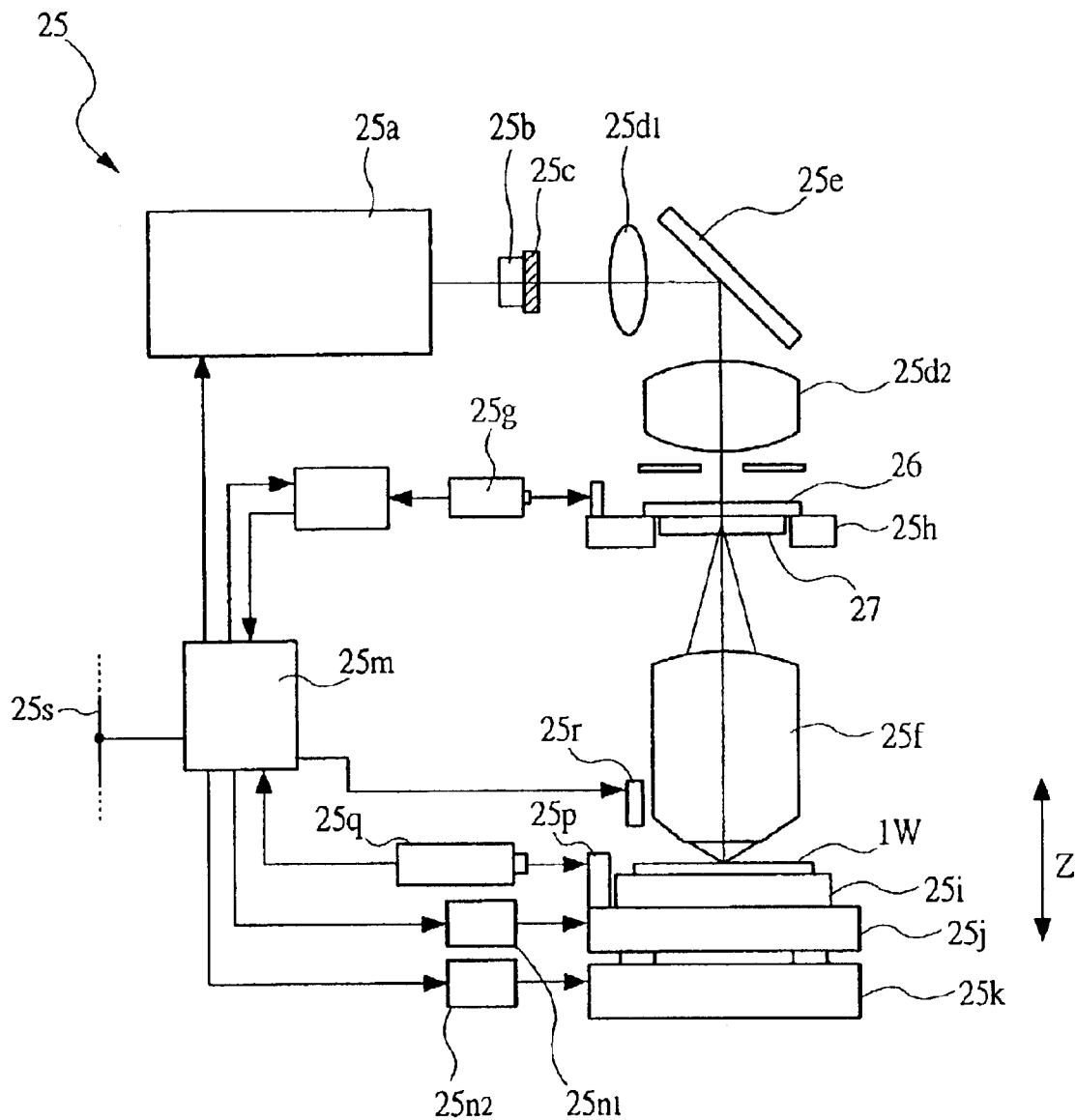
FIG. 38 is an explanatory view of an exposure apparatus used in the manufacturing process of the semiconductor integrated circuit device that is one embodiment of the present invention.

First, FIG. 38 shows one example of an exposure apparatus used in multiple exposure treatment described in the present embodiment. An exposure apparatus 25 is a scanning type reduction projection exposure apparatus (also called scanner hereinafter), for example, having reduction ratio of 4:1. Exposure conditions of the exposure apparatus 25 are as follows, for example. That is, for example, KrF excimer laser light (exposure wavelength $\lambda$=248 nm) is used as exposure light, and these exposure conditions is the number of aperture NA of optical lens being equal to 0.68 (NA=0.68), and in order to obtain higher phase shift effect, coherence ($\delta$; sigma) value=0.3 which is an illumination condition for improving interference of the exposure light. However, the exposure conditions of the exposure light is not limited to the above-described conditions, and may be changed variously. For example, ArF excimer laser having a wavelength of 193 nm or $F_2$ laser having a wavelength of 157 nm may also be used.

Light emitted from an exposure light source 25a illuminates a mask 26 through a fly-eye lens 25b, an aperture 25c, capacitor lens 25d1 and 25d2, and a mirror 25e. The coherence of the optical conditions was adjusted by changing an opening size of the aperture 25c. A pellicle 27 is provided on the mask 26 for preventing pattern-transfer badness or the like which is caused by foreign matter attached thereon. A mask pattern formed on the mask 26 is projected through a projection lens 25f onto a wafer 1W (substrate 1) which is a sample substrate. The mask 26 is put on a mask stage 25h controlled by a mask position control means 25g, and a center of the mask stage 25h precisely positions an optical axis of the projection lens 25f.

The wafer 1W is vacuum-absorbed on a wafer stage 25i. The wafer stage 25i is placed on a Z-stage 25j which is movable in an optical axis direction of the projection lens 25f, i.e., in a Z direction, and is further placed on an XY stage 25k. The Z stage 25j and the XY stage 25k are respectively driven by driving means 25n1 and 25n2 in accordance with control commands given by a main control system 25m, and thereby can move to desired exposure positions. Such positions are precisely monitored by a laser measuring apparatus 25q as positions of a mirror 25p fitted to the Z stage 25j. And, an on-surface position of the wafer 1W (substrate 1) is measured by focus position detecting means that a normal exposure apparatus has. Driving the Z stage 25j in accordance with results of the measurement can make the surface of the wafer 1W coincide with an image forming surface of the projection lens 25f.

In the case where a circuit pattern on the mask 26 is superposed on another circuit pattern formed on the wafer 1W and then is exposed, positions of the mark pattern formed on the wafer 1W are detected by using an alignment detecting optical system 25r, and the wafer is positioned in accordance with the detected results and is superposed and transferred. The main control system 25m is electrically connected to a network apparatus 25s, and can remote-monitor or the like a state of the exposure apparatus 25.

Figure 39:
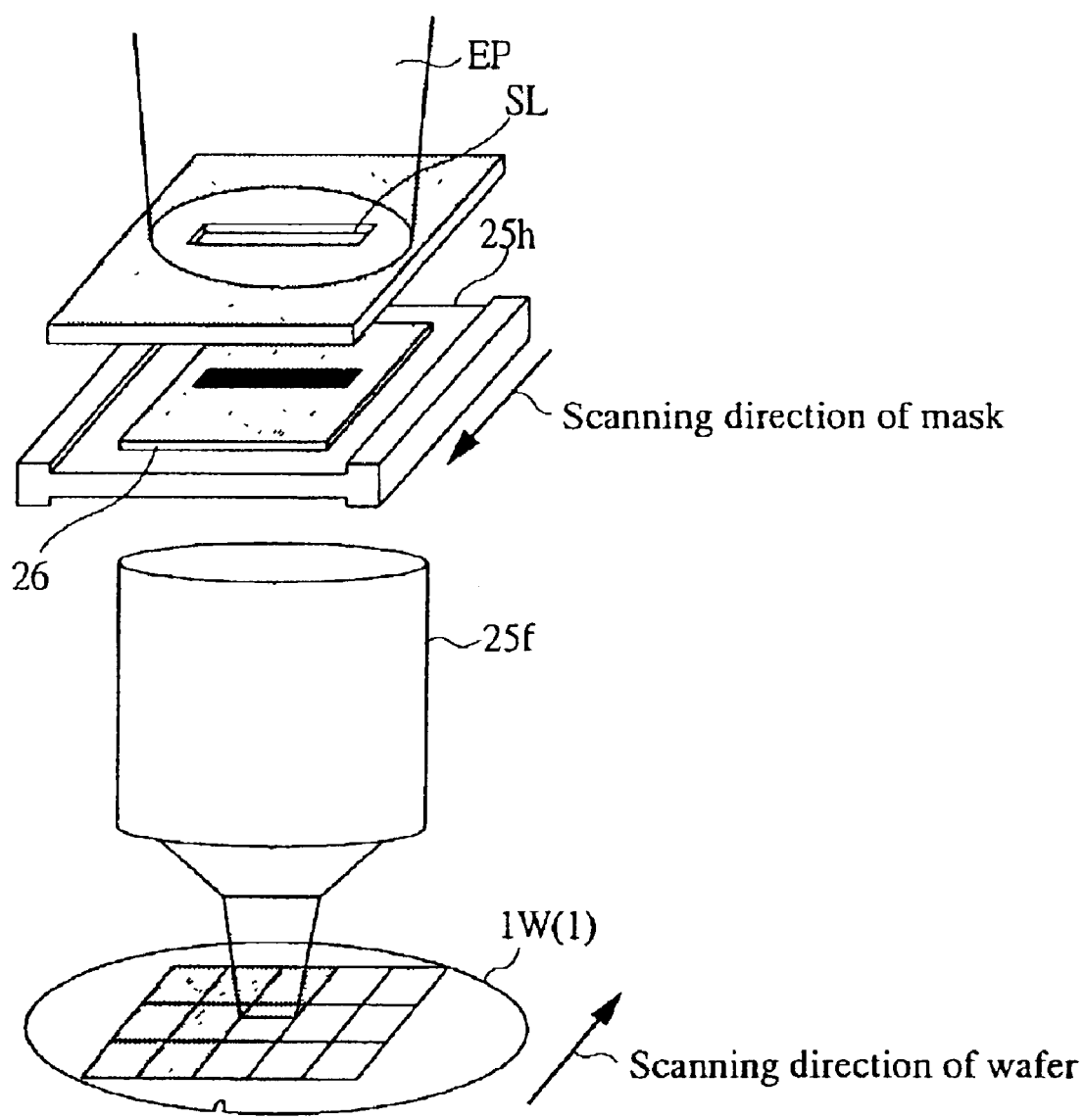
FIG. 39 is a view schematically showing exposure operation of the exposure apparatus n shown in FIG. 38.

FIG. 39 is a view schematically showing exposure operation of the above-mentioned exposure apparatus 1. Since a relationship between the mask 26 and the wafer 1W is mirror-symmetric, a scanning direction of the mask 26 and a scanning direction of the wafer 1W are opposite to each other during exposure treatment. The mask 26 disposed on the mask stage 25h and the wafer 1W disposed on the wafer stage 25i are precisely synchronized with each other at a predetermined driving ratio and are scan-driven. Since the mainstream of the reduction ratio of the scanner is 4:1, when a driving distance of the wafer 1W is 1, a driving distance of the mask 26 becomes 4. Since a slit-like exposure region formed by pass of an exposure light EP through a slit SL is scanned on the mask 26 in accordance with scanning operation of the mask 26, a mask pattern on the mask 26 is exposed and transferred onto a main surface of the wafer 1W (this is an explanation of the above-mentioned scanning exposure.).

However, in the case where the mask pattern is transferred onto the substrate through an image forming optical system, shape deterioration of the transfer pattern, transfer position shift (deviation) and the like are affected by aberration which is an error of an optical system. The aberration of the image forming optical system exists and is distributed within an exposure filed. This amount of aberration can be expressed by a Zernike aberration function, and a size of each aberration component thereof corresponds to a coefficient of each term. It is known that, among the aberration components, a Trefoil aberration constituted by a tertiary and quintic coma aberrations results from the shape deterioration or the positional deviation of the transferred pattern.

In the case of the above-mentioned scanner, for example, when a pattern is transferred by scanning in a wide (short) direction of the above-mentioned slit-like exposure region, the lens aberration is basically distributed only in a longitudinal direction of the slit-like exposure region. Therefore, in the case of disposing a plurality of patterns along the wide direction (i.e., in a scanning direction) of the above-mentioned slit-like exposure region on the mask 26 and by performing multiple exposure of this, each amount of lens aberration by which each pattern is affected becomes the same between patterns transferred to the same position on the substrate. That is, if the transfer patterns are the same, the transfer pattern position caused by aberration is the same relative to the scanning direction. Therefore, the shape deterioration and positional deviation and the like as described above can be reduced or eliminated.

The transfer position shift amount of each transfer pattern changes to depend not only on the aberration amount but also the pattern arrangement. For example, the transfer position shift amount changes to depend on each arrangement pitch, but the shift amount in the scanner is linearly distributed relative to the longitudinal direction of the slit-like exposure region. Therefore, since each position of the mask pattern may be linearly corrected, the correction thereof is easier than a stepper.

In the case of the scanner, the maximum exposure field becomes greater, for example, 25×33 mm in size in comparison with the stepper whose size is 22×22 mm, and there is thereby the advantage of disposition of a greater semiconductor chip onto one mask 26. By this, a size of each maximum chip for a double exposure capable of being disposed on one mask 26 can be enlarged, for example, to 25×16.5 mm which is greater than 22×11 mm of a sequentially moving type reduction projection exposure apparatus (called stepper hereinafter).

In FIGS. 38 and 39, only portions necessary for explaining functions of the exposure apparatus have shown, and other portions necessary for using a normal exposure apparatus (scanner or stepper) are similar within a normal range used. And, the technical idea of the present invention can be applied to an exposure technique using the stepper. In the case of the stepper, an exposure chip, for example, of 22×22 mm is once exposed to transfer the mask pattern onto the substrate. However, since the aberration is distributed in this exposure chip and exists thereon, if the stepper is used, the transfer pattern shape is varied as depending on the position thereof in the exposure chip, or the transfer pattern position is transferred so as to deviate from ideal position having no aberration. For example, in the case where two kinds of mask patterns are disposed on the same mask and are superposed and multiple-exposed, since the patterns to be multiple-exposed on the substrate have aberration amount different from each other, the shift amount of each transfer pattern position is also different at transference of each pattern onto the substrate. Since this results in difference of the transfer position shift amount between respective patterns, it is likely that relatively superposed deviation between patterns of two kinds is caused due to effects of the position shift.

In the case of the stepper, since the aberration amount is two-dimensionally distributed in the exposure chip, correction of the transfer pattern position on the mask becomes complicated in order to correct the transfer pattern position shift. Further, since mask patterns for two shots are disposed on the same mask substrate, throughput derived from restriction of chip size capable of being exposed and increase of number of exposure shots per substrate may be reduced. Further, in the case of use of two masks, the amount of aberration that each pattern to be multiple-transferred on the substrate is affected is the same, but since the masks are replaced and multiple-exposed on the same substrate as described above, throughput may be reduced. By taking the above description into consideration, use of the scanner can perform double exposure treatment easier and more precisely.

Next, the mask used in the present embodiment will be explained.

First, the exposure technique for forming the photoresist patterns used in forming the active regions L (trench isolations 2) shown in FIG. 1 and the like, will be explained.

Figure 40A:
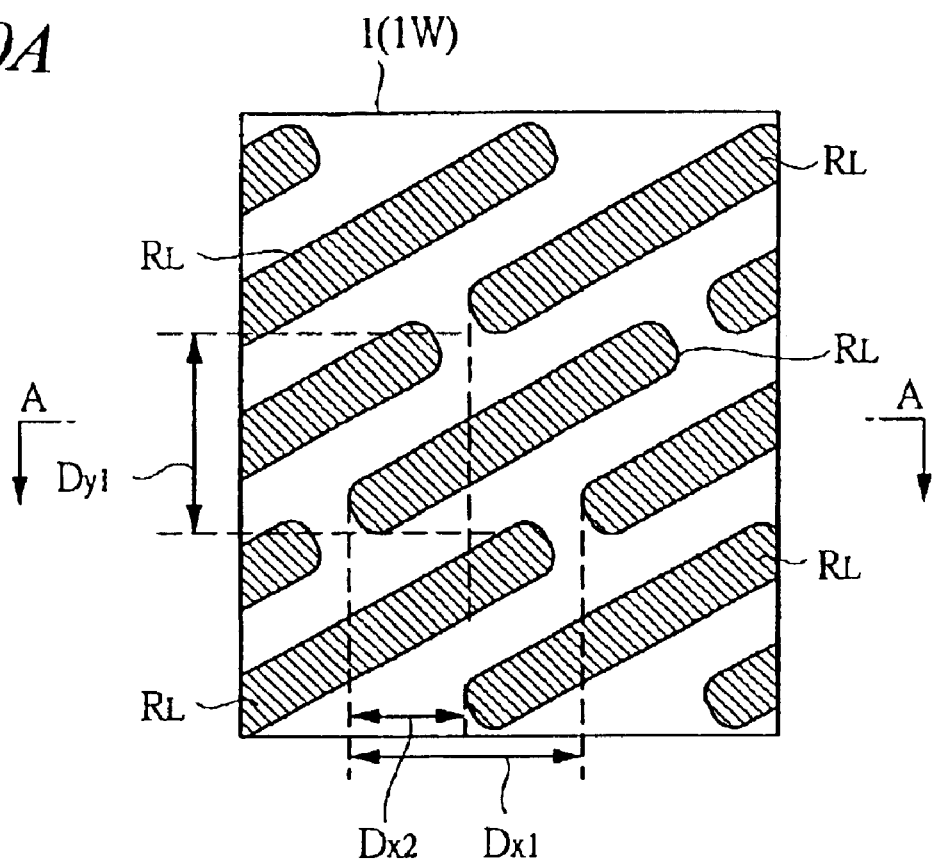
Figure 40B:
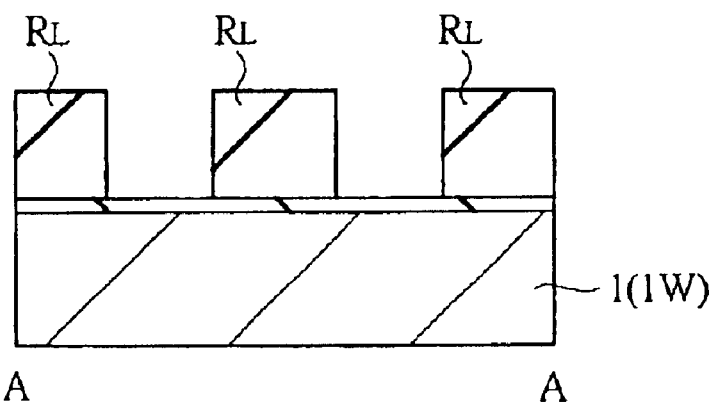
FIG. 40B is a cross-sectional view taken along line A—A of FIG. 40A.

FIG. 40A is a plan view of each essential portion of photoresist patterns RL for forming the active regions L shown in FIG. 1 and the like. FIG. 40B is a cross-sectional view taken along line A—A of FIG. 40A. FIG. 40A is a plan view in which the photoresist patterns RL are hatched for easy understanding the drawing.

Each photoresist pattern RL is required that an adjacent interval D2 between adjacent photoresist patterns RL extending in the longitudinal direction of each active region L is set for the photoresist patterns to be extremely close to each other, for example, at 160 to 180 nm (such an interval as to be able to dispose one word line WL described above). That is, an arrangement pitch of the required pattern is fine. Due to this, in an exposure treatment using a normal mask, because slops of the light intensity become smoothened and a retreating amount of each photoresist pattern becomes great after the development, and sufficient light intensity can not be obtained from the longitudinal direction of each pattern, it is extremely difficult to form each pattern under such a state as to keep the above-described fine arrangement pitch. This results in requirement for using the Levenson type phase shift mask as a mask for transferring each photoresist pattern RL.

As performed in a technique of a normal Levenson type phase shift mask, consider the case where each photoresist pattern RL is transferred onto a negative type photoresist film by using the Levenson type phase shift mask. As described above, use of the Levenson type phase shift mask requires that a phase difference of each light that permeates adjacent light permeating regions is set at 180 degrees. However, in the layout of the photoresist patterns RL, since three patterns or more among the light permeating regions for transferring this are respectively arranged close at a distance required to dispose the-phase shifters, the phase shifters can be arranged such that each transferring light has a phase difference of 180 degrees between all the light permeation regions close thereto. That is, there certainly occurs the case that each of at lease one pair among the transferring lights passing through the light permeation regions close thereto, has the same phase.

Now, in the present embodiment, when each photoresist pattern RL for forming a pattern of each active region L shown in FIG. 1 is formed, a positive type photoresist film is used as a photoresist film and a multiple exposure method in which a plurality of mask patterns are superposed and exposed on the same position of the positive type photoresist film on the wafer 1W (substrate 1) is employed. Each active region L is separated into a band-like pattern extending diagonally and a hole pattern which cuts predetermined portions thereof.

Figure 41A:
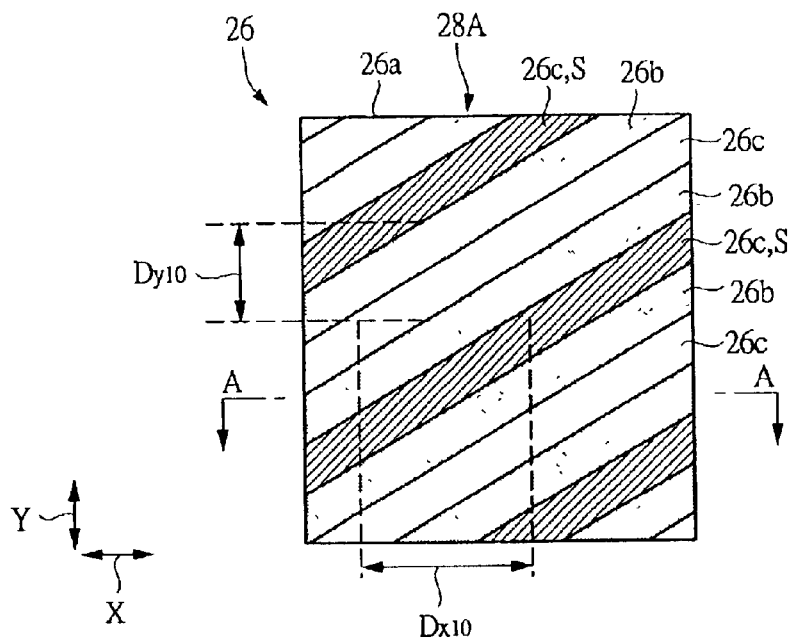
FIG. 41A is a plan view showing an essential portion of a first mask in a photomask used for transferring the photoresist pattern shown in FIG. 40A.
Figure 41B:
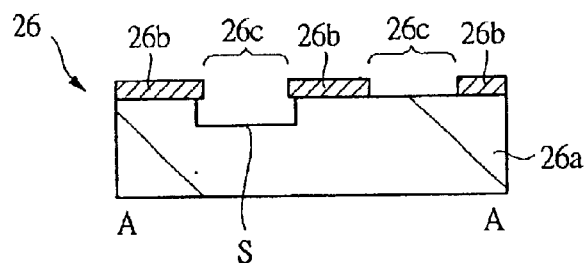
FIG. 41B is a cross-sectional view taken along line A—A of FIG. 41A.
Figure 41C:
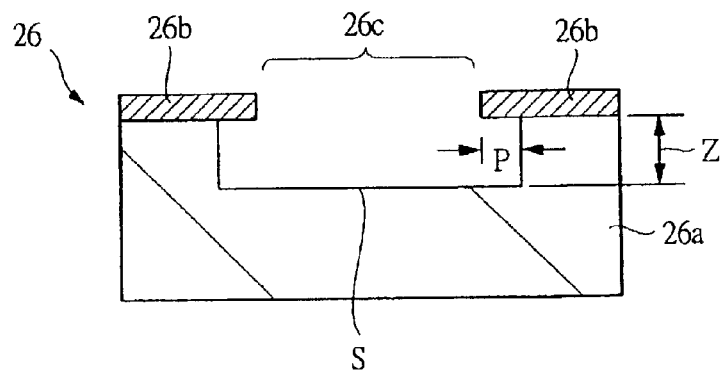
FIG. 41C is an enlarged cross-sectional view of a phase shifter portion shown in FIG. 41B.

FIGS. 41A to 41C show a first mask pattern 28A of the mask 26 for forming a photoresist pattern for forming each active region described above. FIG. 41A is a plan view of an essential portion thereof, FIG. 41B is a cross-sectional view taken along line A—A of FIG. 41A, and FIG. 41C is an enlarged cross-sectional view of a phase shifter of FIG. 41B.

A mask substrate 26a constituting the mask 26 of FIGS. 41A to 41C comprises, for example, transparent synthetic quartz glass, and a mask pattern 28A shown in FIG. 40A is formed on a main surface of the substrate 26a. This mask pattern 28A is a pattern for exposing a line/space pattern extending diagonally relative to the XY direction, and has band-shaped light shield patterns 26b extending diagonally (inclination of about 28 degrees in the X direction, for example) in the XY direction, and light transfer pattern s 26c. Each light shield pattern 26b and each light transfer pattern 26c are alternately arranged along a wide (short) direction of the pattern. A phase shifter S is disposed in one of the light transfer pattern s 26c and 26c which are disposed in both sides of each light shield pattern 26b and which are adjacent to each other. Due to this, lights that have passed through the permeation patterns 26c and 26c adjacent to each other have a phase difference of 180 degrees different from each other. That is, each light is inverted at 180 degrees. A dimension Dx10 is about 520 nm, for example (converted to wafer size). A dimension Dy10 is about 280 nm, for example (converted to wafer size).

Each light shield pattern 26b constituting the mask pattern 28A is formed of a light shield film such as chromium, chromium oxide or a laminated film thereof. Each light transfer pattern 26c is formed after the light shield film is removed. As shown in FIGS. 41B and 41C, the phase shifter S is, for example, a trench shifter. That is, the phase shifter S is formed by digging a trench having a predetermined depth (satisfying the equation of the above-mentioned Z) in the mask substrate 26a. In the above example, the depth Z of the phase shifter S is, for example, about 245 nm by use of the KrF having an exposure wavelength of about 248 nm.

Here, a case in which the trench shifter is the above-mentioned fine visor type trench shifter is shown. That is, the mask substrate 26a is overhung in the wide direction of the trench in a periphery of the phase shifter S (in a cross-sectional direction having narrow width). As a result, each light shield pattern 26b to face the phase shifter S has a structure of having an end thereof projecting like a visor. An optimal value P about length of the visor projecting from each light shield pattern 26b depends on pattern pitch thereof, optical conditions and the like, and, in the case of using a mask for a scanner having a reduction ratio of 4:1, the optical value thereof is about 0.15 $\mu$m. Since the visor structure of this results in restriction of waveguide effect of light, light intensity of the transferring light can be reduced by effects caused from side walls of the phase shifter S. Therefore, when multiple-exposure treatment is performed by using the mask 26, it is possible to enhance dimensional precision of each pattern to be transferred onto the wafer 1W.

Figure 42:
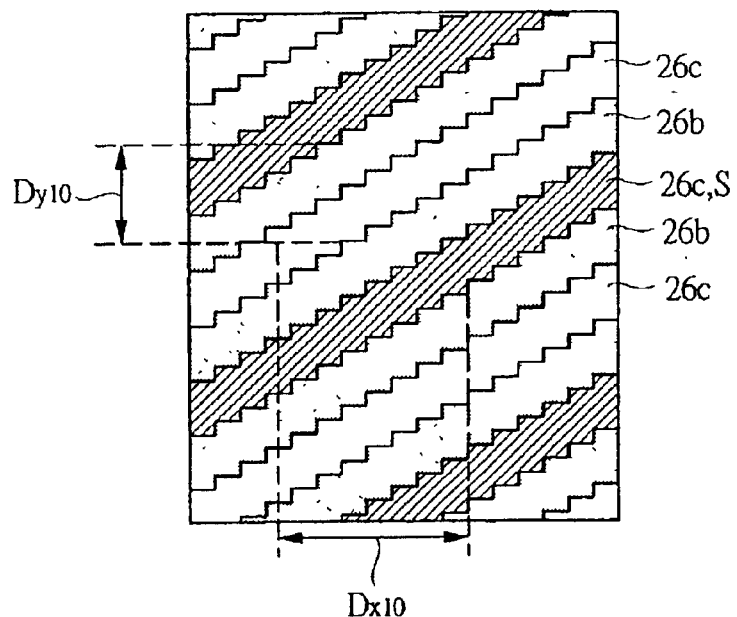
FIG. 42 is a plan view of an electron beam drawing data of the mask pattern shown in FIG. 41.
Figure 43:
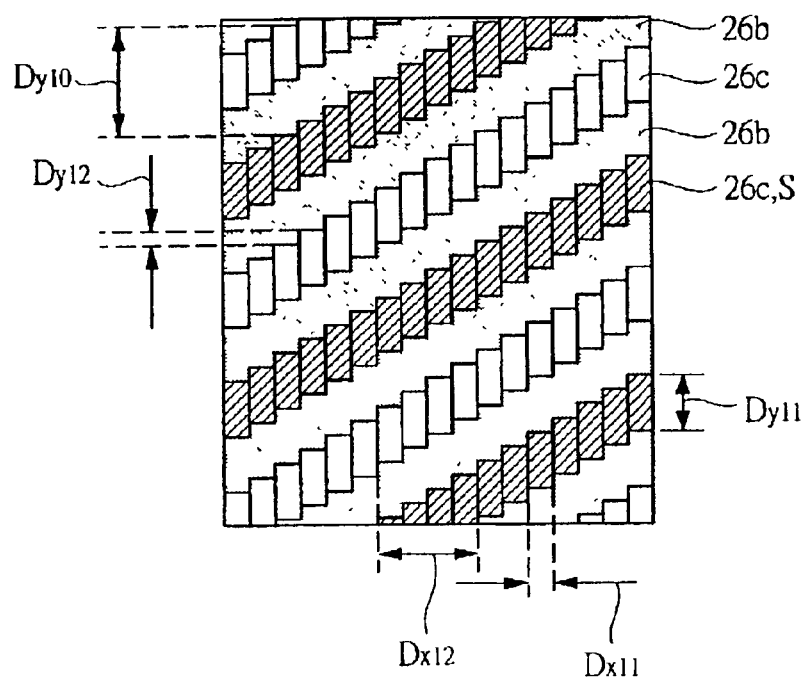
FIG. 43 is a plan view showing an example of a mask pattern layout being set like stairs and having a size included within a range capable of obtaining satisfactory resolution characteristics in wafer process.

The mask pattern 28A shown in FIG. 41 is a line/space pattern inclining about 28 degrees in the X direction. Therefore, in the case where this pattern is drawn by electron beam exposure apparatus having a vector-scan type of variable rectangular beams, the inclined pattern is divided into a large number of rectangular-shaped patterns to draw the inclined pattern by approximation. That is, a mask pattern layout shown in FIG. 41A becomes fine step-shaped patterns as schematically shown in FIG. 42 in terms of electron beam drawing data. This has caused a problem of increase of both the number of the electron beam shots during a mask pattern drawing and time necessary for drawing operation. Therefore, regarding the layout of the mask pattern for transferring such inclined patterns, it is preferable to layout the mask pattern such that the number of the exposure shots is reduced in drawing the mask pattern. FIG. 43 shows one example of a mask pattern layout using step-shaped patterns having a size included within such a range as to be able to obtain sufficient resolution during wafer process. In this case, each light transfer pattern 26c is divided into a plurality of fine rectangular patterns, for example, of 65 nm (=Dx11)×135 nm (Dy11), and these rectangular patterns are arranged along the X direction while offsetting 35 nm (=Dy12) from one another in the Y direction. At this time, dimension of the rectangular pattern is 260×540 nm on the mask which is four times greater, but value of this dimension is within dimensional range capable of drawing on shot when the drawing is performed by the electron beam exposure apparatus. A deviating amount Dy12=35 nm relative to the Y direction is set to a value multiplying the pitch Dy10=280 nm by ⅛, and a size 65 nm of a rectangular extending in the X direction is a value multiplying the pitch Dx12=260 nm by ¼. The reason why each cut of the X direction is greater than that of the Y direction is that the cut angle of each inclined pattern is inclined about 28 degrees from the X direction. When a raster scan type electron beam (EB) drawing apparatus is used, since a drawing system thereof is different, the pattern layout may employ patterns having a diagonal direction. And, in a cell projection type EB drawing apparatus, such a method or the like can be used that portions of each inclined pattern are linked together and drawn as a cell configuration. Additionally, it is also possible to draw not only the rectangular-shaped patterns but also the inclined patterns (e.g., triangular-shaped patterns) by using aperture having transmittable opening portions.

Figure 44:
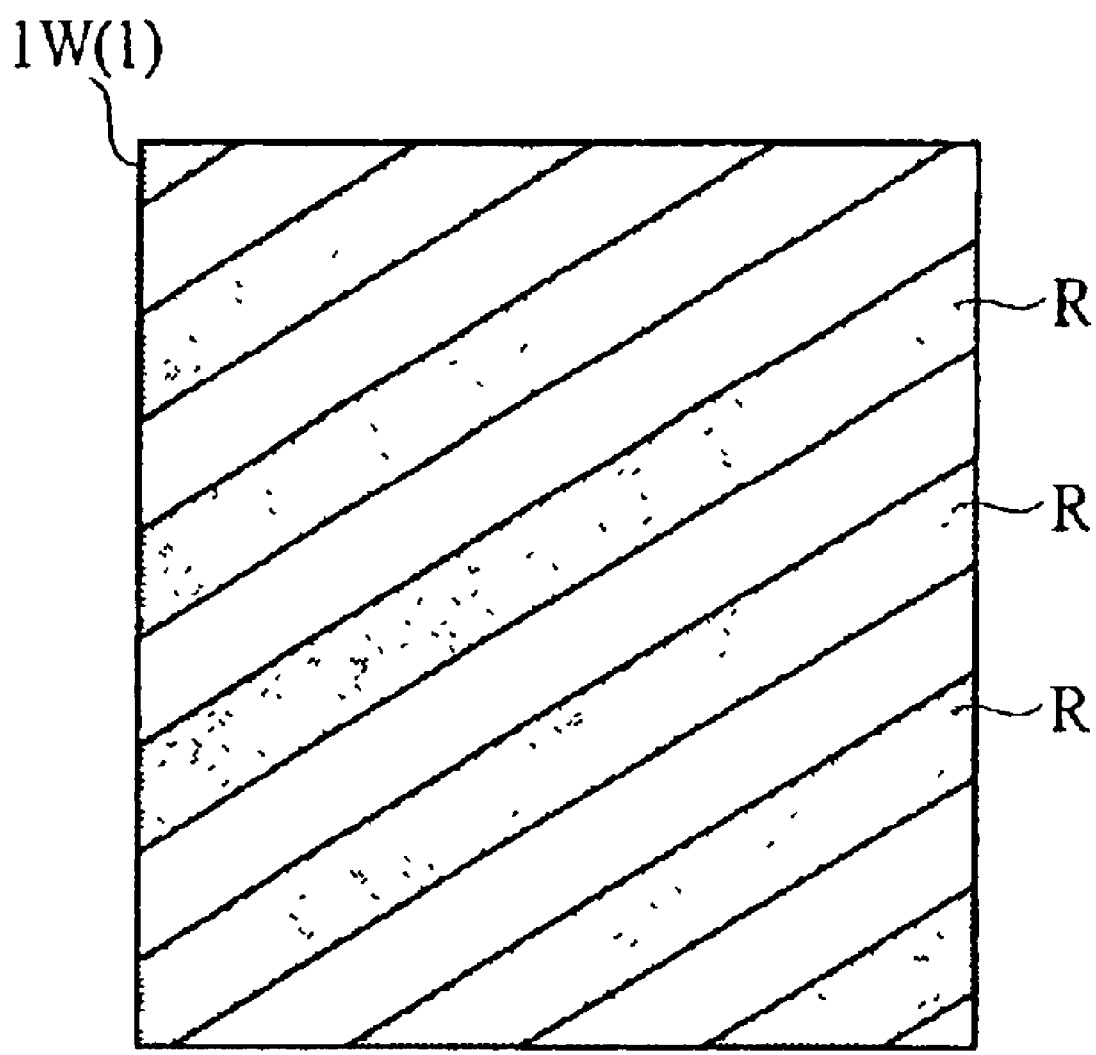
FIG. 44 is a plane view of an essential portion of the photoresist pattern when only the mask pattern shown in FIG. 41 is transferred to a photoresist film.

FIG. 44 schematically shows a case in which only the mask pattern 28A is exposed on a positive type photoresist film. Regions in which exposure light is illuminated are shown as hollow portions. On the other hand, other regions in which the exposure light is not illuminated are shown as hatched portions. Since each photoresist film R is a positive type, if it is developed (in actual case, it is developed after the multiple-exposure), then the exposed regions (hollow regions) are removed. Use of only this mask pattern 28A forms band-shaped photoresist patterns R (i.e., photoresist patterns for forming line patterns) extending in the inclined direction shown in FIG. 44, but can not form island-shaped photoresist pattern. Therefore, by partially removing predetermined portions of the band-shaped photoresist patterns R, it is necessary to prepare a second mask pattern for forming the island-shaped photoresist patterns and to superposition-expose the second mask pattern.

Figure 45A:
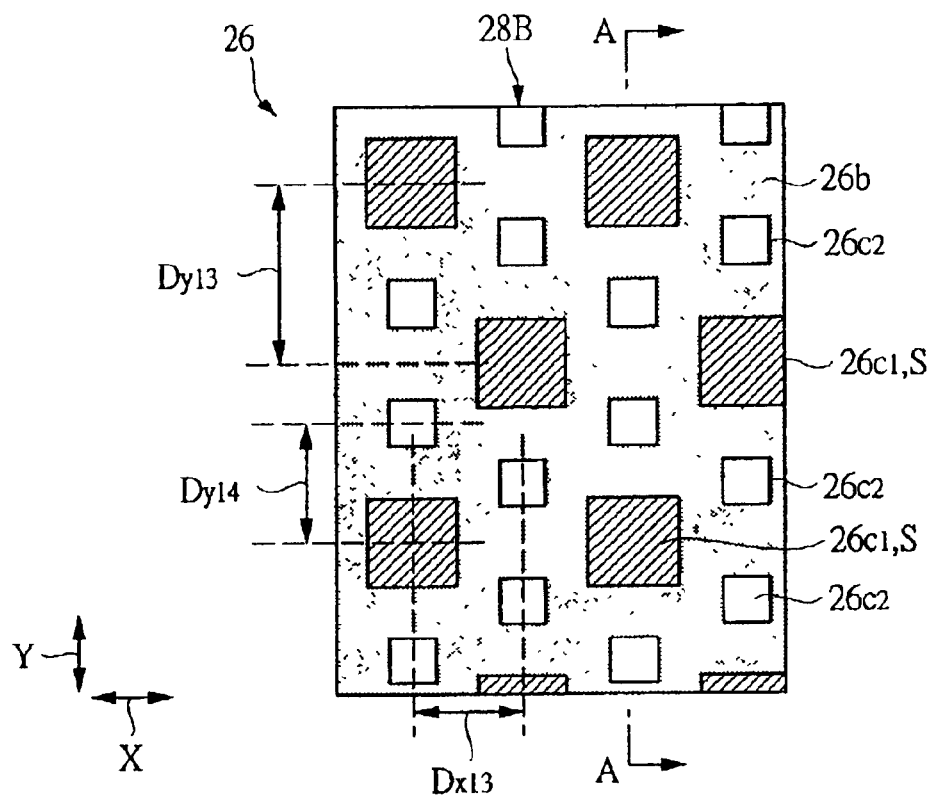
FIG. 45A is a plane view of an essential portion of a second mask pattern in the photomask for transferring the photoresist pattern shown in FIG. 40A.
Figure 45B:
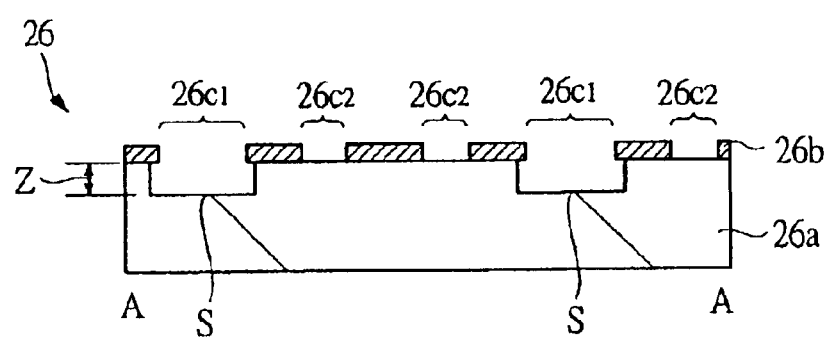
FIG. 45B is a cross-sectional view taken along line A—A of FIG. 45A.

FIGS. 45A and 45B show a second mask pattern 28B of the mask 26 for forming the photoresist patterns for forming the above-mentioned active regions used for superposition-exposure, and FIG. 45A is a plan view of an essential portion of thereof, and FIG. 45B is a cross-sectional view taken along line A—A of FIG. 45A.

The mask pattern 28B formed on a main surface of the mask substrate 26a shown in FIGS. 45A and 45B is a pattern for forming the island-shaped photoresist patterns by exposing a region having an adjacent interval between the adjacent active regions L in the longitudinal direction of each active region L, in each band-shaped photoresist pattern R of FIG. 43, which remains without being exposed in the mask pattern 28A of FIG. 41.

This mask pattern 28B has each main light transfer pattern 26c1 and each auxiliary light transfer pattern 26c2 arranged in peripheral regions thereof. Each main light transfer pattern 26c1 and each auxiliary light transfer pattern 26c2 are formed like a flat-surface square. A plane dimension of each main light transfer pattern 26c1 is, for example, about 200×200 nm (converted to wafer size). And a plane dimension of each auxiliary light transfer pattern 26c2 is relatively smaller than that of the main light transfer pattern 26c1, and has such no size that as to be transferred onto the photoresist film, and is, for example, about 100×100 nm (converted to wafer size). Here, the phase shifters S are disposed on the main light transfer pattern s 26c1, respectively. This results in generating of a phase difference of 180 degrees between respective lights having passed through each main light transfer pattern 26c1 and the auxiliary light transfer pattern 26c2. Each phase shifter S is, for example, the above-mentioned fine visor type trench shifter similar to the above-mentioned mask pattern 28A. A depth of the trench of the phase shifter S is the same as that of the trench of the phase shifter S of the above-mentioned mask pattern 28A.

In the second mask pattern 28B, a pitch Dx13 between the main light transfer pattern s 26c1 and 26c1 adjacent to each other in the X direction (a second direction) is a minimum approach pitch of the pattern, and its distance is, for example, about 2×0.33 ($\lambda$/NA) to 2×0.045 ($\lambda$/NA) nm, and is in a range of about 120 to 160 nm on the wafer. Here, a pitch Dx13 between the main light transfer pattern s 26c1 adjacent to each other in the X direction is, for example, about 260 nm (converted to wafer size). An adjacent pitch between the main light transfer pattern s 26c1 and 26c1 adjacent to each other in the Y direction (a first direction) is longer than an adjacent pitch between the main light transfer pattern s 26c1 and 26c1 adjacent to each other in the X direction. Here, a pitch Dy13 between the main light transfer pattern s 26c1 and 26c1 adjacent to each other in the Y direction is, for example, about 420 nm (converted to wafer size). A pitch Dy14 between each main light transfer pattern 26c1 and each auxiliary light transfer pattern 26c2 adjacent to each other in the Y direction is, for example, about 280 nm (converted to wafer size).

However, generally, for designing the mask pattern 28B, only the main light transfer pattern is disposed, and a phase shifter might be disposed in only one of the adjacent main light transfer pattern s. But, in the case of the mask pattern 28B, since the phase shifters are closely disposed in the Y direction, a distance of each disposing arrangement requiring to dispose each phase shifter is to narrow to dispose each phase shifter in a normal manner. Therefore, in the present embodiment, the auxiliary light transfer pattern s are disposed around each main light transfer pattern, and the light which has passed through each auxiliary light transfer pattern is reversed to an angle of 180 degrees, so that the resolution thereof can be enhanced. In this case, since merely disposition of the auxiliary light transfer pattern s causes inconvenience, a method of illuminating the inconvenience is added. A method of arranging the auxiliary light transfer pattern s is explained below.

Figure 46A:
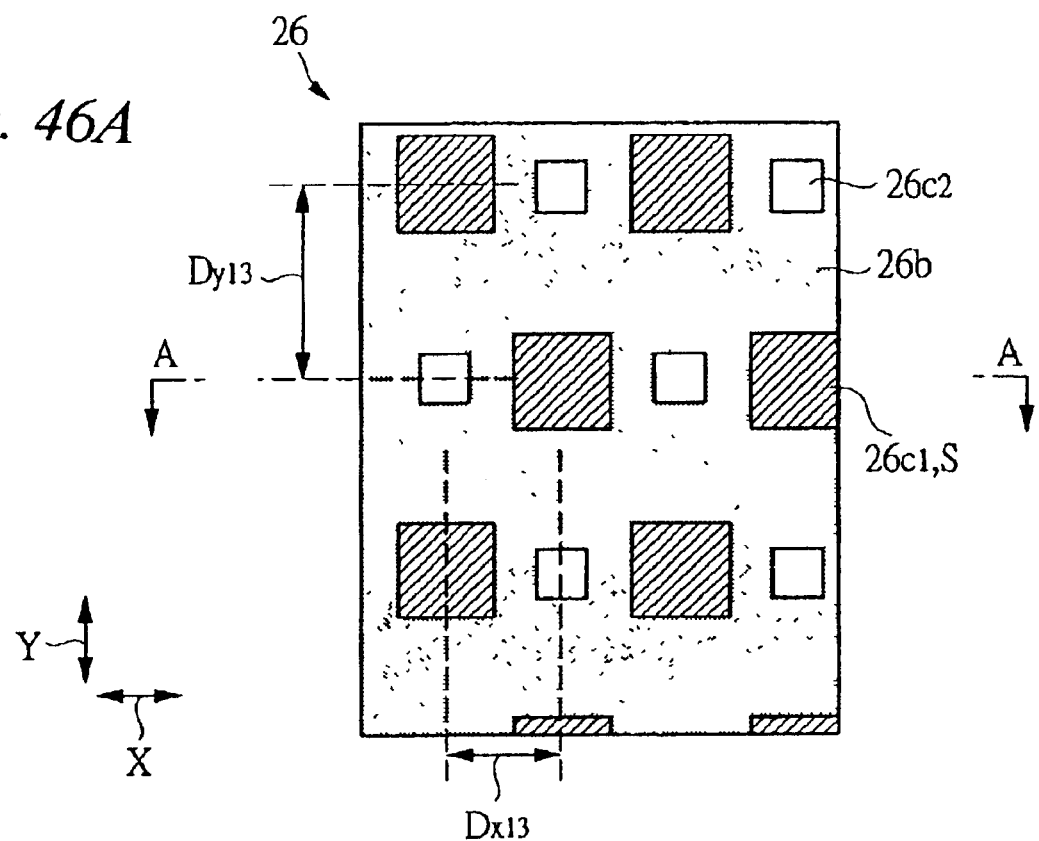
FIG. 46A is a plane view of an essential portion of the photomask that the present inventors have studied.
Figure 46B:
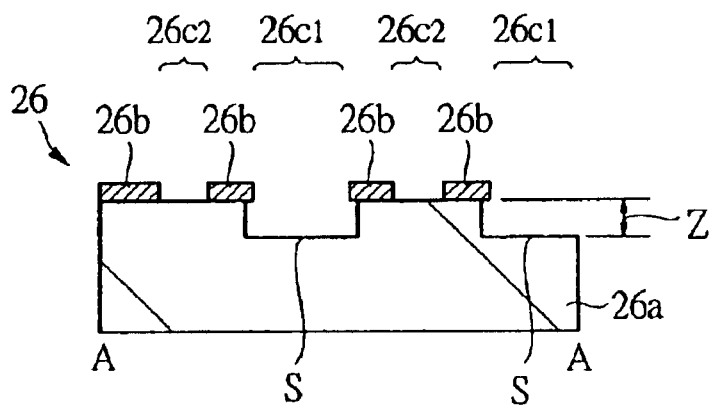
FIG. 46B is a cross-sectional view taken along line A—A of FIG. 46A.

As an arrangement method of the auxiliary patterns, as shown in FIGS. 46A to 46B, there is a method for disposing each auxiliary pattern in an intermediate position between the main light transfer pattern s 26c1 in the respective X and Y directions. In this case, since a distance between each main light transfer pattern 26c1 and each auxiliary light transfer pattern 26c2 is slightly different, the phase shift effect is also different in the X direction and the Y direction. Therefore, the optical image projected on the wafer 1W (substrate 1) becomes oval in shape, and there is an adverse possibility that a portion of each photoresist pattern RL located below and above a portion between adjacent regions extending in the longitudinal direction of each photoresist pattern RL shown in FIG. 40 becomes thinner due to effects of light which passed through each main light transfer pattern 26c1 of the second mask pattern 28B.

Figure 47A:
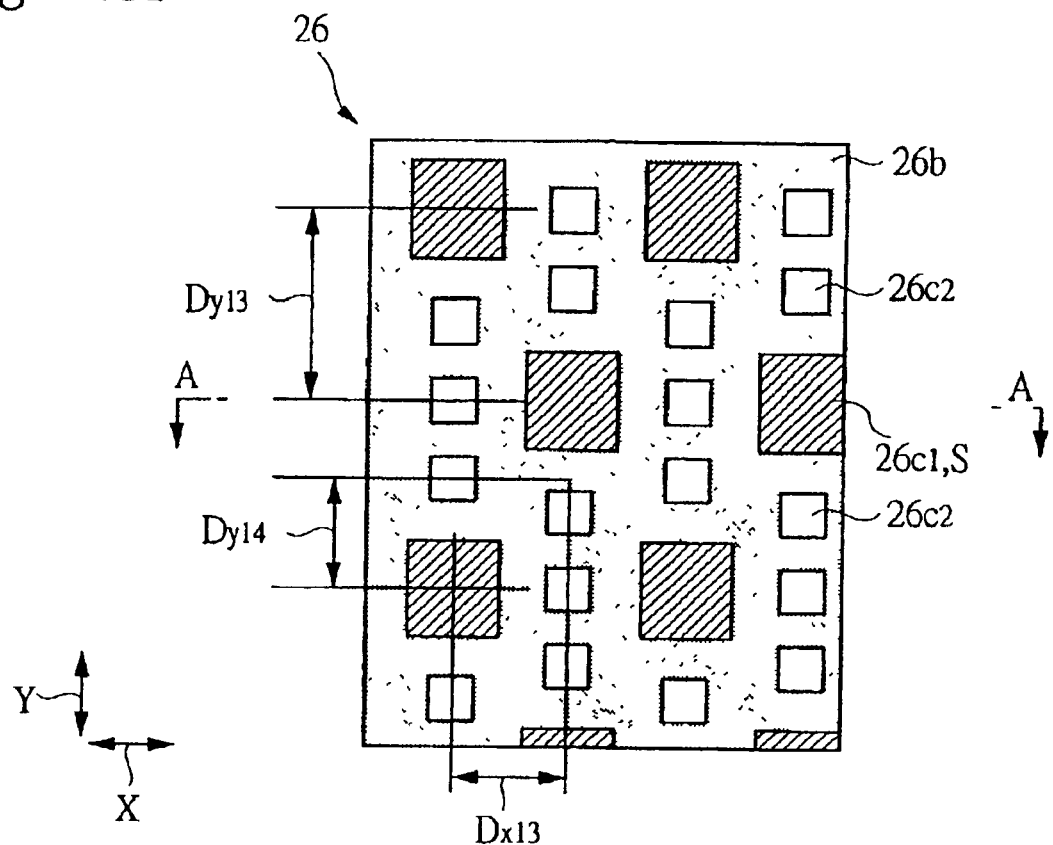
FIG. 47A is a plane view of an essential portion of the photomask that the inventors have studied.
Figure 47B:
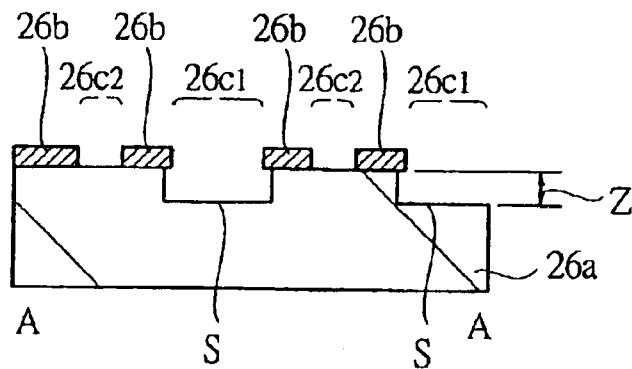
FIG. 47B is a cross-sectional view taken along line A—A of FIG. 47A.

Further, as shown in FIG. 47, there is another method to layout such that four auxiliary light transfer pattern s 26c2 are arranged in above, below, right and left sides of each main light transfer pattern 26c1 at equal distances therefrom. In this case, this is a layout in which each auxiliary light transfer pattern 26c2 is disposed around the main light transfer pattern 26c1 having a pitch of 140 nm in the Y direction. However, in this case, since the plane dimension of each auxiliary light transfer pattern 26c2 is set to a rectangular pattern of 100×100 nm (converted to wafer size), a space between the auxiliary light transfer pattern s 26c2 is as extremely small as 40 nm (converted to wafer size). Therefore, it is very difficult to produce the mask.

Now, as shown in FIGS. 45A and 45B, in the mask pattern 28B of the present embodiment, the auxiliary light transfer pattern s 26c2 are disposed such that a distance from a center of each main light transfer pattern 26c1 to that of each auxiliary light transfer pattern 26c2 thereabout becomes substantially equal. That is, the auxiliary light transfer pattern s 26c2 are disposed such that the center of each auxiliary light transfer pattern 26c2 is located at a corner of a hexagon whose center coincides with the center of each main light transfer pattern 26c1. The respective auxiliary light transfer pattern s 26c2 around each main light transfer pattern 26c1 are disposed symmetrically in right-left and up-down sides relative to both the X and Y axes which passing the center of each main light transfer pattern 26c1.

From another point of view, this can be seen as follows. That is, each auxiliary light transfer pattern 26c2 is not disposed on the Y axis (axis based on the first direction) passing through the center of each main light transfer pattern 26c1, but is not disposed on an X axis (axis base on the second direction) passing through the center of each main light transfer pattern 26c1, and is disposed at such a position as to be separated in upper and lower sides from the X axis relative to the Y direction and to become symmetrical by regarding the X axis as a center line.

Figure 48:
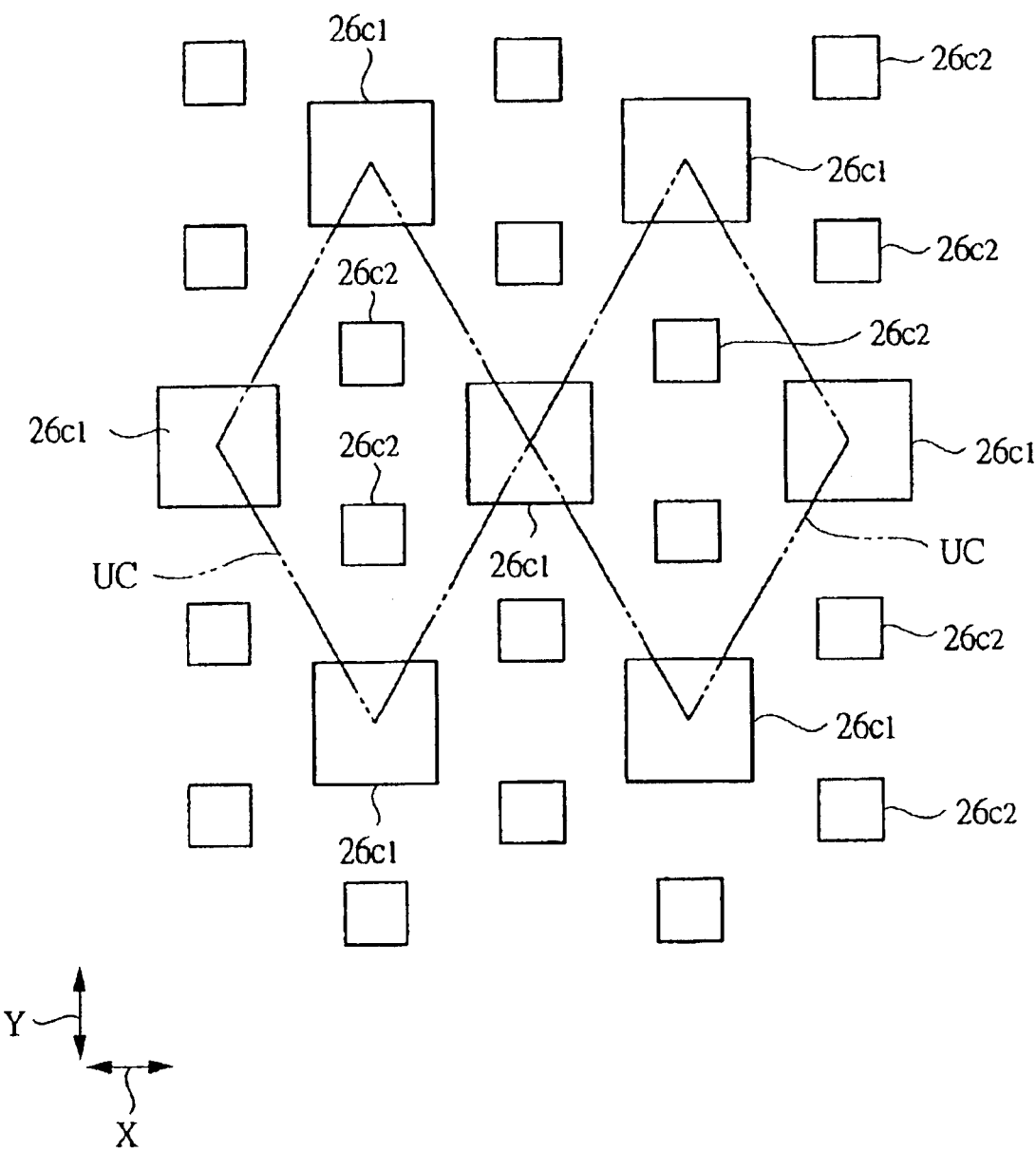
FIG. 48 is an explanatory view of the mask pattern shown in FIG. 45.

Further, from still another point of view, this can be seen as follows. That is, as shown at two dots and dash line of FIG. 48, such unit cells UC as to contain two auxiliary light transfer pattern s 26c2 can be imaged. The two auxiliary light transfer pattern s 26c2 in each unit cell UC are disposed on the Y axis passing through each center of the two main light transfer pattern s 26c1 and 26c1 arranged along the Y direction. And, the two auxiliary light transfer pattern s 26c2 are not disposed on the X axis passing through the center of each of the two main light transfer pattern s 26c1 and 26c1, but are disposed to become symmetric by regarding the X axis as a center line.

In the layout of such a mask pattern 28B, a projection optical image on the wafer 1W (substrate 1) relative to each main light transfer pattern 26c1 can be made substantially circular. And, in the upper and lower positions of a region between adjacent active regions L extending in the longitudinal direction of FIG. 1, deformation of the photoresist pattern can be suppressed to a small degree.

Figure 49:
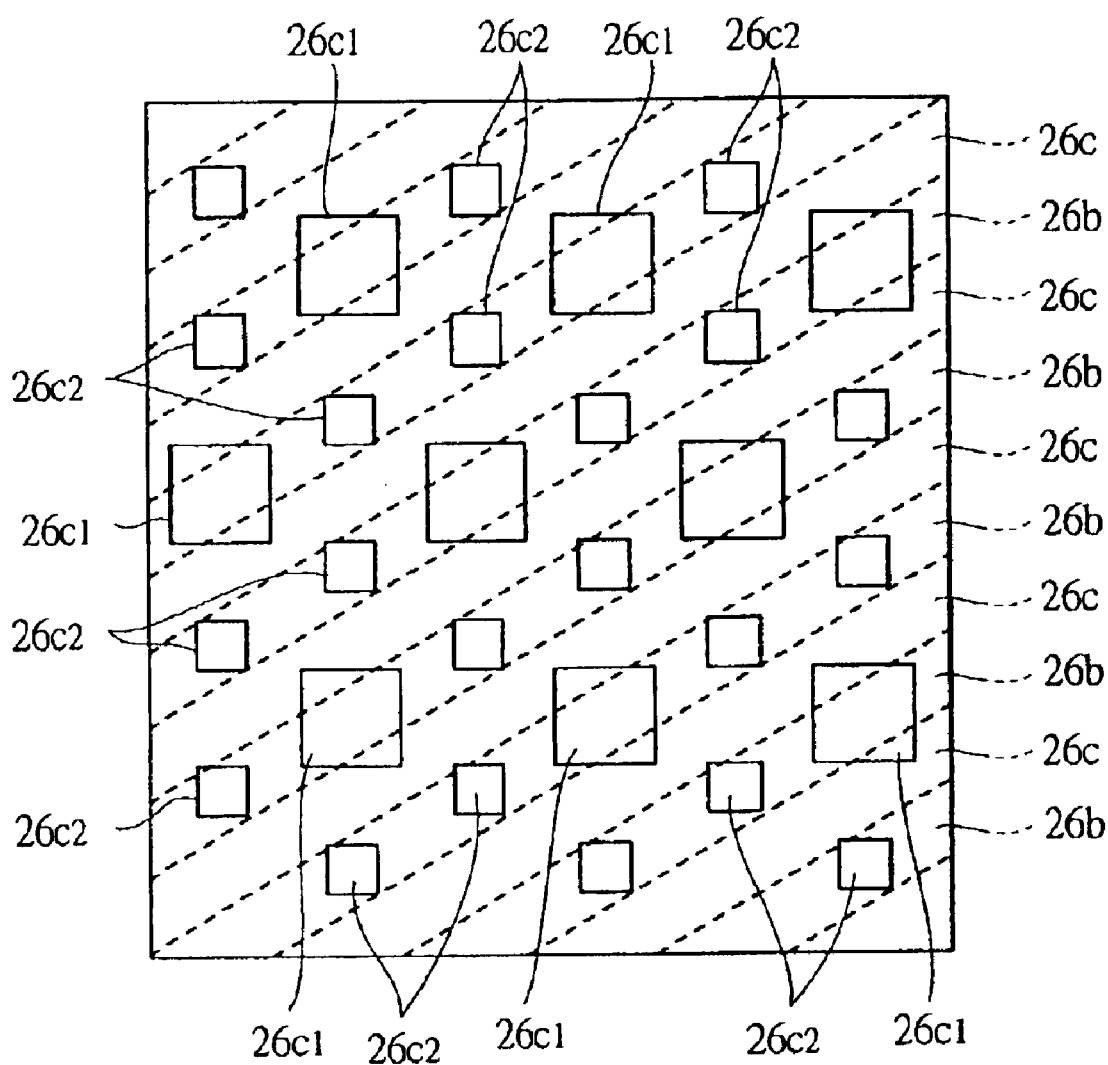
FIG. 49 is an explanatory view showing a state in which the mask pattern shown in FIG. 45 is superposed on the mask pattern shown in FIG. 41.

FIG. 49 shows a state in which data of the first mask pattern 28A and data of the second mask pattern 28B are superposed. One dot lines show the first mask pattern 28A, and solid lines show the second mask pattern 28B. The main light transfer pattern s 26c1 and the auxiliary light transfer pattern s 26c2 of the second mask pattern 28B are arranged on the light shield patterns 26b of the first mask pattern 28A.

Next, a technique concerning the multiple-exposure treatment will be explained.

Figure 50:
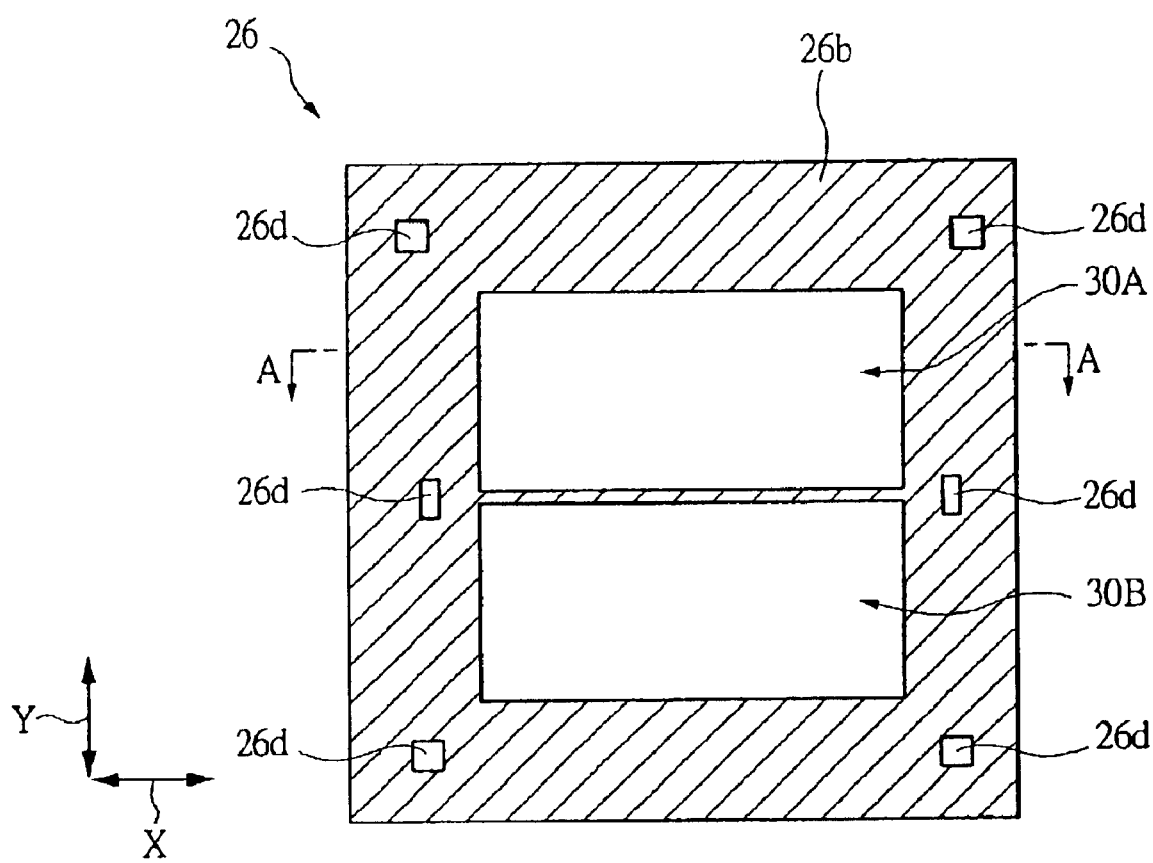
FIG. 50 is a plan view showing the entire photomask used in the manufacturing process of the semiconductor integrated circuit device that is the present embodiment.

First, in the present embodiment, FIG. 50 shows a plan view of the entire mask for transferring each active region. Here, a case in which two transfer regions 30A and 30B, for example, are disposed on a main surface (the same surface) of one mask 26 is illustrated. Each of the transfer regions 30A and 30B is formed, for example, like a plane rectangular, and is disposed such that long sides thereof are in parallel to each other at a predetermined distance therebetween. Each of the transfer regions 30A and 30B corresponds to a region, for example, for transferring one semiconductor chip. This mask production is suitable for such a structure that a plane dimension of the semiconductor chip is small and two semiconductor chip transfer regions can be disposed in one mask.

The first mask pattern 38A shown in FIG. 41 is disposed in a memory cell region of the transfer region 30A, and the second mask pattern 38B shown in FIG. 45 is disposed in a memory cell region of the transfer region 30B. In the multiple-exposure treatment, the first mask pattern 28A of the transfer region 30A and the second mask pattern 28B of the transfer region 30B are precisely positioned and transferred onto a positive type photoresist film on the wafer 1W (substrate 1). The longitudinal dimension of each active region L (each photoresist pattern RL) can be optimized by mainly adjusting a dimension of the second mask pattern 28B or exposure amount used during exposure of the second mask pattern 28B on the wafer 1W. Due to this, a desired dimension of each photoresist pattern can be obtained.

Since the mask patterns being outside the memory cell region are not transferred by normal exposure but by the multiple exposure, the mask patterns are disposed in the transfer region 30A. The mask patterns being outside the memory cell region may be transferred by multiple exposure. In the above-mentioned transfer regions 30A and 30B, patterns such as mark patterns used for superposition, mark patterns used for inspecting superposition, and mask patterns used for inspecting electric characteristics which do not constitute an actual integrated circuit, are also included in addition to patterns constituting the actual integrated circuit. In the light shield regions around the transfer regions 30A and 30B, a portion of a mask substrate 26a is exposed, and other light transfer pattern s 26d such as alignment marks and measuring marks and the like are formed. These light transfer pattern s 26d are such regions as to transfer no photoresist film thereon, or to be hidden by masking blades that shield exposure light illuminated at exposure.

Next, a concrete example of the multiple-exposure treatment will be explained. There is a method in which, first, in the state that each pattern of the transfer region 30A is masked (light-shielded) as not exposed, each pattern of the transfer region 30B is exposed on the positive type photoresist film of the main surface of the wafer 1W (substrate 1), and then in the state that each pattern of the transfer region 30B is masked (light shielded) as not exposed, each pattern of the transfer region 30A is superposed on each pattern of the transfer region 30B which has already been transferred (latent-imaged) on the positive type photoresist film of the wafer 1W and exposed.

And, as another method, there is a method in which plane dimensions of the transfer region 30A and the transfer region 30B are set to be equal to each other, the transfer regions 30A and 30B are collectively transferred on the positive type photoresist film of the wafer 1W, and then the mask 26 is moved along the Y direction to the dimension (width) of each Y direction side of the respective transfer regions 30A and 30B, and each pattern is exposed in a state of superposition of the exposure shots on half thereof.

In the former method, the respective transfer regions 30A and 30B can be exposed with optimal exposure amount and under optimal optical condition. On the other hand, in the latter method, since the exposure amount and the optical condition of both the transfer regions 30A and 30B are the same, it is necessary to optimize the mask pattern. But, the latter method is advantageous in terms of throughput in comparison with the former method. Further, since two shots are aligned, there occurs the problem that the alignment precision is lowered.

In the above-mentioned example, a case in which the first and second mask patterns 28A and 28B are disposed on one mask 26 has explained, but the present invention is not limited thereto, and there is a method, for example, in which the multiple-exposure is performed by using two masks. That is, there is a method in which the first and second mask patterns 28A and 28B are disposed on separated masks, respectively, and the multiple-exposure is performed while the masks are exchanged. In this case, since the exposure is performed after the masks are replaced, it is possible to increase the shot size up to the maximum exposure field of the exposure apparatus similarly to the normal exposure. Further, since the exposure condition can be set to be optimal value for each pattern, it is possible to excellently set exposure tolerance or exposure conditions. This method is especially suitable for the case where the plane dimension of the semiconductor chip is large and two semiconductor chip transfer regions can not be disposed on one mask.

After completion of the multiple-exposure treatment, a series of processing such as normal developing processing and cleaning and drying processing is carried out, and thereby the photoresist pattern RL as shown in FIG. 40 is formed.

Figure 51A:
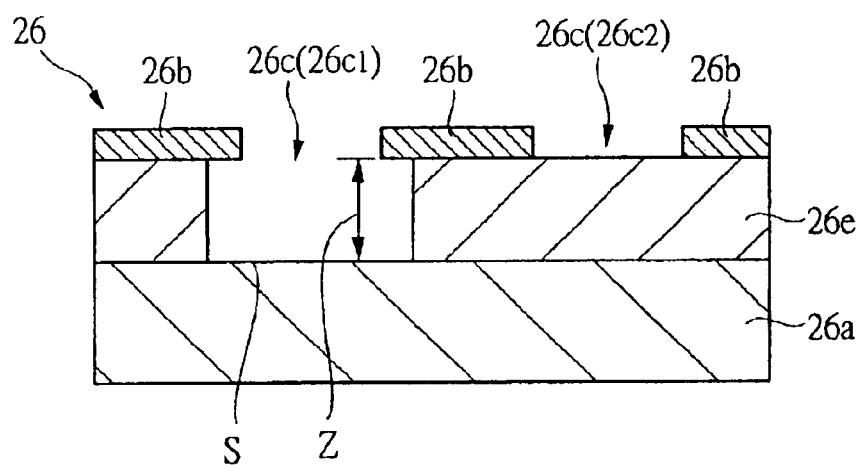
FIG. 51A is a cross-sectional view of an essential portion of a photomask showing a modification of the phase shift mask.
Figure 51B:
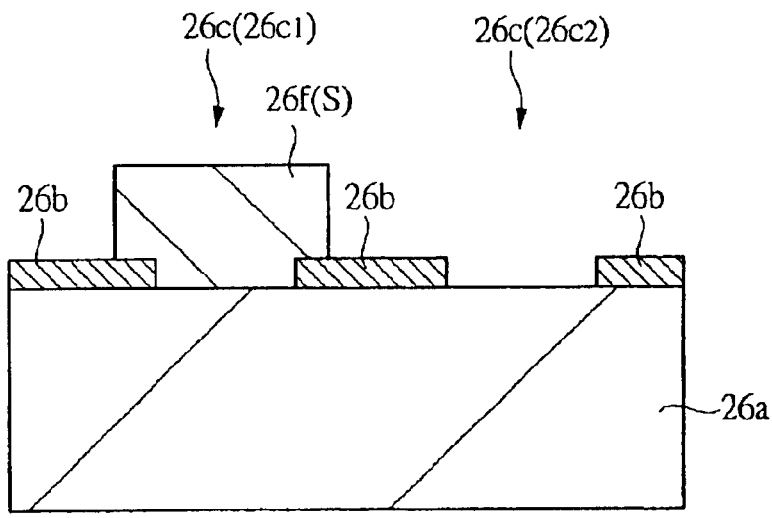
FIG. 51B is a cross-sectional view of an essential portion of a photomask showing another modification of the phase shift mask.

In the above-mentioned example, the case has explained where the phase shifter S is the trench shifter (fine visor type trench shifter), but the present invention is not limited thereto. For example, as shown in FIG. 51A, the shifter may be the above-mentioned on-substrate thin film trench shifter. In this case, a shifter film 26e is formed on the surface of the mask substrate 26a. The shifter film 26e is formed to have a thickness (as satisfying the above-mentioned equation Z) suitable for the purpose of functioning as the phase shifter, and, for example, is formed of SOG (spin on glass) or the like having light permeating rate and index of refraction, which are the same as or similar to those of the mask substrate 26a. A trench forming the phase shifter S is formed by removing the shifter film 26e of a predetermined light transfer pattern 26c (corresponding to the main light transfer pattern 26c1) exposed from each light shield pattern 26b until a surface of the mask substrate 26a is exposed. In this case, when the trench for the phase shifter S is formed, etching selection ratio between the mask substrate 26a and the shifter film 26e is set higher such that etching speed of the shifter film 26e becomes faster than that of the mask substrate 26a. That is, the trench for the phase shifter S is formed by using the mask substrate 26a as an etching stopper. This results in extremely high precise formation of depth (i.e., thickness of the shifter film 26e) and flatness of the bottom surface of the trench. Therefore, since the phase difference of the transferring light can be largely reduced or eliminated, it is possible to largely enhance the dimensional precision of each photoresist pattern to be transferred on the wafer 1W (substrate 1). Further, as shown in FIG. 51B, a transparent film 26f can be used as the phase shifter S instead of the trench. In this case, a thickness of the transparent film 26f can be expressed by the equation Z about depth of the trench for the above-mentioned phase shifter S.

Next, an exposure technique for forming a photoresist pattern used in forming each pattern of the contact holes 10a and 10b shown in FIG. 11 and the like, will be explained. A minimum arrangement pitch is, for example, about 260 nm, and a minimum design dimension is, for example, about 170 nm.

Figure 11:
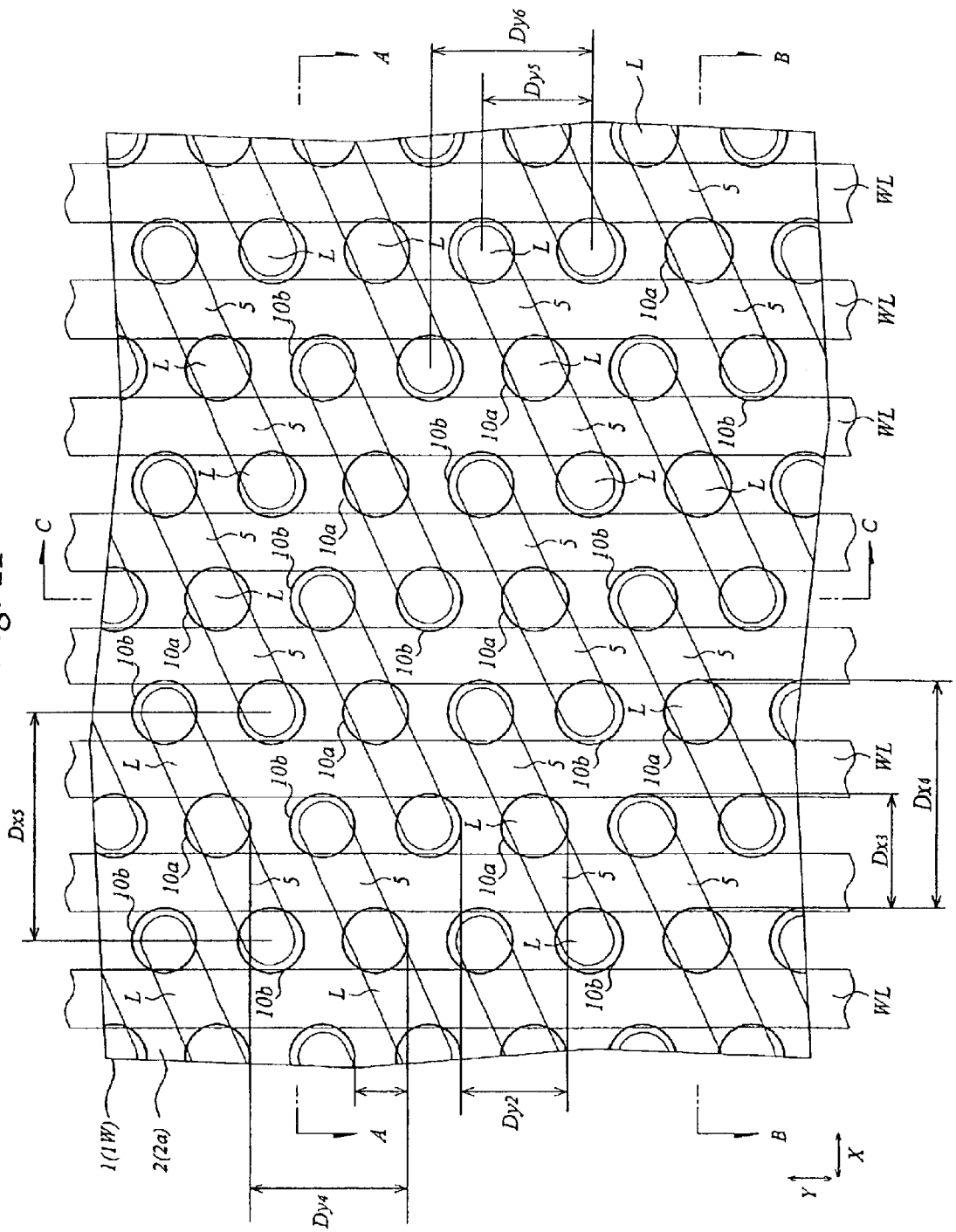
FIG. 11 is a plan view of an essential portion subsequent to respective essential portions of FIGS. 8 to 10 in the manufacturing process of the semiconductor integrated circuit device.
Figure 12:
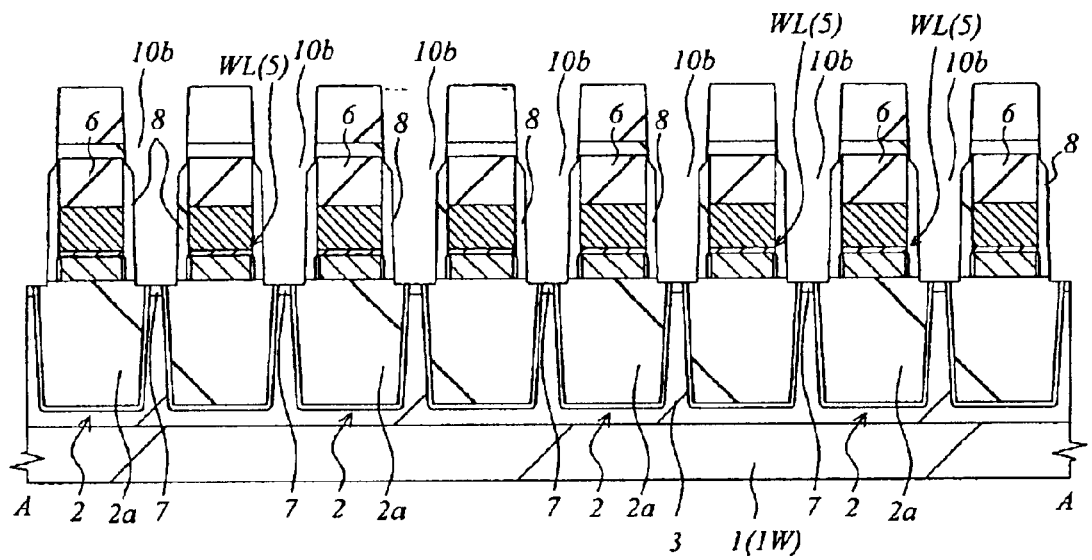
FIG. 12 is a cross-sectional view taken along line A—A of FIG. 11.
Figure 13:
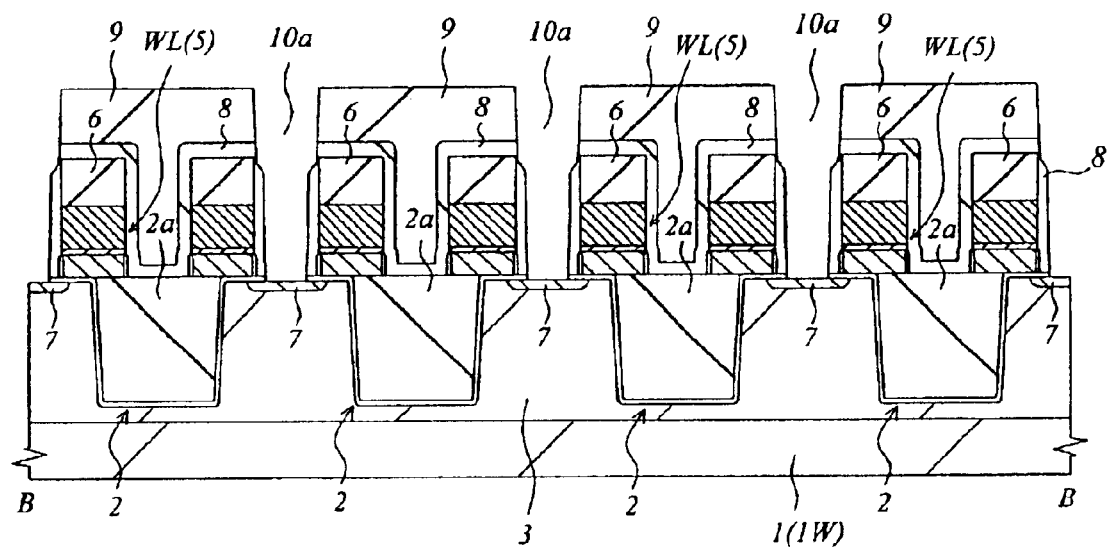
FIG. 13 is a cross-sectional view taken along line B—B of FIG. 11.
Figure 14:
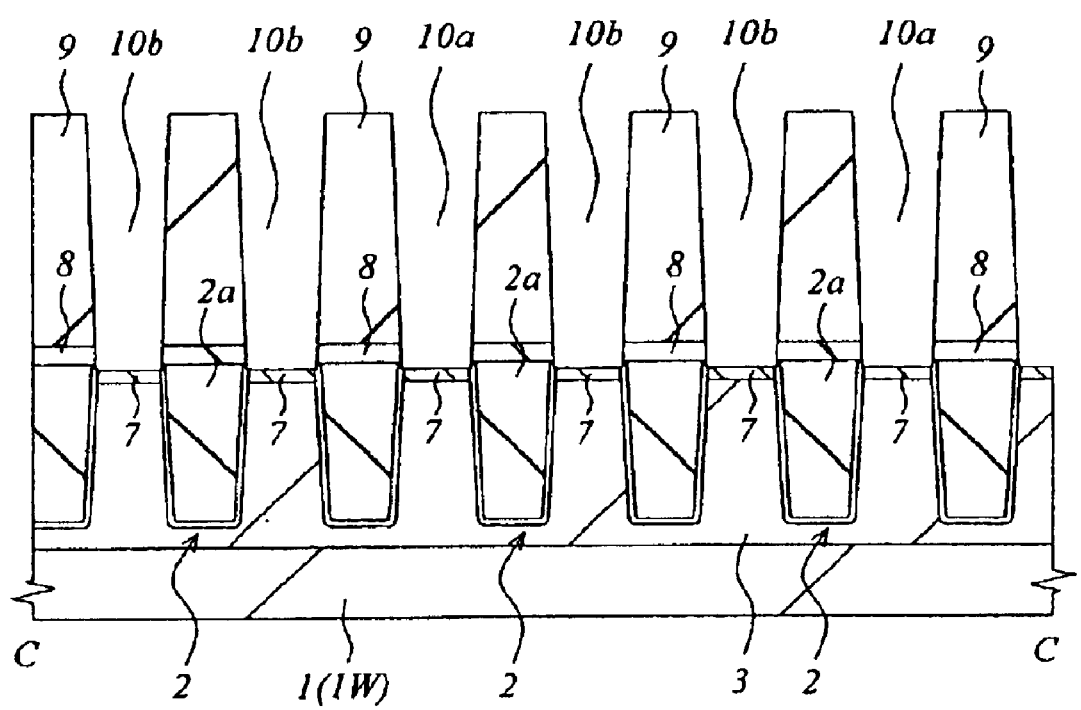
FIG. 14 is a cross-sectional view taken along line C—C of FIG. 11.
Figure 52A:
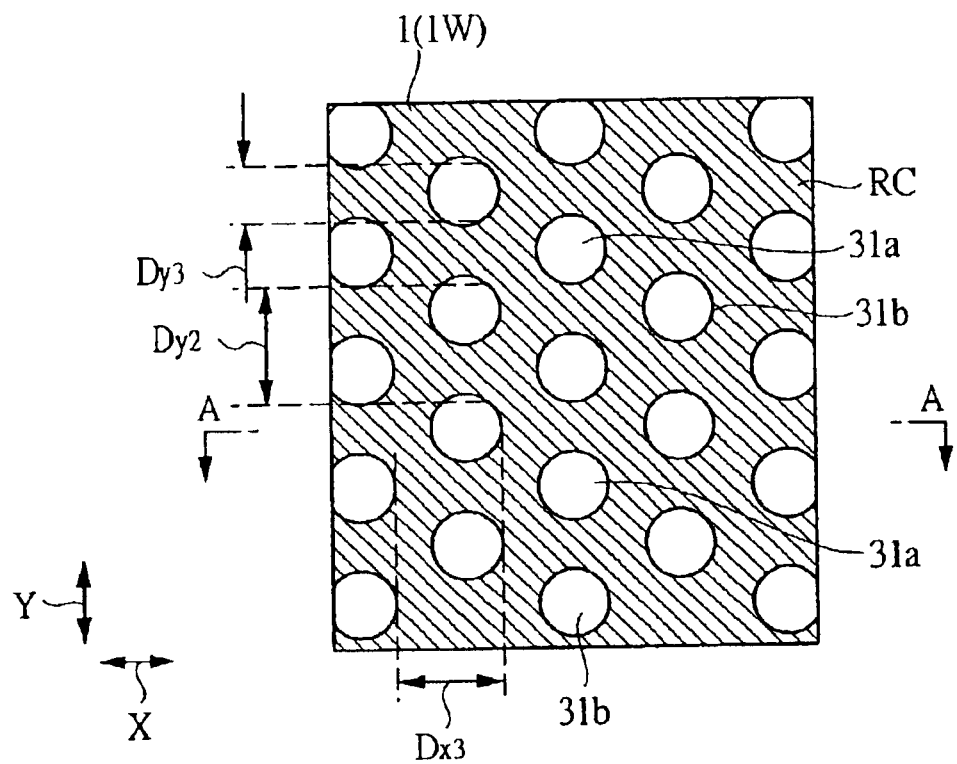
Figure 52B:
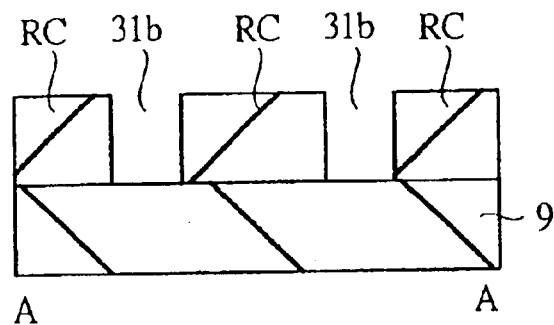
FIG. 52B is a cross-sectional view taken along line A—A of FIG. 52A.

FIG. 52A is a plan view of an essential portion of a photoresist pattern RC for forming the contact holes 10a and 10b shown in FIG. 11 and the like. FIG. 52B is a cross-sectional view taken along line A—A of FIG. 52A. Although FIG. 52A is the plan view, the photoresist pattern RC is hatched so as to easily see the drawing.

As shown in FIG. 52A, apertures 31a and 31b (portions in which the contact holes 10a and 10b are formed) of the photoresist pattern RC are densely arranged like a honey-comb. An arrangement pitch Dx3 is, for example, about 260 nm, and an arrangement pitch Dy2 is, for example, 280 nm, and respective patterns are deviated to 140 nm (=Dy2) per row. In order to transfer such patterns disposed densely, it is necessary to use a Levenson type phase shift mask. However, in the pattern arrangement shown in FIG. 52A, it is impossible to dispose such phase shifters that all the phase differences between the closest patterns become 180 degrees. Therefore, it is necessary to divide the mask pattern into two and transfer the patterns by multiple-exposure.

Accordingly, in the present embodiment, even when the photoresist pattern for forming the patterns of the contact holes 10a and 10b shown in FIG. 11 is formed, a multiple-exposure method is employed in which the positive type photoresist film is used as a photoresist film, and a plurality of mask patterns are superposed on the same position of the positive type photoresist film of the wafer 1W (substrate 1) and exposed.

The contact holes 10a and 10b are separated such that a first pattern group has a dimension and a mask pattern layout capable of using a technique of the Levenson type phase shift mask, and a second pattern group has another pattern other than a pattern included in the first pattern group. More specifically, for example, the first pattern group has defined as a pattern group of contact hole 10b used for the information storage capacity element, and the second pattern group has defined as the contact hole 10a used for the data lines.

Figure 53A:
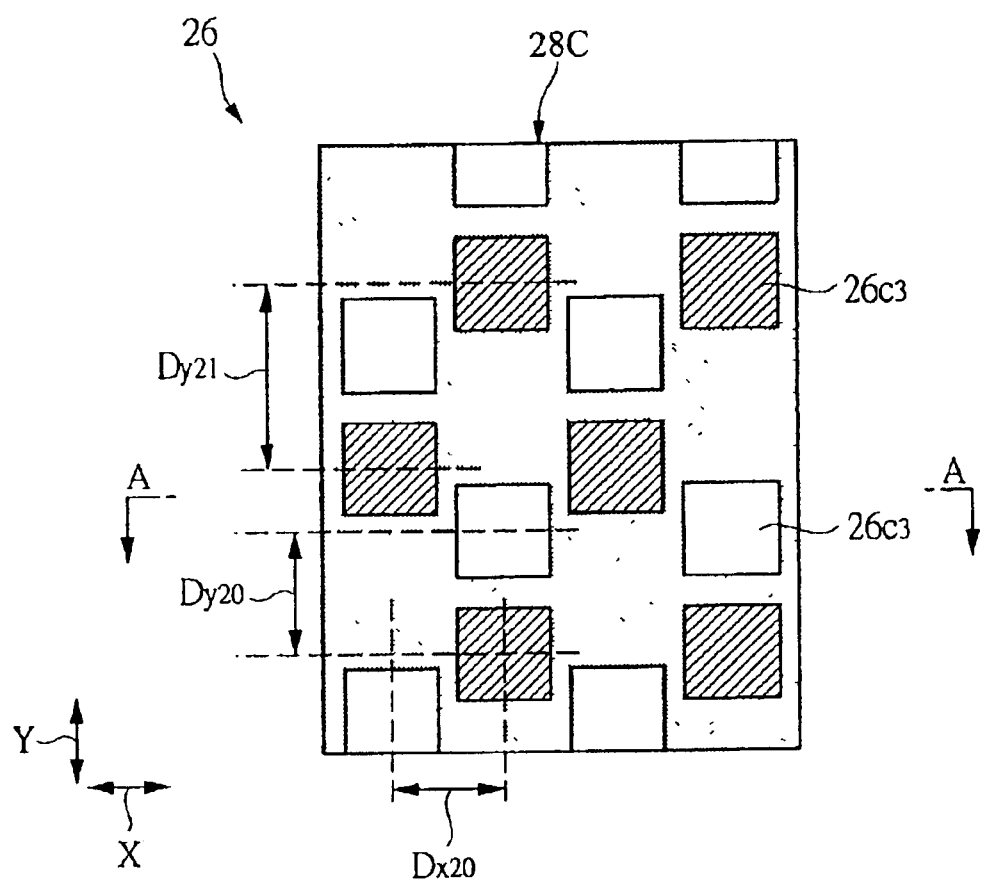
Figure 53B:
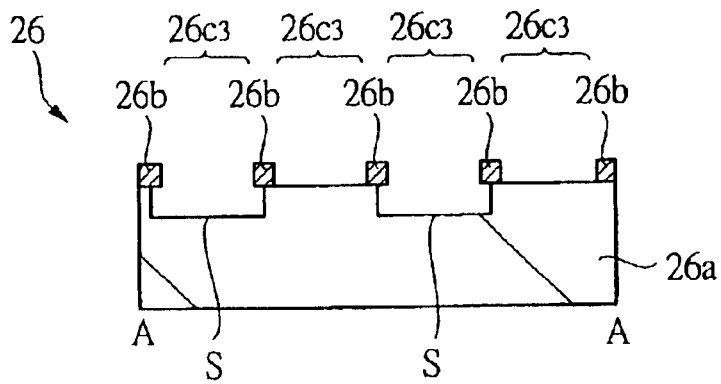
FIG. 53B is a cross-sectional view taken along line A—A of FIG. 53A.

FIGS. 53A and 53B show a first mask pattern 28C of the mask 26 for forming a photoresist pattern for forming the above-mentioned contact holes. FIG. 53A is a plan view of an essential portion of thereof, and FIG. 53B is a cross-sectional view taken along line A—A of FIG. 53A.

The first mask pattern 28C is a pattern for exposing a pattern group of the contact hole 10b for the information storage capacity element, and has, for example, a plurality of light transfer patterns 26c3 formed like a plane square. A plane dimension of each light transfer pattern 26c3 is, for example, about 200×200 nm. The phase shifter S is disposed in any one of adjacent light transfer patterns 26c3, and the phase of the light that passes through each adjacent light transfer pattern 26c3 has thereby a reversion of 180 degrees. Two respective light transfer patterns 26c3 and 26c3 which are disposed along the Y direction and through which phases of the respective transferring lights passing have reversions of 180 degrees are disposed along the X direction so as to be spaced the arrangement pitch Dy21 in the Y direction.

The arrangement pitch Dx20 between the light transfer pattern s 26c3 and 26c3 adjacent to each other in the X direction is, for example, about 260 nm (converted to wafer size). The arrangement pitch Dy20 between the light transfer pattern s 26c3 and 26c3 adjacent to each other in the Y direction is, for example, about 280 nm (converted to wafer size). The arrangement pitch between the light transfer pattern s 26c3 which are adjacent to each other in the Y direction and whose the transferring light has the same phase is, for example, about 420 nm (converted to wafer size). And, respective structures of the light shield pattern 26b and the phase shifter S described in this case are the same as those described above, so that explanation thereof will be omitted.

Figure 54:
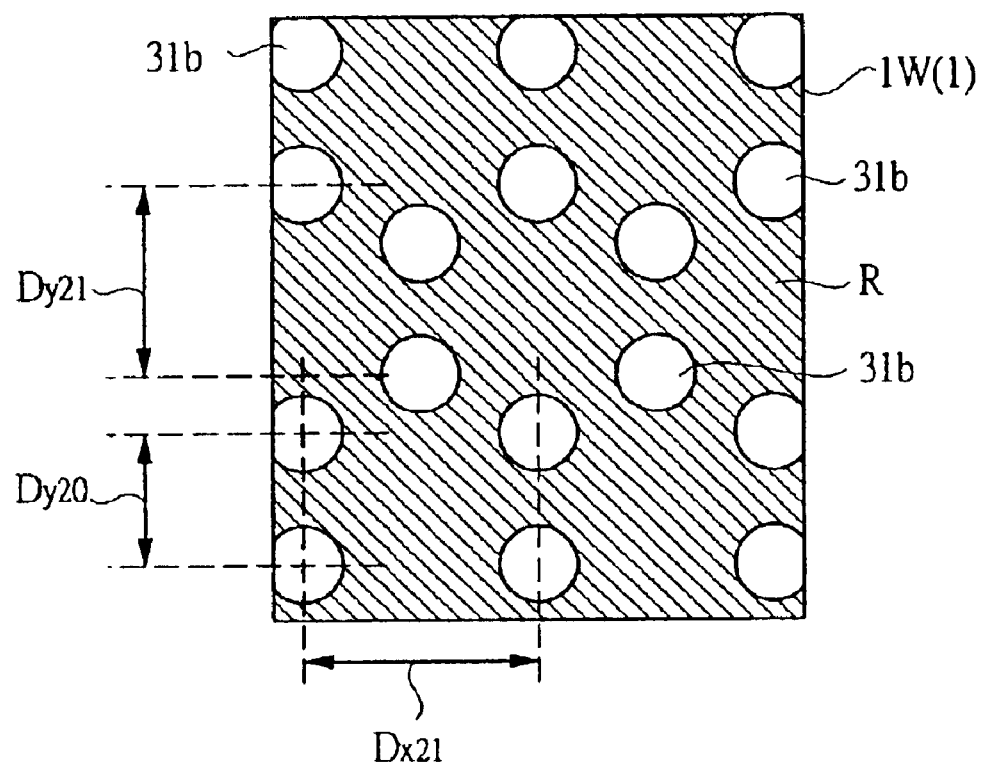
FIG. 54 is a plan view of an essential portion of the photoresist pattern schematically showing a case in which only the first mask pattern shown in FIG. 53 is exposed onto a positive type photoresist film.
Figure 54:
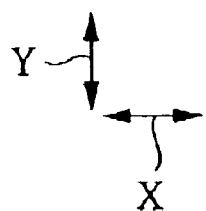

FIG. 54 schematically shows a case in which only the first mask pattern 28C is exposed on the positive type photoresist film. Regions illuminated by exposure light are hollow, and other regions not illuminated by the exposure light are hatched. Since the photoresist film is positive type, if development treatment thereof is performed (in actual case, development treatment thereof is performed after the multiple exposure), the exposed regions (hollow regions) are removed. By using only the above-mentioned mask pattern 28C, a photoresist pattern R (i.e., a photoresist pattern for forming the first hole pattern) which has only apertures 31b for the contact hole 10b for the information storage capacity element is formed, and the apertures 31a for the contact hole 10a for each data line can not be formed therein. Therefore, it is necessary to prepare a second mask pattern for forming the contact hole 10a for each data line and to superpose the pattern and perform exposure thereof. An arrangement pitch Dx21 between the apertures 31a and 31b adjacent to each other in the X direction is, for example, about 520 nm (converted to wafer size) whose value is twice larger than that the above-mentioned arrangement pitch Dx20.

The present embodiment uses the same pattern as the second mask pattern 28B shown in FIG. 45A, as the second mask pattern for forming the contact hole 10a for the data line.

In the case where a normal mask is used as the second mask pattern, the second mask pattern has a mask pattern layout in which only each main light transfer pattern 26c1 of the second mask pattern 28B shown in FIG. 45A is disposed. If the projection optical image using the second mask pattern on the wafer 1W (substrate 1) is compared with the projection optical image using the second mask pattern 28B shown in FIG. 45, the latter can have better phase shift effect than the former and better optical image having more excellent shape and a dimensional precision.

Figure 55:
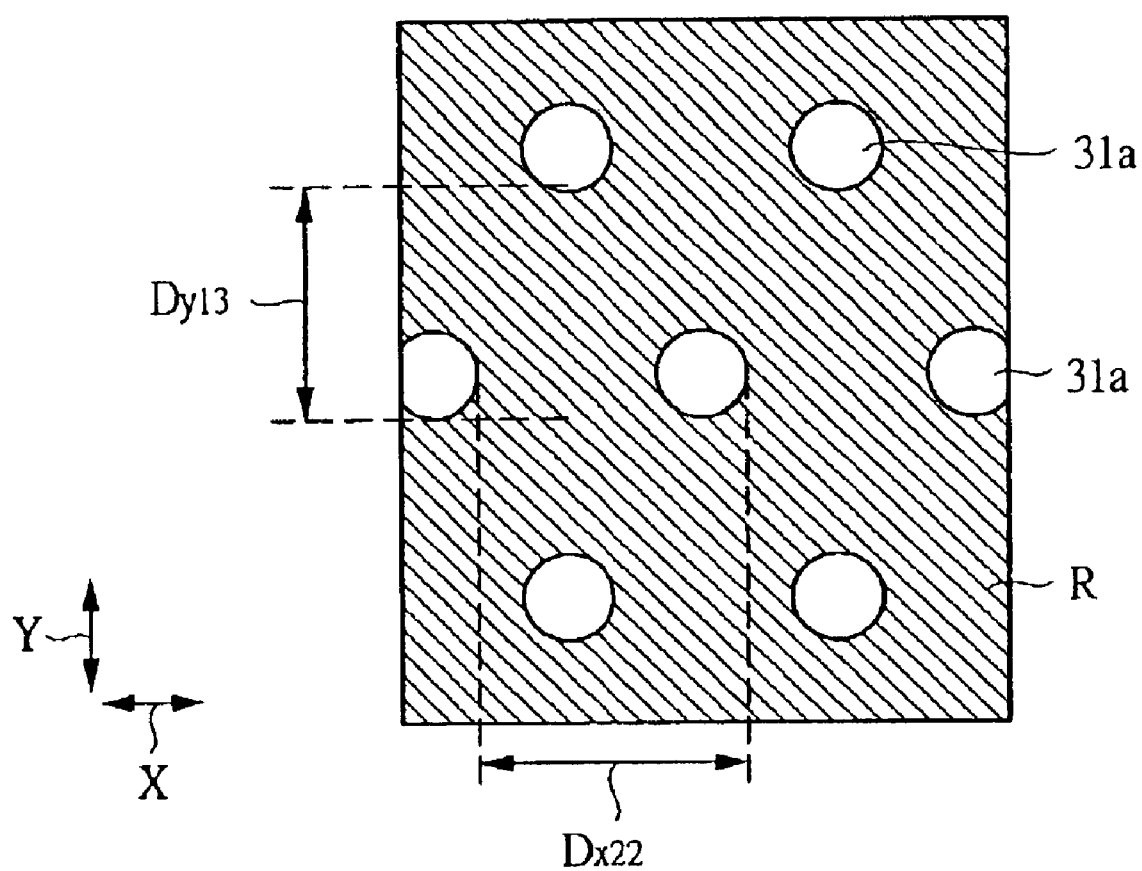
FIG. 55 is a plan view of an essential portion of the photoresist pattern schematically showing a case in which only a second mask pattern shown in FIG. 45 is exposed onto a positive type photoresist film.

FIG. 55 schematically shows a case in which only the second mask pattern 28B is exposed on the positive type photoresist film. Regions illuminated by exposure light are hollow, and other regions not illuminated by the exposure are hatched. Since the photoresist film is positive type, if development treatment thereof is performed (in actual case, development treatment thereof is performed after the multiple-exposure), the exposed regions (hollow regions) are removed. By using only the above-mentioned second mask pattern 28B, a photoresist pattern R (i.e., a photoresist pattern for forming the second hole pattern) which has only apertures 31a for the contact hole 10a for each data line is formed. An arrangement pitch Dx22 between the apertures 31a and 31a adjacent to each other in the X direction is, for example, about 520 nm (converted to wafer size) whose value is twice larger than the arrangement pitch Dx3.

Therefore, the first mask pattern 28C shown in FIG. 53A and the second mask pattern shown in FIG. 45A are superposed and exposed, and then, by performing the series of treatment such as development, cleaning, drying and the like, the photoresist pattern RC shown in FIG. 52 can be formed.

Figure 56:
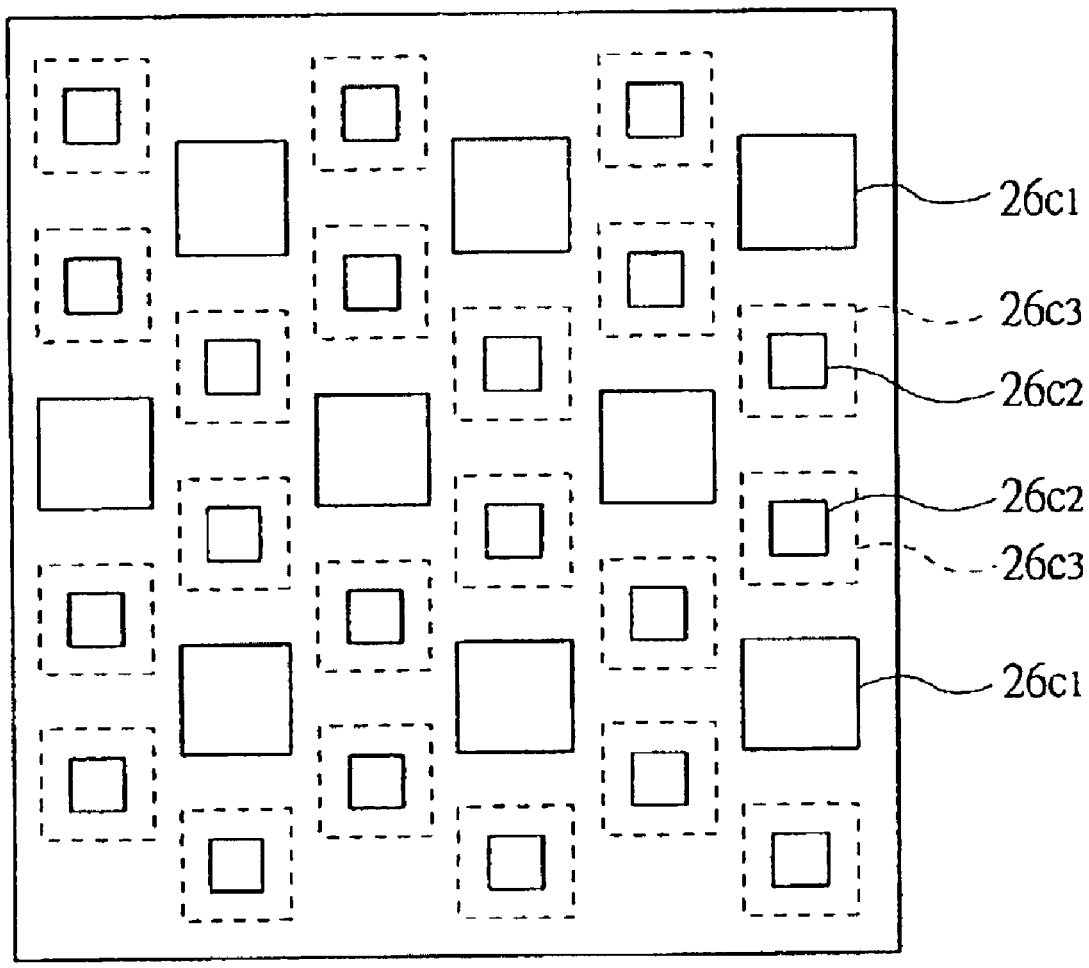
FIG. 56 is an explanatory view showing a state in which the first mask pattern shown in FIG. 45 is superposed on the second mask pattern shown in FIG. 53.

FIG. 56 shows the state that data of the first mask pattern 28C and data of the second mask pattern 28B are superposed. One dot lines show the first mask pattern 28C, and solid lines show the second mask pattern 28B. The light transfer pattern 26c3 of the first mask pattern 28A and the auxiliary light transfer pattern 26c2 of the second mask pattern 28B are superposed and disposed. That is, each auxiliary light transfer pattern 26c2 of the second mask pattern 28B is disposed in each light transfer pattern 26c3 of the first mask pattern 28A.

Therefore, in order to form the pattern data of the second mask pattern 28B shown in FIG. 45, the following procedure is performed, for example. Firstly, the pattern data is formed which disposes the light transfer pattern s in accordance with the arrangements of the respective contact holes 10a and 10b. At this time, the contact holes 10a and 10b are laid out on other layers (data layers). The contact hole 10b corresponds to the mask pattern 28C of FIG. 53A, and the contact hole 10a corresponds to each light transfer pattern 26c1 of a mask of the mask pattern 26 of FIG. 47A. That is, the mask pattern 28c is laid out on a certain layer (data layer), and the mask pattern 26 is laid out on anther layer (data layer). And, the data of the first mask pattern 28C of FIG. 53 is calculated to obtain the size of each auxiliary light transfer pattern 26c2, and then both the data and the data disposing the light transfer pattern in accordance with the arrangement of the above-mentioned contact hole 10a are synthesized. By this method, the pattern data of the above-mentioned second mask pattern 28B is formed.

Divisional treatment of the mask pattern data, when the photoresist pattern for forming the contact holes 10a and 10b is exposed by a multi-exposing treatment, will be explained from a view point of the above-mentioned unit cell UC (see FIG. 48), for example, as follows. That is, the data is divided into both data of the light transfer pattern located at a vertex of the unit cell UC, and data of the light transfer pattern disposed in the unit cell UC. The data of the light transfer pattern located at the vertex of the unit cell UC is regarded as data of the light transfer pattern s 26c1 transferred on the wafer of the second mask pattern 28B. The data of the light transfer pattern s included in the unit cell UC is regarded as data of the first mask pattern 28C.

In the multiple-exposure treatment using such first and second mask patterns 28C and 28B, the entire structure of the mask (see FIG. 50) and method of the multiple-exposure treatment are the same as those described above, and thus explanation thereof will be omitted.

Next, in the manufacturing process of the DRAM, masks used in an exposure treatment other than the treatments described above, will be explained.

Figure 57A:
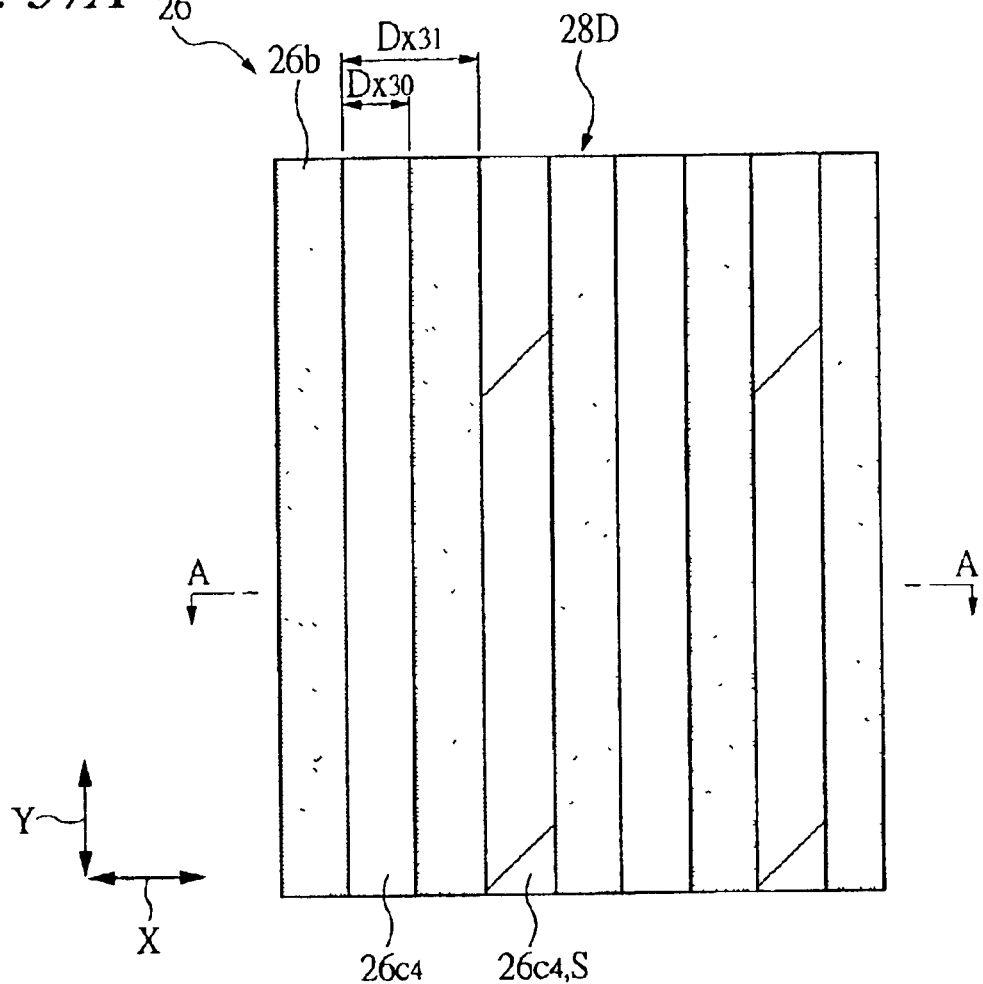
Figure 57B:
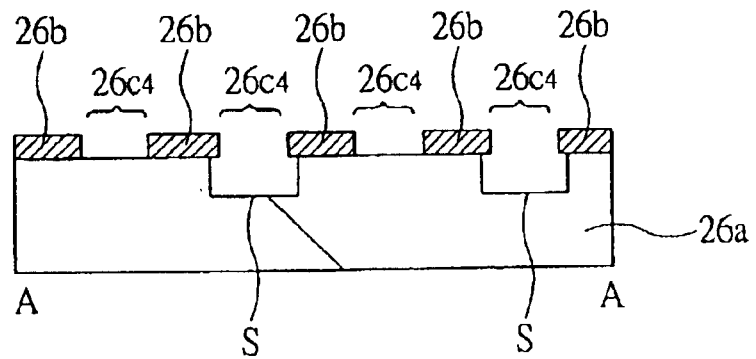
FIG. 57B is a cross-sectional view taken along line A—A of FIG. 57A.

FIG. 57A is a plan view of an essential portion of the mask 26 used at formation of the word line WL (gate electrode 5) shown in FIG. 5 and the like described above, and FIG. 57B is a cross-sectional view taken along line A—A of FIG. 57A. A Levenson type phase shift mask is used in this case. The mask pattern 28D has band-like light shield patterns 26b and light transfer pattern s 26c4 extending in the Y direction of FIG. 57A. And, the phase shifter S is disposed in one of the light transfer pattern s 26c4 and 26c4 adjacent to each other. A wide dimension Dx30 of each light transfer pattern 26c4 is, for example, about 130 nm (converted to wafer size). A total wide dimension Dx31 of both the light transfer pattern 26c4 and the light shield pattern 26b is, for example, about 260 nm (converted to wafer size). The exposure apparatus and the exposure conditions are the same as those explained in FIG. 38. A negative type resist film is used as a photoresist film.

Figure 58A:
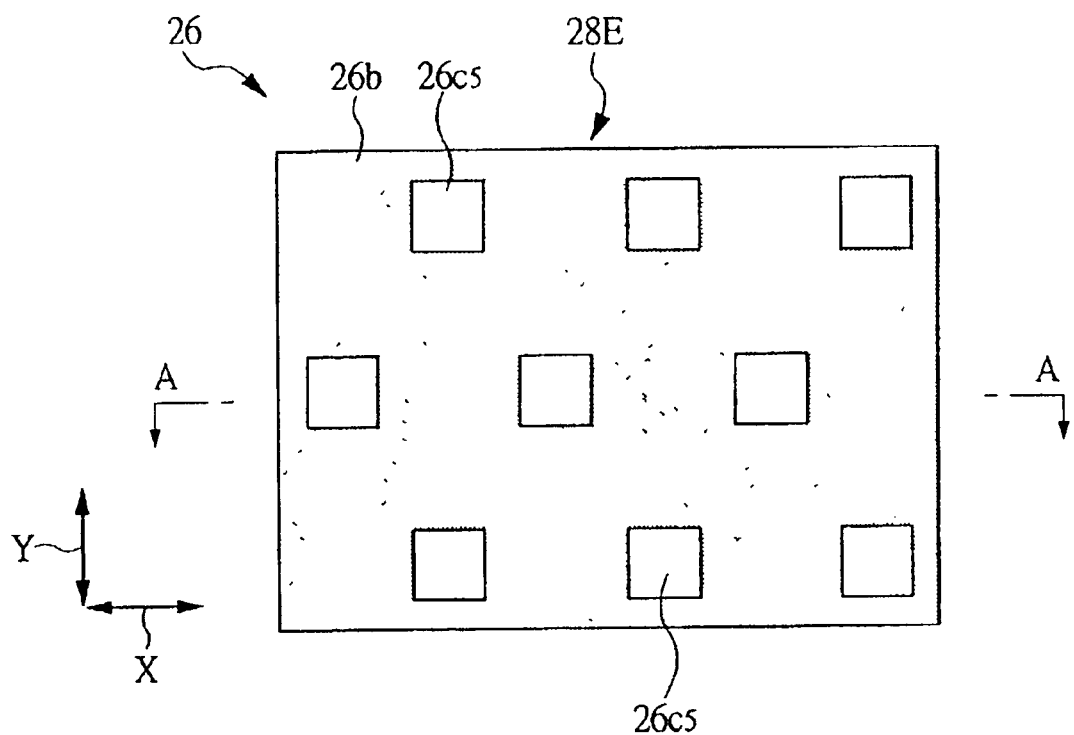
Figure 58B:
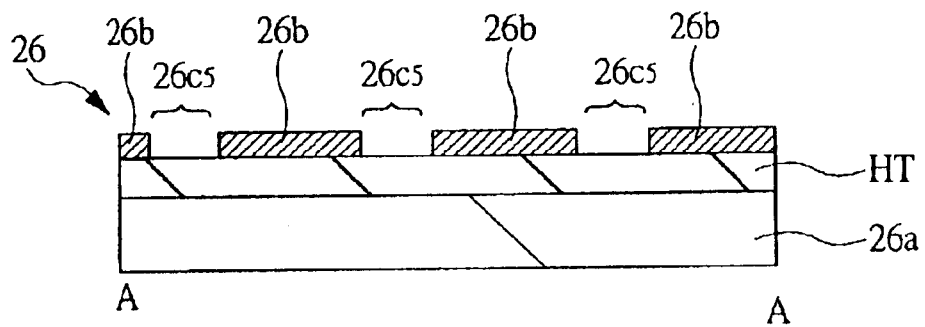
FIG. 58B is a cross-sectional view taken along line A—A line in FIG. 58A.

Next, FIG. 58A is a plan view of an essential portion of the mask 26 used at formation of the through holes 13 for the data lines shown in FIG. 17 and the like described above, and FIG. 58B is a cross-sectional view taken along line A—A of FIG. 58A. A halftone type phase shift mask is used in this case. HT means a halftone film. This mask pattern 28E has a plurality of light transfer pattern s 26c5, for example, formed like a plane square. A plane dimension of each light transfer pattern 26c5 is, for example, about 220×220 nm (converted to wafer size). The exposure apparatus is the same as one explained in FIG. 38, and, for example, the exposure optical conditions satisfies NA=0.68 and δ=0.30. A positive type resist film is used as a photoresist film.

Figure 59A:
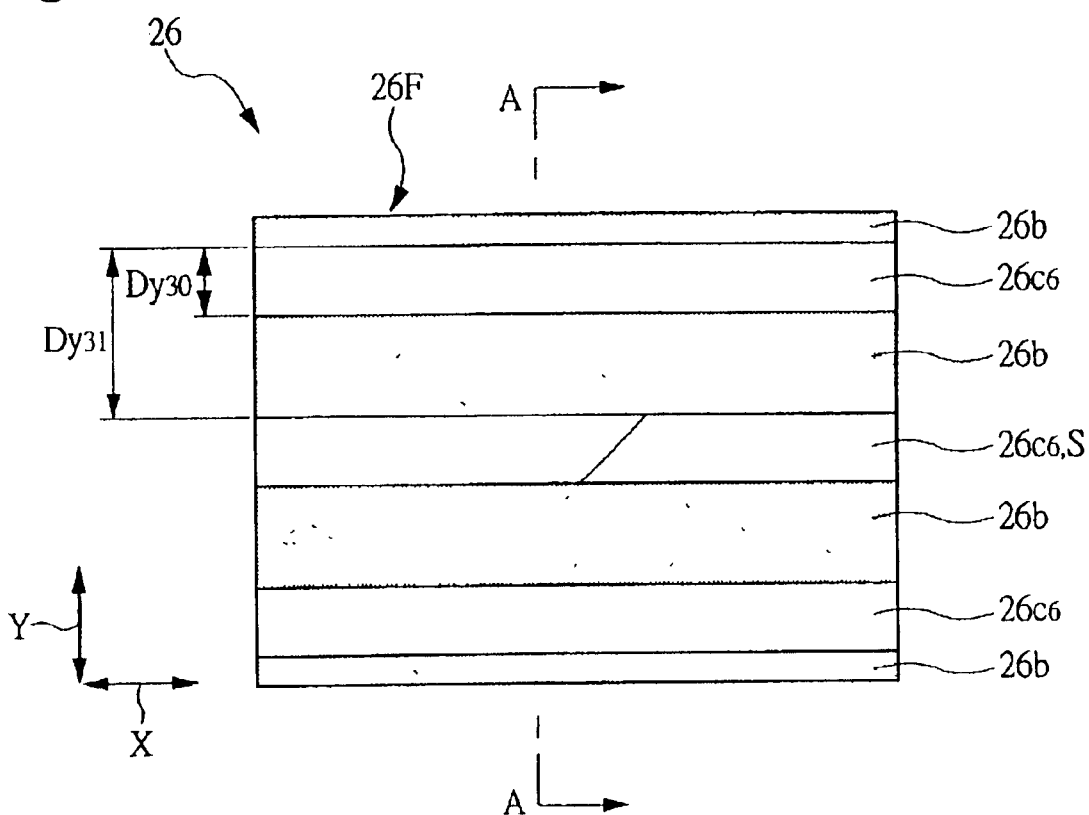
Figure 59B:
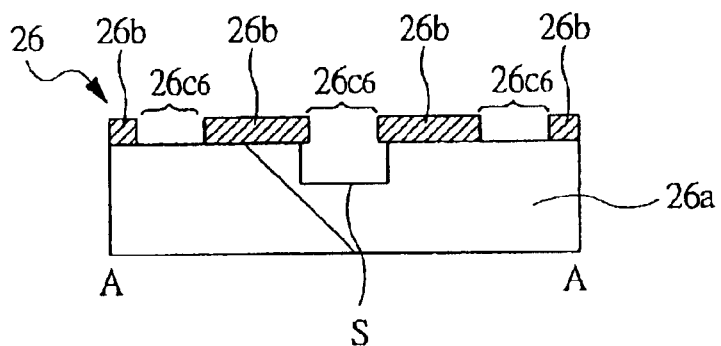
FIG. 59B is a cross-sectional view taken along line A—A of FIG. 59A.

FIG. 59A is a plan view of an essential portion of the mask 26 used at formation of the data lines DL shown in FIG. 21 and the like described above, and FIG. 59B is a cross-sectional view taken along line A—A of FIG. 59A. A Levenson type phase shift mask is used in this case. This mask pattern 28F has band-like light shield patterns 26b and light transfer pattern s 26c6 extending in the X direction of FIG. 57A. And, the phase shifter S is disposed in any one of the light transfer pattern s 26c6 and 26c6 adjacent to each other. A wide dimension Dx30 of each light transfer pattern 26c6 is, for example, about 170 nm (converted to wafer size), and a total wide dimension Dx31 of the light transfer pattern 26c6 and the light shield pattern 26b is, for example, about 420 nm (converted to wafer size). The exposure apparatus is the same as those explained in FIG. 38, and the exposure conditions satisfy NA=0.68 and δ=0.3. A negative type resist film is used as a photoresist film.

Figure 60A:
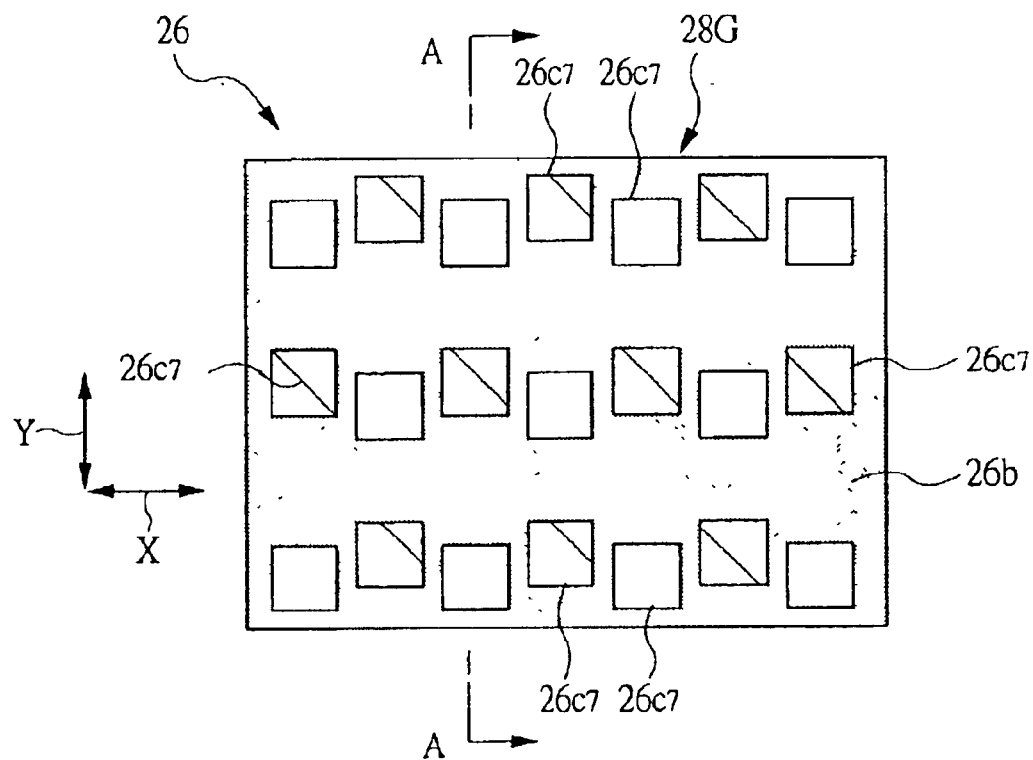
Figure 60B:
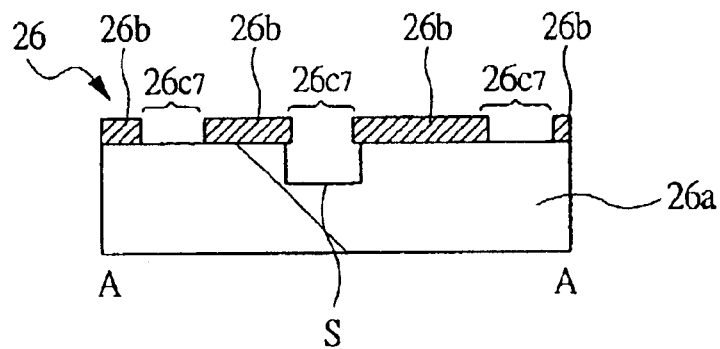
FIG. 60B is a cross-sectional view taken along line A—A of FIG. 60A.

Next, FIG. 60A is a plan view of an essential portion of the mask 26 used at formation of the through holes 17 for the information storage capacity element shown in FIG. 25 and the like described above, and FIG. 60B is a cross-sectional view taken along line A—A of FIG. 60A. A Levenson type phase shift mask is used in this case. This mask pattern 28G has a plurality of light transfer pattern s 26c7, for example, formed like a plane square. The light transfer patterns 26c7 are arranged along a straight line extending in the Y direction, but are not arranged on a straight line extending in the X direction and are deviated from one another alternately. Each deviation amount is less than a value of a dimension of each side of the light transfer patterns 26c7 extending in the Y direction. A adjacent pitch between the light transfer patterns 26c7 extending in the Y direction is longer than in the X direction in value. And, the phase shifter S is disposed in any one of the light transfer patterns 26c7 adjacent to each other. A structure of the phase shifter S is the same as the above-mentioned structure, for example, is a fine visor type trench shifter. Each plane size of the light transfer patterns 26c7 is, for example, about 200×200 nm (converted to wafer size). The exposure apparatus is the same one that is explained in FIG. 38, and the exposure optical conditions satisfies NA=0.68 and δ=0.30. Either stepper or scanner may be used as the exposure apparatus. A positive type resist film has used as a photoresist film.

Figure 61:
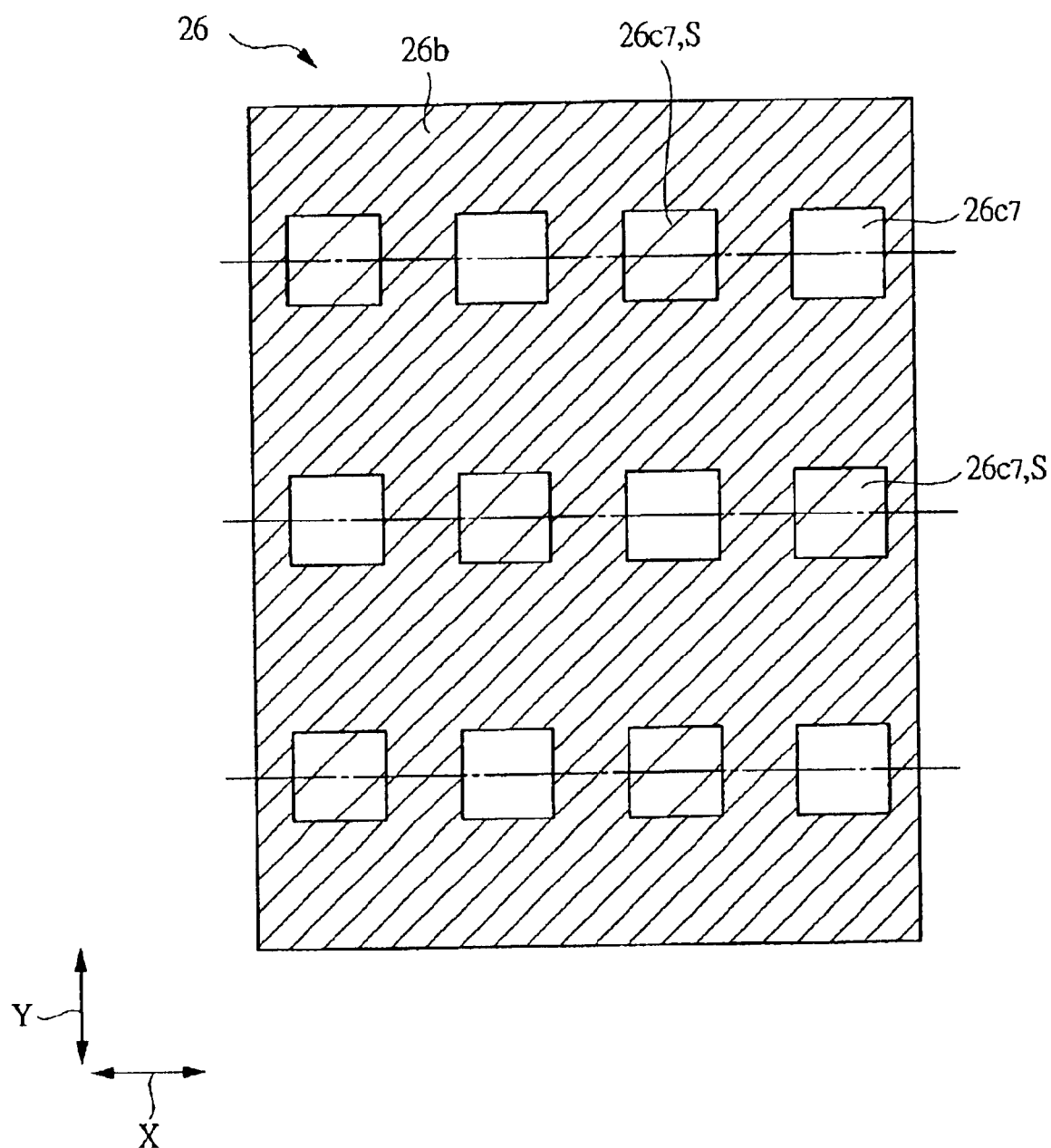
FIG. 61 is a plane view of an essential portion of a photomask that the inventors have studied.

The present inventors have studied a problem concerning the mask 26 used at that time. This problem will be explained. As shown in FIG. 25, patterns of the through holes 17 are periodically and densely (with small pitch) disposed. Therefore, appliance of a Levenson type phase shift mask that is effective for such a layout is considered at formation of the patterns. Here, FIG. 61 is a plan view of a mask pattern used for forming the hole pattern. In this mask pattern, a plurality of light transfer patterns 26c7 formed like plane square are regularly arranged. The light transfer patterns 26c7 are disposed at intersections between a plurality of straight lines (shown by one dot line) extending in the X direction and a plurality of straight lines extending in the Y direction. That is, the light transfer patterns 26c7 are arranged on the straight lines extending in both the X and Y directions. Arrangements of the light transfer patterns 26c7 are different from one another in pitches of the X direction and the Y direction. And, the adjacent pitch extending in the X direction is shorter than in the Y direction. Additionally, the phase shifter S is disposed in any one of the light transfer patterns 26c7 adjacent to each other, and thereby phase of light passing through each of the patterns is reversed to 180 degrees.

Figure 62:
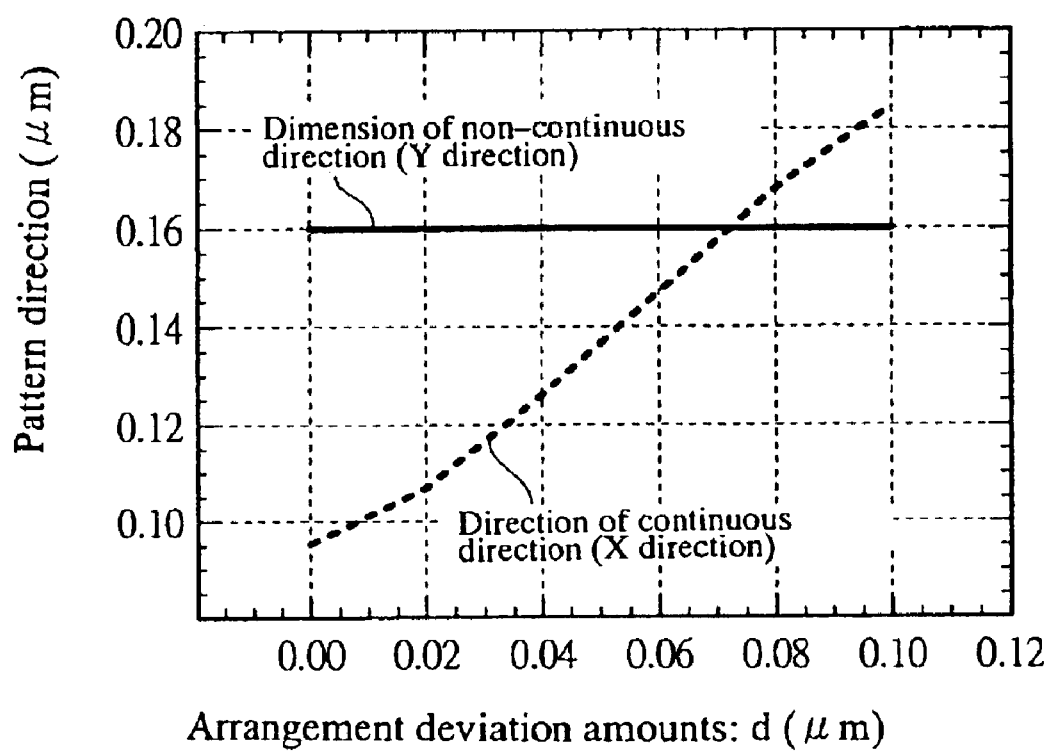
FIG. 62 is a graph showing a relationship between the arrangement deviation amounts of the light transfer pattern and the transfer pattern in the photomask.
Figure 63:
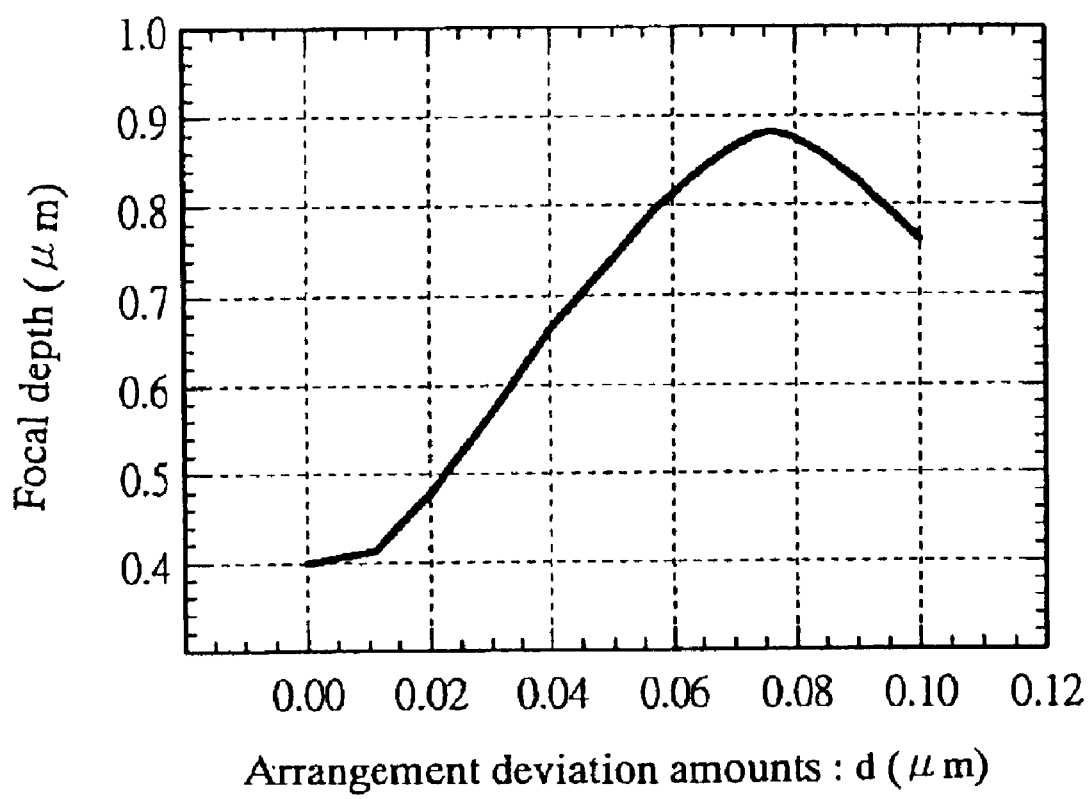
FIG. 63 is a graph showing a relationship between the arrangement deviation amounts of the light transfer pattern and the focal depth in the photomask.

In this case, the short adjacent arrangement pitch of the light transfer patterns 26c7 in the X direction results in excellent effect of the phase shift mask, but the long adjacent arrangement pitch of the light transfer patterns 26c7 in the Y direction results in no excellent effect of the phase shift mask. FIG. 62 shows each pattern dimension of the X and Y direction among the transfer patterns obtained at this time. This case shows, when the Y direction is a non-continuous direction and the X direction is a continuous direction and a dimension of the non-continuous direction (the Y direction) has a value of 1.16 μm (converted to wafer size), a value of a dimension of the continuous direction (the X direction) obtained thereby. The respective light transfer patterns 26c7 of FIG. 61 described above are arranged on the above-mentioned lines and have no deviation, so that the arrangement satisfies the condition that arrangement deviation amounts=0.0 μm. Therefore, as shown in FIG. 62, each dimension of the transfer patterns extending in the non-continuous direction has a value of 0.16 μm, but each dimension of the transfer patterns extending in the continuous direction (X direction) is 0.10 μm or less and thereby becomes extremely small. FIG. 63 shows values of focal depth obtained at this time. When the above-mentioned arrangement deviation amount has a value of 0.0 μm, the focal depth has a value of 0.4 μm. Thereby, it is understood that tolerance thereof is extremely small.

Figure 64:
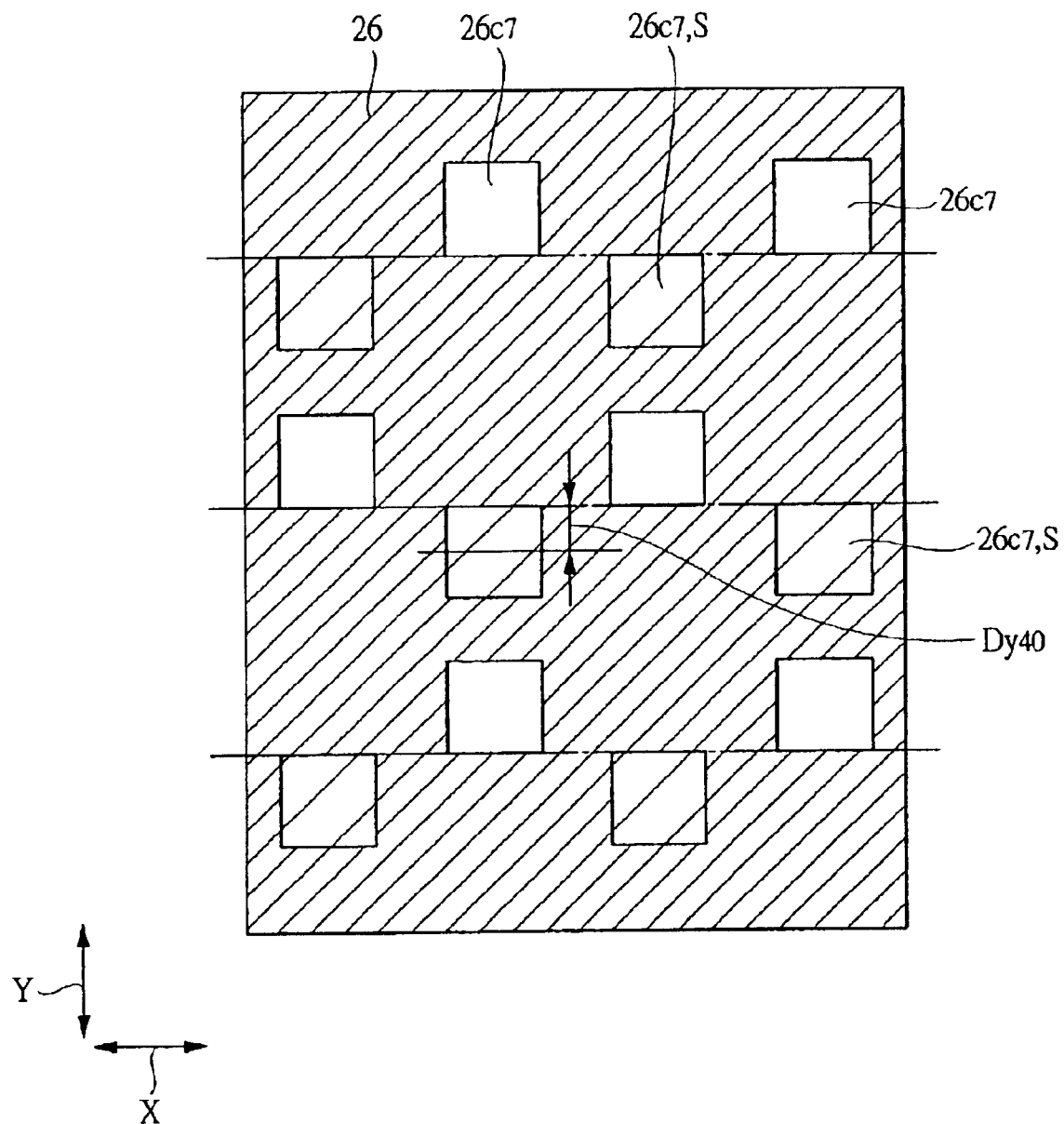
FIG. 64 is a plane view of an essential portion of a photomask that the inventors have studied.

Now, the inventors have contrived arrangements of the light transfer patterns 26c7 such that positions of the light transfer patterns 26c7 adjacent to each other in the arrangements are deviated relatively. FIG. 64 shows this case. In this mask pattern, each position of the light transfer patterns 26c7 is deviated in the Y direction to a dimension Dy40 in comparison with the case shown in FIG. 61. In this case, each light transfer pattern 26c7 is deviated to a length of the side of the Y direction. This results in enhancement of formation tolerance of each pattern. In this case, as shown in FIG. 62 described above, up to about 0.075 μm which the arrangement deviation amounts gradually increase to reach, a dimensional difference between the transfer patterns extending in the X and Y directions becomes gradually reduced. When the arrangement deviation amount has a value of about 0.075 μm, the dimensional difference between the transfer patterns extending in the X and Y directions becomes substantially zero (i.e., each plane shape of the transfer patterns is substantially perfect circle). To the contrary, if the arrangement deviation amounts exceed a value of 0.075 μm, each dimension of the transfer patterns extending in the X direction becomes larger. This is for the reasons as follows: in the where the respective light transfer patterns 26c7 are disposed on the straight line, one light transfer pattern 26c7 has a two-direction phase-shift effect obtained from the X direction; on the other hand, by deviating the respective arrangements of the light transfer patterns 26c7, the adjacent light transfer patterns 26c7 extending in the Y direction become close; and, as a result, interference of light therebetween is generated and one light transfer pattern 26c7 obtains a three-direction phase shift effect at a certain distance. Therefore, if the respective position of the light transfer patterns 26c7 are deviated to some degree, each shape of the hole patterns approaches a perfect circle. The focal depth also becomes maximum when the arrangement deviation amount has a value of about 0.075 μm (corresponding to such the arrangement deviation amount that the above-mentioned pattern shape becomes substantially circular) as shown in FIG. 63. That is, the inventors have first found that it is preferable to dispose such the light transfer patterns 26c7 on the mask 26 that the pattern shape approaches as close a circular as possible on the wafer.

Figure 65:
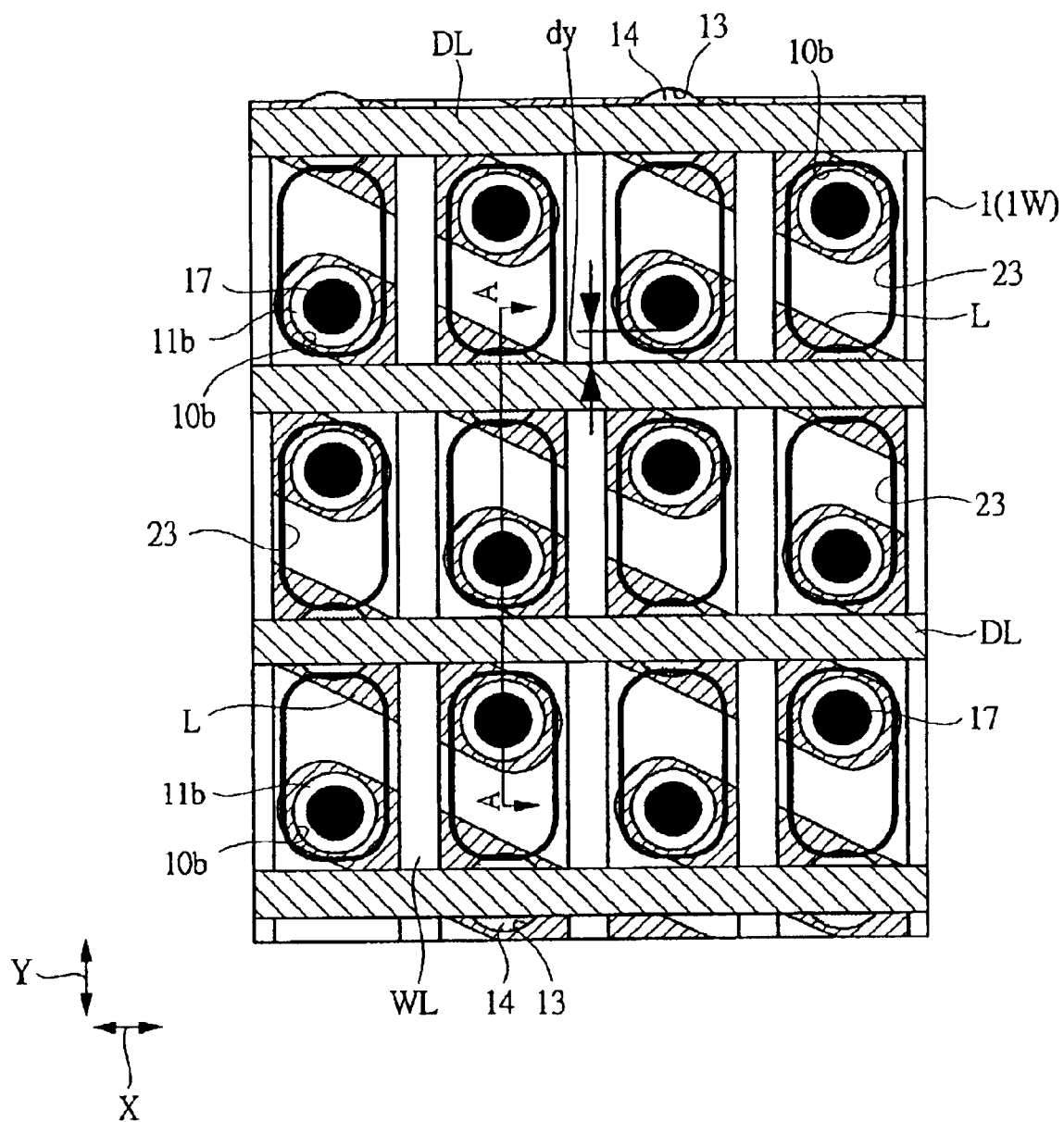
FIG. 65 is a plan view of an essential portion a semiconductor integrated circuit having hole patterns transferred by using the photomask shown in FIG. 64.
Figure 66:
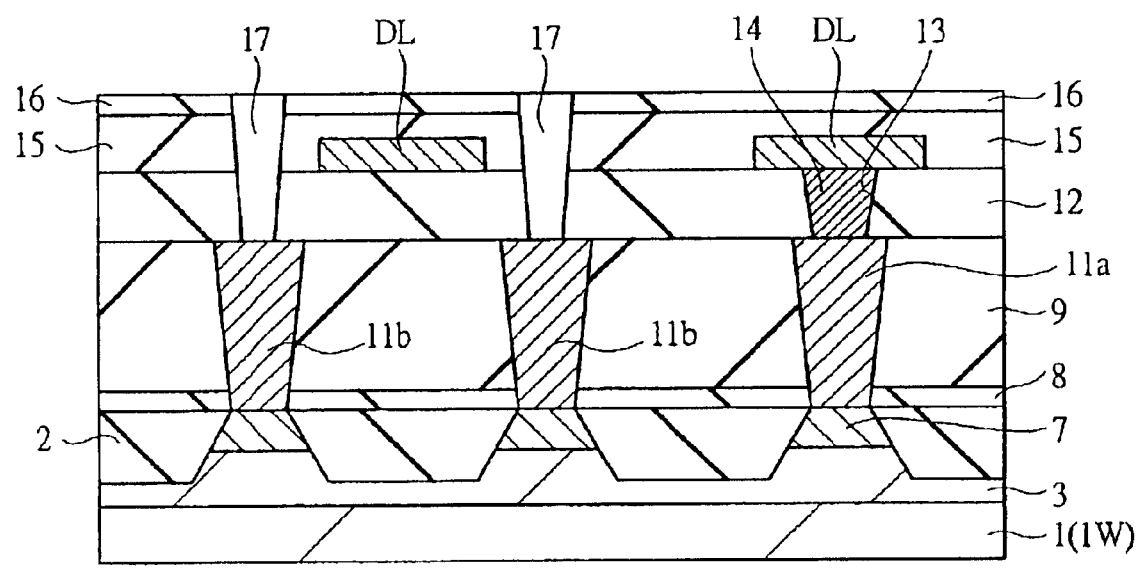
FIG. 66 is a cross-sectional view taken along line A—A of FIG. 65.

FIG. 65 is a plan view of an essential portion of memory cell region in the case of forming the through holes 17 by using the mask shown in FIG. 64. Also, FIG. 66 is a cross-sectional view taken along line A—A of FIG. 65. This drawing shows the case where the through holes 17 and lower patterns are positioned substantially precisely.

Figure 67:
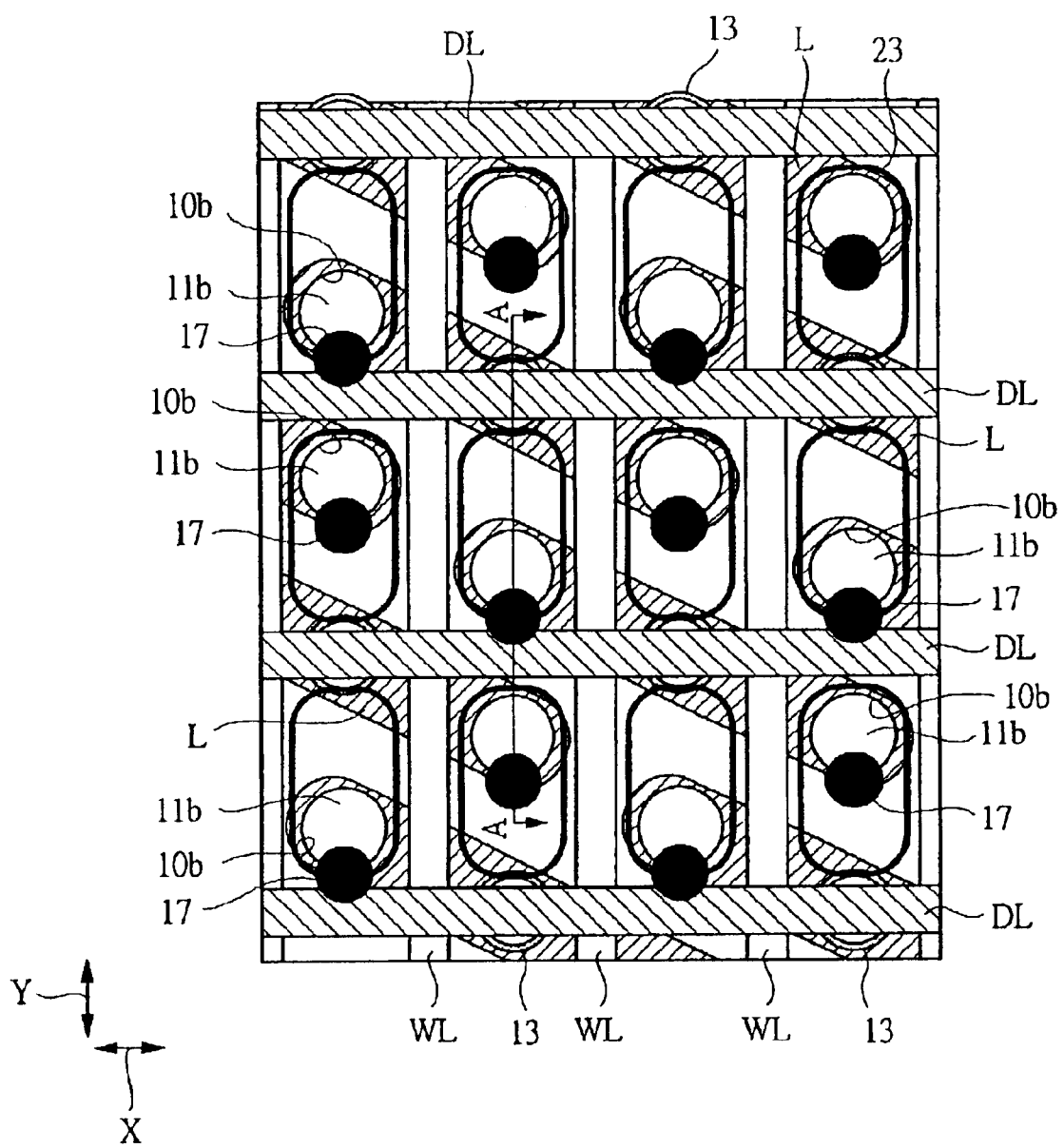
FIG. 67 is a plan view of an essential portion of a semiconductor integrated circuit device showing a case in which the hole patterns are deviated and transferred in the semiconductor integrated circuit device having the structure of FIG. 65.
Figure 68:
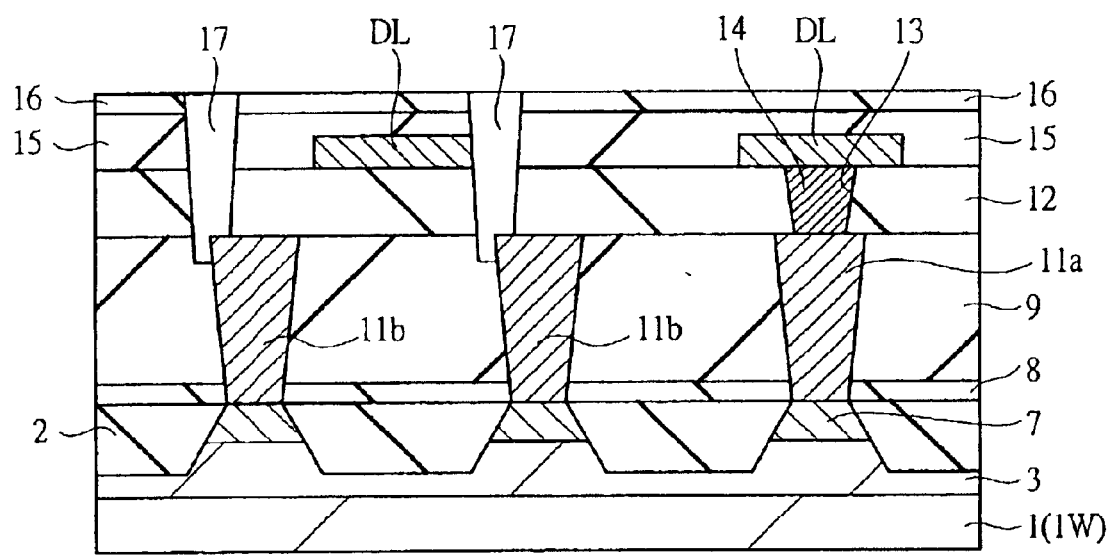
FIG. 68 is a cross-sectional view taken along line A—A of FIG. 67.

As shown in FIGS. 65 and 66, the through holes 17 is disposed such that each center thereof coincides with each center of the contact holes 10b, i.e., each of the plugs 11b. In this case, although each diameter of the through holes 17 is smaller than that of the contact holes 10b, each through hole 17 is close to each data line DL and alignment tolerances in both are also small. Due to this, each deviated position of the through holes 17 results in alignment of the through holes 17 with the data lines DL and occurrence of short circuit. FIG. 67 is a plan view showing the case where the through holes 17 are deviated in the Y direction to a value of about −50 nm in the structure shown in FIGS. 65 and 66. FIG. 68 is a cross-sectional view taken along line A—A of FIG. 67. It is found that each through hole 17 is superposed on each data line DL and thereby the short circuit is caused between each data line DL and each plug 19 to be formed in each through hole 17.

Figure 69:
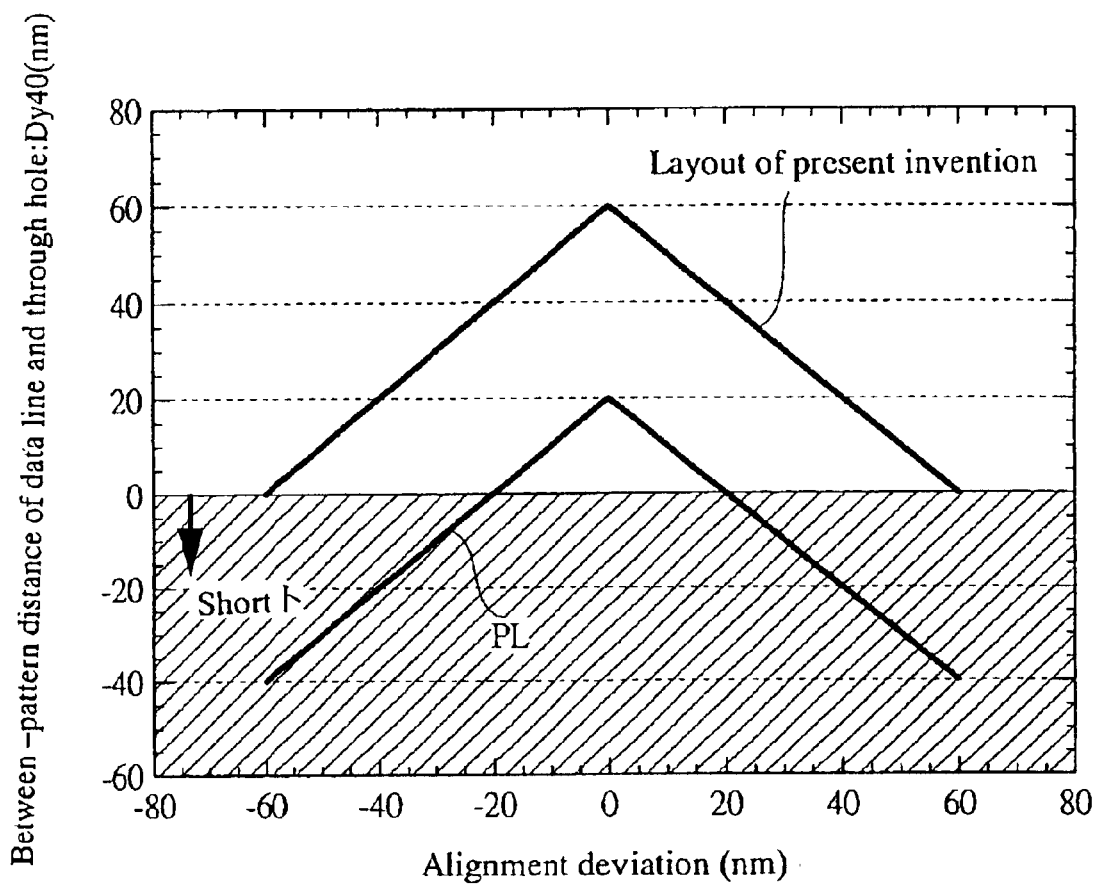
FIG. 69 is a graph showing a relationship between alignment deviation amounts of pattern and between-pattern distance of the data line and through hole.

FIG. 69 shows a relationship between between-pattern distance (from an end to the other end) dy between the data lines DL close to each other and the through holes 17 close thereto, and deviation amounts caused at formation of the patterns. The case (solid line PL) of the structure shown in FIG. 65 and the like can have only a value of about 20 nm which is extremely small even when the between-pattern dy has no alignment deviation. That is, it is found that short circuit is caused between the patterns having a arrangement deviation of about 20 nm at most. Therefore, the structure shown in FIG. 65 and the like needs extremely high precision for the positioning. But, since the deviation amount caused by alignment error generally used in the current exposure apparatus is about ±50 nm, it can be found that the alignment tolerance can be secured to form the pattern. That is, the inventors have first found that although it is preferable to deviate the respective light transfer patterns 26c7 on the mask 26, excessive deviation of each pattern results in occurrence of a new problem.

Figure 70A:
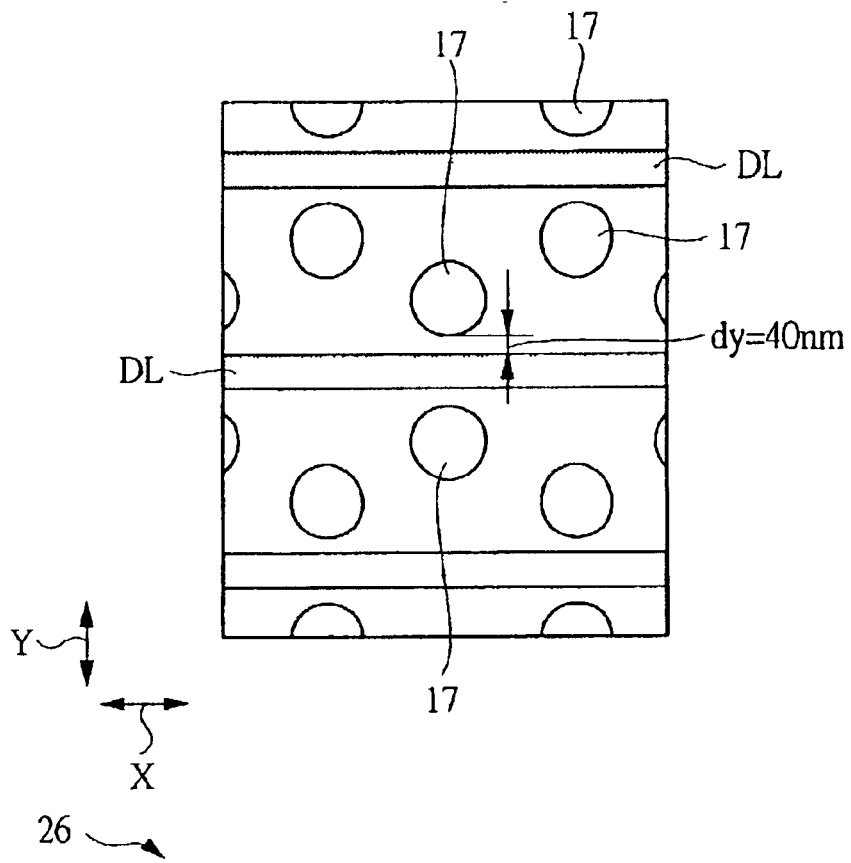
FIG. 70A is a plan view of an essential portion of the semiconductor integrated circuit device.
Figure 70B:
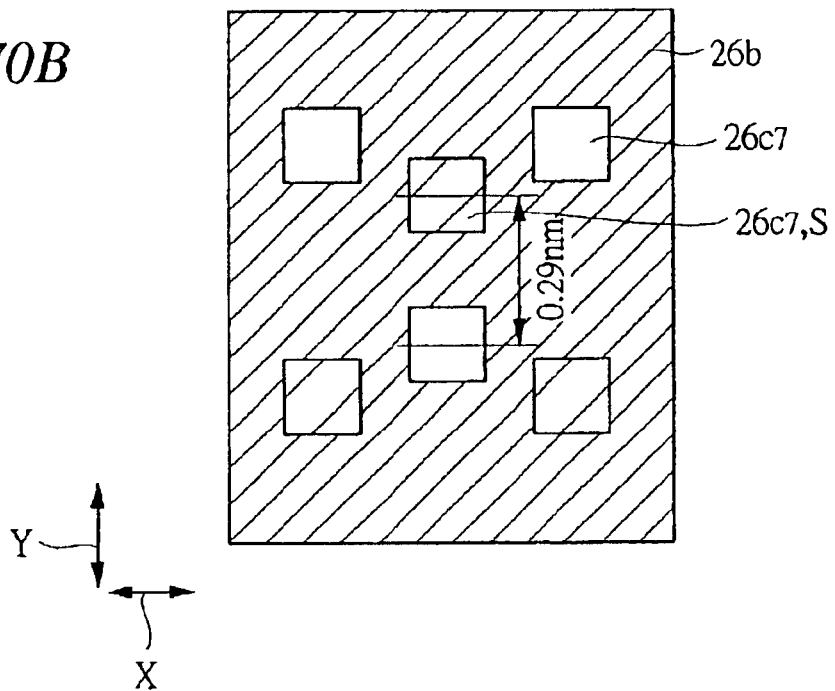
FIG. 70B is a plan view of an essential portion of the photomask used for transferring the through hole patterns shown in FIG. 70A.

There is a means of securing the alignment tolerance or the like by reducing each diameter of the through holes 17. For example, as shown in FIG. 70A, if each diameter of the through holes 17 has a small value of 140 nm (converted to wafer size), the between-pattern distance dy of about 40 nm can be secured and the patterns can be formed without causing short circuit at about ±50 nm which the deviation amount of the exposure apparatus has a value of. However, in this case, since the patterns are formed, the various tolerances are largely reduced. FIG. 70B shows a mask pattern of the mask 26 used for forming the transfer pattern of FIG. 70A. An adjacent pitch between the light transfer patterns 26c7 which are the closest in the Y direction is, for example, a value of about 290 nm.

Figure 71:
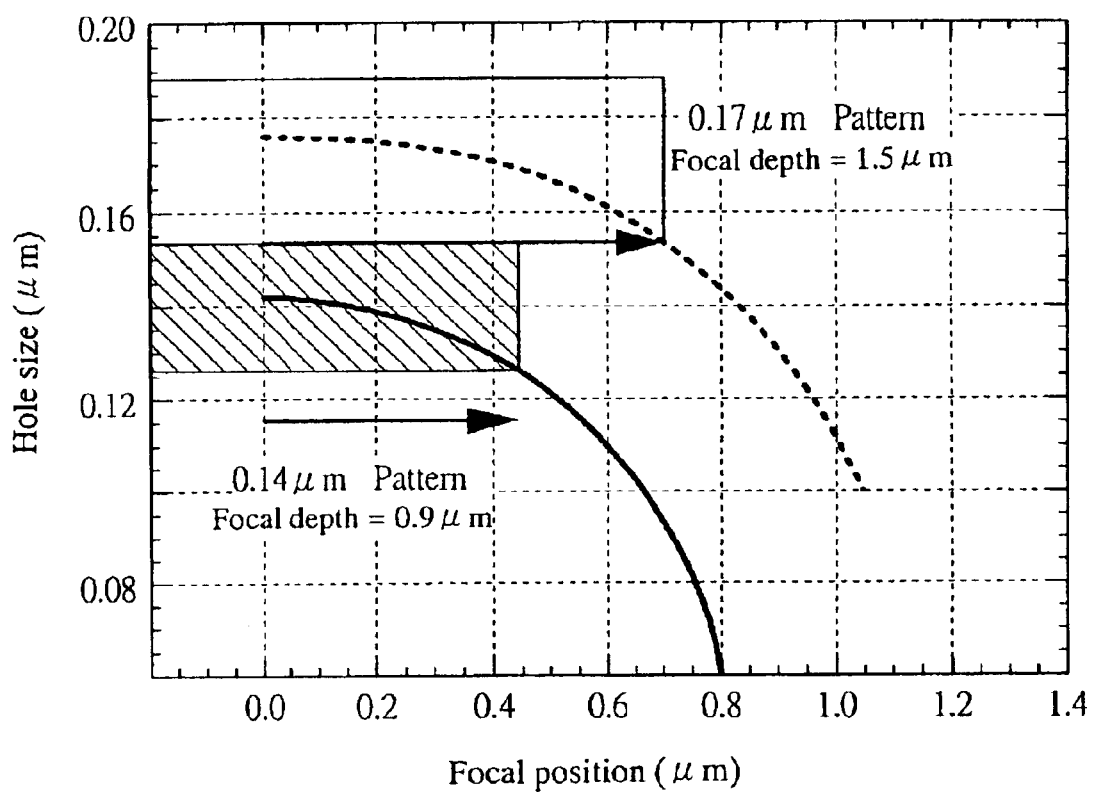
FIG. 71 is a graph showing a relationship between focal position and hole size.

FIG. 71 is a view showing a comparison between a focal depth obtained with one hole pattern, for example, having 170 nm, and a focal depth obtained with a hole pattern of 140 nm. The condition of forming the patterns is, for example, as follows: the number of aperture NA is 0.68 and the KrF excimer laser having wavelength of 248 nm is used as the exposure light. The patterns are disposed in the form of lattice with a pitch, for example, of 290 nm (converted to wafer size). The focal depth taking variation of exposure up to ±5% in consideration and obtained within an admitted dimension rage of ±10% in each dimension has a value of about 1.8 μm with a hole pattern of 170 nm. To the contrary, the focal depth is lowered to about 0.9 μm with a hole pattern of 140 nm. By this, it is understood that the focal depth which is generally required is lower than 1.0 μm. That is, the present inventors have found that reduction of each dimension of the patterns can increases the alignment tolerance between the patterns, but process tolerance required for forming each pattern could not be obtained.

Accordingly, in order to form the above-mentioned patterns, such a method is generally employed as to enhance the alignment performance of each pattern of the exposure apparatus, or increase the number of aperture NA of the projection lens, or reduce each pattern dimension by shortening the exposure wavelength. However, enhancement of performance of the exposure apparatus is required to change an exposure apparatus. This results in increase of the equipment costs and thereby of the costs of the semiconductor integrated circuit device. Since such a tendency is rapidly promoted as to fine and high integrate the patterns of the semiconductor integrated circuit device, there is an economical problem to change the exposure apparatus without depreciation. Further, the number of aperture NA of the projection lens has restriction capable of increase. Only increase in the number of aperture NA and short of the exposure wavelength can be applied to the same as described above in economy.

For this purpose, in the present invention, the alignment precision of each pattern is enhanced by further contriving the layout of each transfer pattern. As described above, each through hole 17 may electrically connect each plug 11b and each lower electrode 24a of the information storage capacity element 24 as a role. Further, in each through hole 17, since the information storage capacity element 24 is within a width between the data lines DL, each through hole 17 may be arranged within a range surrounded by a pair of data lines DL. Furthermore, if electrical connection to each plug 11b is taken into consideration, at least a portion of each through hole 17 may be on each plug 11b. For this purpose, the patterns are initially laid out in a direction separated from each data line DL having the small alignment tolerance. By this layout, the alignment tolerance between the patterns can be secured without changing each dimension of the patterns.

That is, even if each through hole 17 should be deviated at the time of formation thereof, each through hole 17 is disposed separately from each data line DL at design thereof such that the electrical connection of each plug 11b thereto can be secured and the insulative state with each data line DL can secured. In this case, even when each through hole 17 is formed as designed without being deviated in position, a center of each through hole 17 is deviated from that of each plug 11b, but each plug 19 and each plug 11b are electrically connected to each other in each through hole 17 (see FIGS. 25, 28, 31 and the like).

Figure 72:
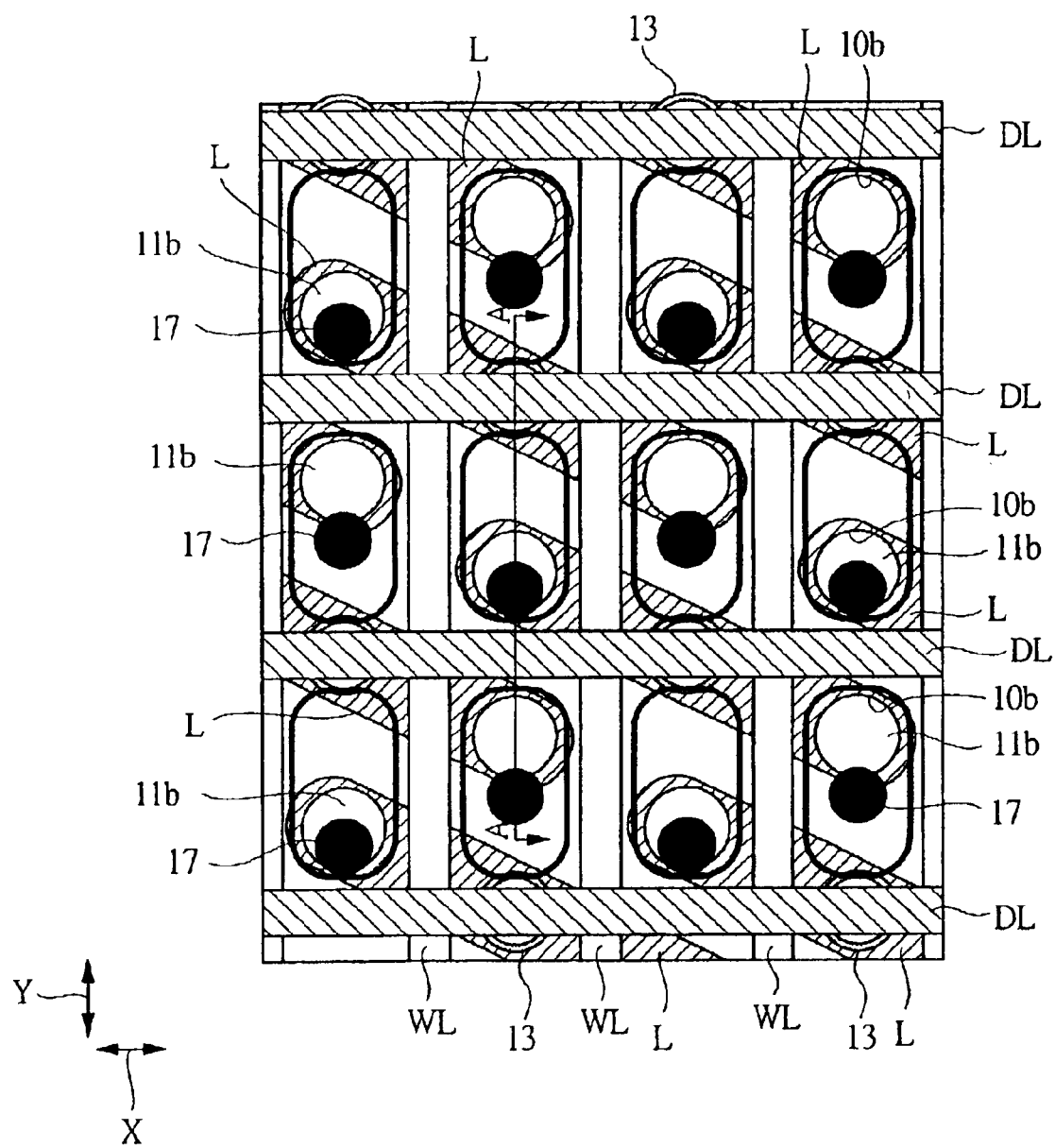
Figure 73:
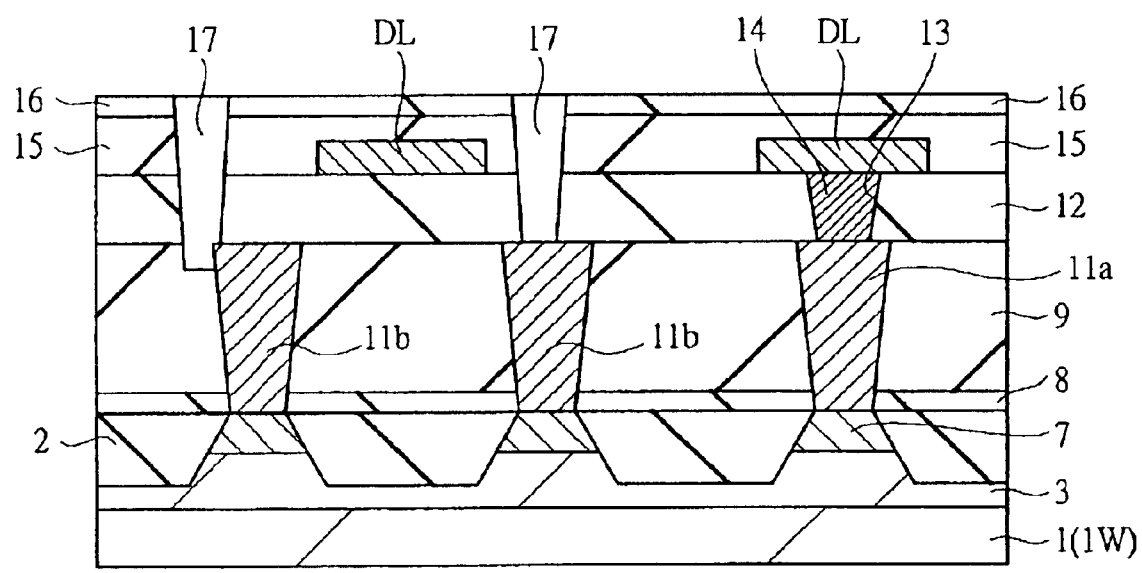
FIG. 73 is a cross-sectional view taken along line A—A of FIG. 72.

FIG. 72 is a plane view when each through hole 17 is deviated in the Y direction, for example, to about −50 nm (converted to wafer size) in the same manner as described above in this device layout. FIG. 73 is a cross-sectional view taken along line A—A of FIG. 72. Even in this case, it can be found that short circuit is not caused between each through hole 17 and each data line DL. Each through hole 17 is connected to each lower plug 11b and satisfactory electrical characteristics can be obtained. In a relationship of the between-pattern distance dy between each through hole 17 and each data line DL, it can be found that short circuit is not caused, for example, with deviation thereof up to about 60 nm (converted to wafer size) in the case of the present invention. Therefore, by changing layout of the device and layout of the mask pattern for forming the device, even if the pattern dimension and the like are not changed (of course, dimension change (reduction) within a range capable of obtaining resolution may be performed), alignment error of the exposure apparatus could be permitted, and excellent patterns could be formed.

Figure 74A:
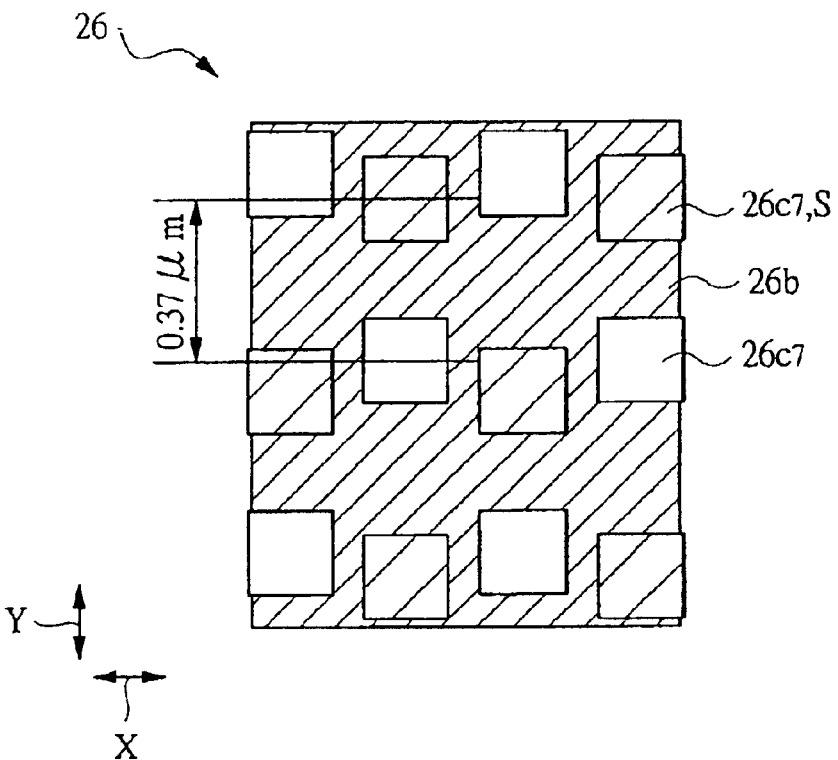
FIG. 74A is a plan view of an essential portion of the photomask that is the present embodiment.
Figure 74B:
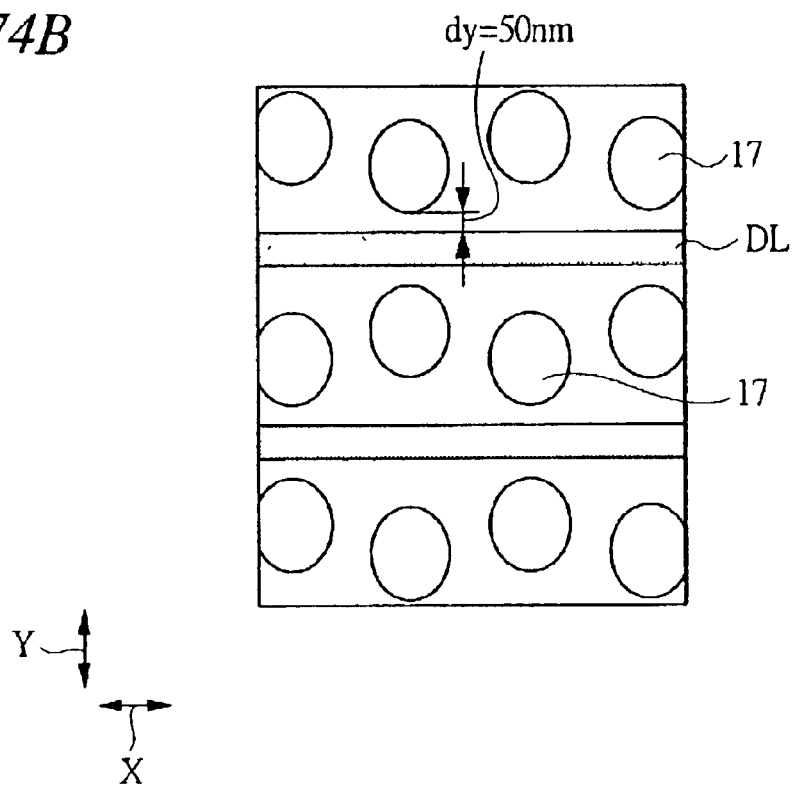
FIG. 74B is a plan view of an essential portion of the semiconductor integrated circuit device having through holes transferred by using the photomask shown in FIG. 74A.
Figure 75A:
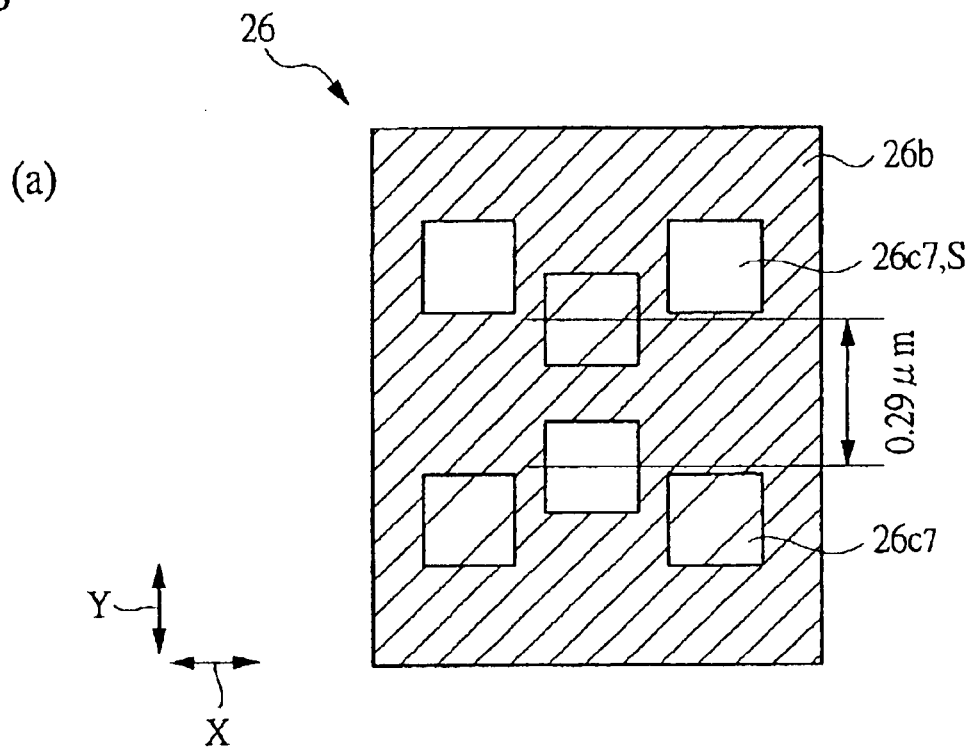
FIG. 75A is a plan view of an essential portion of the photomask that the inventors have studied.
Figure 75B:
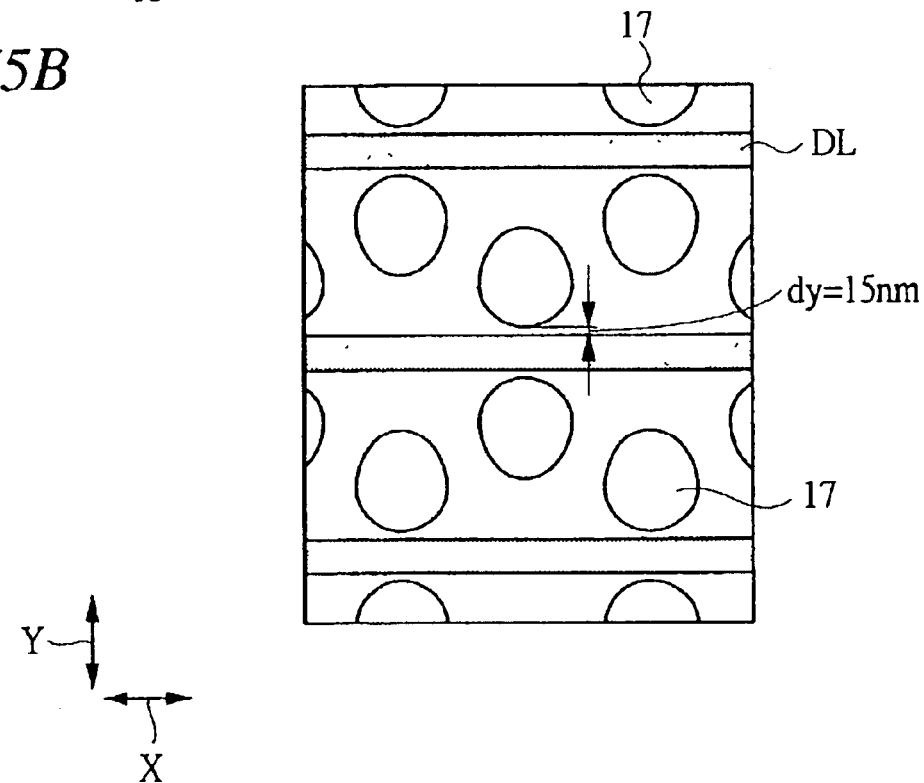
FIG. 75B is a plan view of an essential portion of the semiconductor integrated circuit device having the through holes transferred by using the photomask shown in FIG. 75A.

A mask pattern 28G of the mask 26 shown in FIG. 60 is formed in accordance with the above technical idea. FIG. 74A is a plan view of an essential portion of the same mask 26 shown in FIG. 60 and used for transferring the through holes 17. FIG. 74B is a plan view of an essential portion of a transfer pattern obtained when the mask pattern shown in FIG. 74A is used. FIG. 75A is a plan view of an essential portion of a mask pattern that is deviated to a length corresponding to half of a side thereof in the Y direction. FIG. 75B is a view shown for comparing a plan view of an essential portion of transfer patterns that are actually obtained when the mask pattern of FIG. 75A is used. According to the embodiment shown in FIG. 74, it is confirmed that tolerance between the transfer patterns is increased in comparison with tolerance of FIG. 75. When the mask pattern 28G of the present invention is used, a satisfactory alignment tolerance between each through hole 17 and each data line DL could be ensured. Further, as compared with a case of the mask pattern having the structure of FIG. 64, the chip size can be reduced to about 12%. Further, since the alignment tolerance between each through hole 17 and each data line DL can be secured, yield of the product production could be lowered to ⅔ in comparison with the mask pattern having the structure of FIG. 64.

Figure 76A:
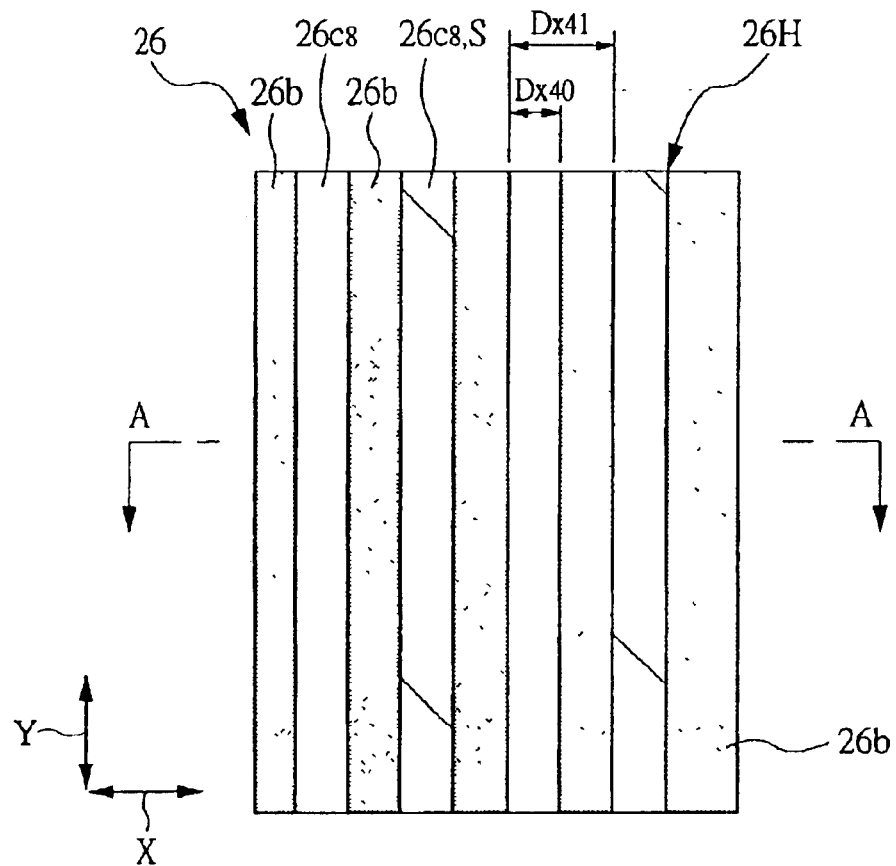
Figure 76B:
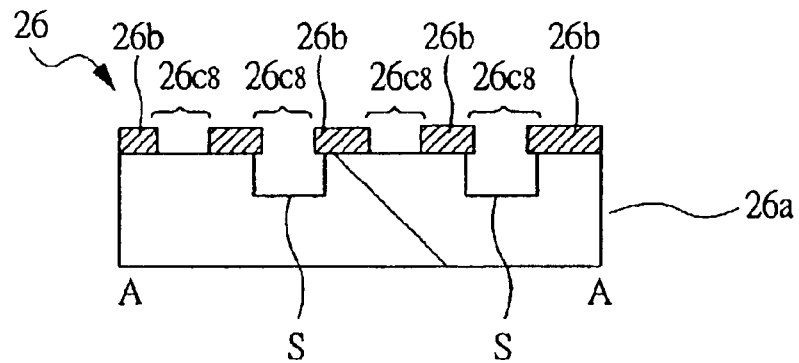
FIG. 76B is a cross-sectional view taken along line A—A of FIG. 76A.

Next, an exposure technique for forming the holes 23 (forming storage capacity patterns) shown in FIG. 34 and the like, will be explained. In this case, the above-mentioned multi-exposure treatment is performed. The first mask pattern is the same as one shown in FIG. 59. However, a wide dimension of each light transfer pattern 26c6 is, for example, about 150 nm (converted to wafer size). On the other hand, FIGS. 61A and 61B show a second pattern 28H. FIG. 76A is a plan view of an essential portion thereof, and FIG. 76B is a cross-sectional view taken along line A—A thereof. In this second mask pattern 28H, a technique of the Levenson type phase shift mask is used. The mask pattern 28H has band-like light shield patterns 26b and light transfer pattern s 26c8 extending in the Y direction of FIG. 76A. The phase shifter S is disposed in any one of the light transfer pattern s 26c8 and 26c8 adjacent to each other. A-wide dimension Dx50 of each light-transfer pattern 26c8 is, for example, about 130 nm (converted to wafer size), and a total wide dimension Dx41 of the light transfer pattern 26c8 and the light shield pattern 26b is, for example, about 260 nm (converted to wafer size). The exposure apparatus is the same as one explained in FIG. 38, and the exposure optical conditions satisfies NA=0.68 and δ=0.30. A negative type resist film is used as a photoresist film.

Typical effects of this present embodiment will be described as follows.

(1) At the time of exposure treatment for forming the through holes 17, if the mask pattern 28G shown in FIG. 60 is used, it is possible to enhance the alignment tolerance between each through hole 17 and each data line DL without deteriorating the formation control performance of each pattern and reducing the forming tolerance of each pattern.

(2) At the time of exposure treatment for forming the through holes 17, if the mask pattern 28G shown in FIG. 60 is used, it is possible to suppress both deterioration of the forming control performance of each pattern and reduction of the forming tolerance of each pattern.

(3) According to the above-mentioned effects (1) and (2), since each through hole 17 and each data line DL can be disposed densely, it is possible to enhance integrated degree of the memory cell.

(4) According to the above-mentioned effect (3), it is possible to enhance the performance of the DRAM.

(5) According to the above-mentioned effect (3), the size of the semiconductor chip can be reduced and thus, the DRAM can be made smaller.

(6) According to the above-mentioned effects (1), (2) and (5), it is possible to enhance production yield of the DRAM.

(7) According to the effects (5) and (6), it is possible to reduce the manufacturing cost of the DRAM.

Embodiment 2

Figure 77A:
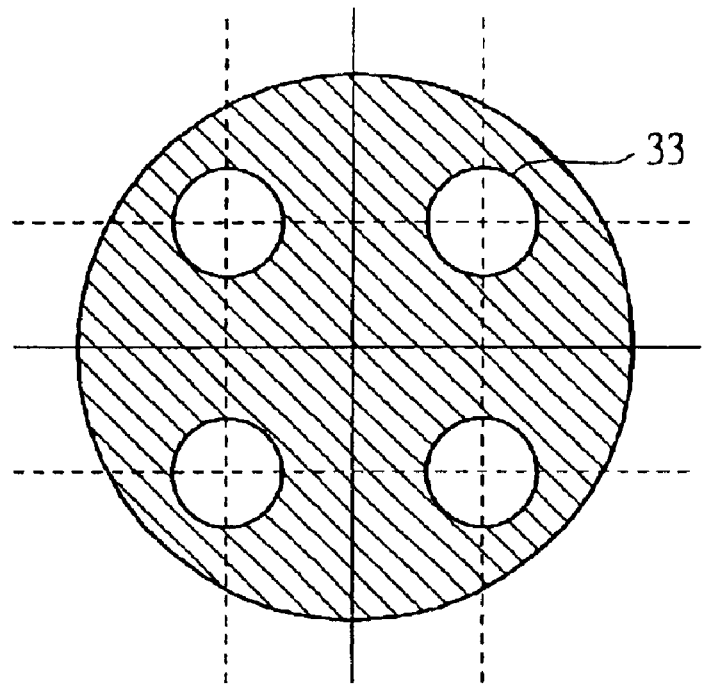
FIG. 77A is a plan view of quadruple illumination.
Figure 77B:
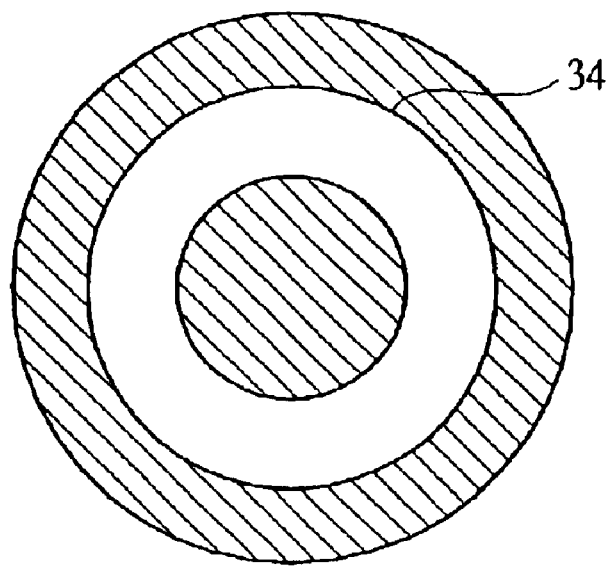
FIG. 77B is a plan view of zone illumination.

In the above-mentioned embodiment 1, the case has been described in which the normal illumination is used in the exposure treatment using the mask 26 shown in FIG. 60. However, the technical idea of the present invention is not limited to the normal illumination used for the exposure light source, and deformed illumination may be used as an exposure light source. Respective FIGS. 77A and 77B show one example of the deformed illumination. FIG. 77A shows a quadruple illumination. Here, four point-shaped light sources 33 are disposed symmetrically with respect to the X and Y axes. FIG. 77B shows a zone illumination. Here, a zone-shaped light source 34 is disposed. Since the case of use of such a zone illumination has higher resolution than that of the normal illumination, the pitch between the patterns can be reduced. Therefore, it is possible to enhance integrated degree of the semiconductor integrated circuit device. Since other portions are the same as those in the previous embodiment 1, explanation thereof is omitted.

As described above, the invention contrived by the present inventors has been concretely explained on the basis of the embodiments, but the present invention is not limited to the above-mentioned embodiments, and, needless to say, various modifications may be made without departing from the gist thereof.

For example, the exposure conditions, layout pitches, dimension or the like explained in the above-mentioned embodiments 1 and 2 can be variously be changed by the exposure apparatus, exposure wavelength, resist material, a measuring apparatus or the like, and the present invention is not limited to those.

In the above embodiments 1 and 2, the case of use of the phase shift mask as a mask for forming the through holes 17 shown in FIG. 25 and the like has been explained. But the present invention is not limited thereto, and the same effect can be obtained even if a normal mask is used.

In the above embodiments 1 and 2, the case of appliance of the present invention to the structure in which the active region is inclined with respect to the word lines or the like has been explained. But the present invention is not limited thereto, and can be also applied to a semiconductor integrated circuit device having a structure in which the active region is perpendicular to the word lines (horizontal with respect to the data lines).

As described above, the invention mainly contrived by the inventors has described, which is applied to the DRAM used in the background field of the invention, and the invention is not limited thereto, and the invention may also be applied to a semiconductor integrated circuit device having a memory circuit such as an SRAM (Static Random Access Memory) or flush memory (EEPROM: Electric Erasable Programmable Read Only Memory), a semiconductor integrated circuit device having a logic circuit such as a microprocessor, or a semiconductor integrated circuit device of a mixed type in which the memory circuit and the logic circuit are provided on the same semiconductor substrate.

Following Advantages

Of the inventions disclosed in the present application, effects obtained by typical inventions are as follows.

That is, the invention uses a mask pattern formed on a photomask which is designed to be disposed such that the mask pattern is separated from a wiring so that the mask pattern is connected to the first hole patterns and is not connected to the wiring even if the second hole patterns sandwiching the wiring is deviated in position when second hole patterns are transferred on first hole patterns sandwiching a wiring. With this arrangement, it is possible to enhance the alignment tolerance of the pattern.

What is claimed is:

1. A semiconductor integrated circuit device comprising:
   a plurality of first regions formed over a semiconductor substrate;
   a first insulative film deposited on said semiconductor substrate;
   a first hole pattern formed over said first insulative film and electrically connected to each of said plurality of first regions;
   a wiring provided on said first insulative film to pass through an adjacent gap between the first hole patterns and intersect relative to said plurality of first regions;
   a second insulative film for covering said wiring; and
   a second hole pattern provided in said second insulative film to be connected to said first hole pattern and not to be connected to said wiring,
   wherein said first region is an active region in which a memory cell selection field effect transistor of a DRAM is formed, and said wiring is a data line, and said first and second hole patterns are constituent members for electrically connecting an information storage capacitance element and said memory cell selection field effect transistor,
   wherein said data line passes through a center of said active region in such a state that the data line is aslant disposed with respect to said active region, and said data line is electrically connected to a semiconductor region formed in a center of said active region, said semiconductor region being for a source/drain of said memory cell selection field effect transistor, and
   wherein said second hole pattern is disposed such that even if a position thereof is deviated, a connection between said first and second hole patterns is kept and an insulative state between said second hole pattern and said wiring is kept, and a pair of second patterns disposed to put said wiring therebetween are disposed to be displaced separately from said wiring put between the pair of second hole patterns.

2. A semiconductor integrated circuit device comprising:
   a plurality of first regions formed over a semiconductor substrate;
   a first insulative film deposited on said semiconductor substrate;
   a first hole pattern formed over said first insulative film and electrically connected to each of said plurality of first regions;
   a wiring provided on said first insulative film to pass through an adjacent gap between the first hole patterns and intersect relative to said plurality of first regions;
   a second insulative film for covering said wiring; and
   a second hole pattern provided in said second insulative film to be connected to said first hole pattern and not to be connected to said wiring,
   wherein said first region is an active region in which a memory cell selection field effect transistor of a DRAM is formed, and said wiring is a data line, and said first and second hole patterns are constituent members for electrically connecting an information storage capacitance element and said memory cell selection field effect transistor,
   wherein said data line passes through a center of said active region in such a state that the data line is aslant disposed with respect to said active region, and said data line is electrically connected to a semiconductor region farmed in a center of said active region, said semiconductor region being for a source/drain of said memory cell selection field effect transistor, and
   wherein a pair of second hole patterns disposed to put said wiring therebetween are disposed such that a center of at least one of said pair of second hole patterns is deviated from a center of said first hole pattern, and are disposed separately from said wiring put between the pair of second hole patterns.

* * * * *